United States Patent
McCorquodale et al.

(10) Patent No.: US 8,134,414 B2
(45) Date of Patent: Mar. 13, 2012

(54) CLOCK, FREQUENCY REFERENCE, AND OTHER REFERENCE SIGNAL GENERATOR WITH FREQUENCY STABILITY OVER TEMPERATURE VARIATION

(75) Inventors: Michael Shannon McCorquodale, Ann Arbor, MI (US); Scott Michael Pernia, Pinckney, MI (US); Vidyabhusan Gupta, Palo Alto, CA (US); Nathaniel Charles Gaskin, Ann Arbor, MI (US); Nader Fayyaz, Windsor (CA)

(73) Assignee: Integrated Device Technology, Inc., San Jose, CA (US)

( * ) Notice: Subject to any disclaimer, the term of this patent is extended or adjusted under 35 U.S.C. 154(b) by 13 days.

(21) Appl. No.: 12/766,205

(22) Filed: Apr. 23, 2010

(65) Prior Publication Data

US 2010/0271144 A1    Oct. 28, 2010

Related U.S. Application Data

(60) Provisional application No. 61/172,570, filed on Apr. 24, 2009.

(51) Int. Cl.
*H03B 5/12* (2006.01)
*H03L 1/00* (2006.01)
*H03L 5/00* (2006.01)
*H03L 7/099* (2006.01)

(52) U.S. Cl. ............... 331/36 R; 331/117 FE; 331/176; 331/183; 331/185

(58) Field of Classification Search .............. 331/34, 331/36 R, 117 FE, 117 R, 167, 176, 182, 331/183, 185, 186
See application file for complete search history.

(56) References Cited

U.S. PATENT DOCUMENTS

| | | | |
|---|---|---|---|
| 3,737,791 A | 6/1973 | Becker | |
| 4,387,350 A | 6/1983 | Bessolo et al. | |
| 4,978,930 A | 12/1990 | Suter | |

(Continued)

FOREIGN PATENT DOCUMENTS

EP    0 727 872 A1    8/1996

(Continued)

OTHER PUBLICATIONS

A.A. Abidi, RF CMOS Comes of Age, IEEE Journal of Solid State Circuits, vol. 39, No. 4, Apr. 2004, pp. 549-561, US.

(Continued)

*Primary Examiner* — Levi Gannon
(74) *Attorney, Agent, or Firm* — Myers Bigel, et al.

(57) ABSTRACT

Exemplary embodiments provide a reference signal generator having a reference or center frequency within a predetermined variance over variations in temperature within a specified range. An exemplary apparatus comprises a reference resonator to generate a first reference signal having a resonant frequency, with the reference resonator having a first temperature dependence; and a plurality of switchable circuits, with at least one switchable circuit providing a second temperature dependence opposing the first temperature dependence to maintain the resonant frequency within a predetermined variance over a temperature variation. A wide variety of switchable circuits are disclosed, including a transistor having an on resistance value greater than a nominal resistance, a resistor coupled to a transistor or other switch, and circuit comprising a first reactance coupled to a first switch, with a second reactance coupled to a resistance and a second switch coupled in series to the second reactance or to the resistance. Various coatings may also be applied to an integrated circuit embodiment, such as a silicone coating on a first surface and a metal layer on a second surface.

16 Claims, 40 Drawing Sheets

U.S. PATENT DOCUMENTS

| | | | |
|---|---|---|---|
| 5,117,206 A * | 5/1992 | Imamura | 331/158 |
| 5,241,286 A | 8/1993 | Mirow | |
| 5,359,303 A | 10/1994 | Mirow | |
| 5,426,384 A | 6/1995 | May | |
| 5,534,822 A | 7/1996 | Taniguchi et al. | |
| 6,016,081 A | 1/2000 | O'Shaughnessy | |
| 6,066,991 A | 5/2000 | Naito et al. | |
| 6,137,372 A | 10/2000 | Welland | |
| 6,147,567 A | 11/2000 | Welland | |
| 6,225,871 B1 | 5/2001 | Chien | |
| 6,233,441 B1 | 5/2001 | Welland | |
| 6,292,065 B1 | 9/2001 | Friedman et al. | |
| 6,388,532 B1 | 5/2002 | Babcock | |
| 6,483,391 B1 | 11/2002 | Magoon et al. | |
| 6,498,539 B2 * | 12/2002 | Griffin | 331/143 |
| 6,559,730 B1 | 5/2003 | Marvin et al. | |
| 6,650,193 B2 | 11/2003 | Endo et al. | |
| 6,753,738 B1 | 6/2004 | Baird | |
| 6,876,266 B2 | 4/2005 | Koo et al. | |
| 6,972,635 B2 | 12/2005 | McCorquodale et al. | |
| 6,995,622 B2 | 2/2006 | Partridge et al. | |
| 7,030,706 B2 | 4/2006 | Yao | |
| 7,042,301 B2 | 5/2006 | Sutardja | |
| 7,061,337 B2 | 6/2006 | Partovi et al. | |
| 7,098,748 B2 | 8/2006 | Schmidt | |
| 7,148,763 B2 | 12/2006 | Sutardja | |
| 7,218,182 B2 | 5/2007 | Muramatsu | |
| 7,221,234 B2 | 5/2007 | Chien | |
| 7,227,423 B2 | 6/2007 | McCorquodale | |
| 7,227,424 B2 | 6/2007 | McCorquodale | |
| 7,248,124 B2 | 7/2007 | McCorquodale et al. | |
| 7,268,646 B2 | 9/2007 | Lutz et al. | |
| 7,307,486 B2 | 12/2007 | Pernia et al. | |
| 7,332,975 B2 | 2/2008 | Marques | |
| 7,336,134 B1 | 2/2008 | Janesch et al. | |
| 7,358,826 B2 | 4/2008 | McCorquodale et al. | |
| 7,365,614 B2 | 4/2008 | McCorquodale et al. | |
| 7,456,699 B2 | 11/2008 | McCorquodale | |
| 7,504,899 B2 | 3/2009 | McCorquodale et al. | |
| 7,548,125 B2 | 6/2009 | Carichner et al. | |
| 7,554,416 B2 | 6/2009 | Lee et al. | |
| 2002/0063608 A1 | 5/2002 | Sutliffe et al. | |
| 2003/0025566 A1 | 2/2003 | Rogers | |
| 2003/0030497 A1 | 2/2003 | Duncan et al. | |
| 2003/0119467 A1 | 6/2003 | Welland et al. | |
| 2004/0085144 A1 | 5/2004 | Wu et al. | |
| 2004/0116093 A1 | 6/2004 | Otaka | |
| 2004/0150483 A1 | 8/2004 | Cho | |
| 2005/0059373 A1 | 3/2005 | Nakamura et al. | |
| 2005/0068118 A1 | 3/2005 | Hein | |
| 2005/0212611 A1 | 9/2005 | Muthali et al. | |
| 2005/0231297 A1 | 10/2005 | Aparin et al. | |
| 2006/0158271 A1 | 7/2006 | Juang et al. | |
| 2006/0226916 A1 | 10/2006 | Florescu et al. | |
| 2007/0075798 A1 | 4/2007 | Amano | |
| 2007/0222528 A1 | 9/2007 | Pernia et al. | |
| 2007/0279141 A1 | 12/2007 | Chui | |
| 2008/0042766 A1 | 2/2008 | Tarng et al. | |
| 2008/0100350 A1 | 5/2008 | Pernia | |
| 2008/0180185 A1 | 7/2008 | Fan et al. | |
| 2009/0146719 A1 | 6/2009 | Pernia | |
| 2009/0146748 A1 | 6/2009 | Pernia | |
| 2009/0146750 A1 | 6/2009 | Pernia | |
| 2009/0146751 A1 | 6/2009 | Pernia | |
| 2009/0146752 A1 | 6/2009 | O'Day | |

FOREIGN PATENT DOCUMENTS

WO    WO 02/03540 A1    1/2002

OTHER PUBLICATIONS

Choi et al., Dynamic Voltage and Frequency Scaling Under a Precise Energy Model Considering Variable and Fixed Components of the System Power Dissipation, IEEE ICCAD 2004, 0-7803-8702-3/04, pp. 29-34, US.

Craninckx, Jan. et al., A 1.8-Ghz Low-Phase-Noise CMOS VCO Using Optimized Hollow Spiral Inductors, IEEE Journal of Solid-State Circuits, vol. 32, No. 5, pp. 736-744, May 1997.

Ghidini et al., A Digitally Programmable On-Chip RC-Oscillator in 0.25 µm CMOS Logic Process, Proc. IEEE Int. Symp. Circuits and Systems (ISCAS) 2005, 0-7803-8834-8/05, pp. 400-403, US.

Groves et al., Temperature Dependence of Q and Inductance in Spiral Inductors Fabricated in a Silicon-Germanium/BiCMOS Technology, IEEE Journal of Solid State Circuits, vol. 32, No. 9, Sep. 1997, pp. 1455-1459, US.

Hajimiri et al., Design Issues in CMOS Differential LC Oscillators, IEEE Journal of Solid State Circuits, vol. 34, No. 5, May 1999, pp. 717-724, US.

Hajimiri et al., Jitter and Phase Noise in Ring Oscillators, IEEE Journal of Solid State Circuits, vol. 34, No. 6, May 1999, pp. 790-804, US.

Hsu, W., Stiffness-Compensated Temperature-Insensitive Micromechanical Resonators, IEEE 2002, 0-7803-7185-2/02, pp. 731-734, US.

Kral et al., RF-CMOS Oscillators with Switched Tuning, IEEE 1998 Custom Integrated Circuits Conference, 0-7803-4292-5/97, pp. 555-558, US.

Kukielka et al., A High-Frequency Temperature-Stable Monolithic VCO, IEEE Journal of Solid State Circuits, vol. SC-16, No. 6, Dec. 1981, pp. 639-647, US.

Lee et al., A 10-MHz Micromechanical Resonator Pierce Reference Oscillator for Communications, Digest of Technical Papers, the 11th Int. Conf. On Solid-State Sensors & Actuators (Transducers '01), Munich, Germany, Jun. 10-14, 2001, pp. 1094-1097.

Leeson, D.B., A Simple Model of Feedback Oscillator Noise Spectrum, Proceedings of the IEEE, Feb. 1966, pp. 329-330, US.

Lin et al., Series-Resonant VHF Micromechanical Resonator Reference Oscillators, IEEE Journal of Solid State Circuits, vol. 39, No. 12, Dec. 2004, pp. 2477-2491, US.

Liu et al., A 250-MHz Monolithic Voltage-Controlled Oscillator with Low Temperature Coefficient, IEEE Journal of Solid State Circuits, vol. 25, No. 2, Apr. 1990, pp. 555-561, US.

Marsman et al., A 16-Bit Low-Power Microcontroller with Monolithic MEMS-LC Clocking, Proc. IEEE Int. Symp. Circuits and Systems (ISCAS) 2005, 0-7803-8834-8/05, pp. 624-627, US.

McCorquodale et al., A Monolithic and Self-Referenced RF LC Clock Generator Compliant With USB 2.0, IEEE Journal of Solid State Circuits, vol. 42, No. 2, Feb. 2007, pp. 385-399, US.

McCorquodale et al., Top-Down and Bottom-Up Approaches to Stable Clock Synthesis, Proc. IEEE Int. Conf. Electronics Circuits and Systems (ICECS) 2003, 0-7803-9023-7/05, pp. 523-205, US.

McCorquodate et al., A 9.2 mW 528/66/50MHz Monolithic Clock Synthesizer for Mobile µP Platforms, IEEE Custom Integrated Circuits Conference (CICC) 2005, 0-7803-9023-7/05, pp. 523-526, US.

Navid, et al., Minimum Achievable Phase Noise of RC Oscillators, IEEE Journal of Solid State Circuits, vol. 40, No. 3, Mar. 2005, pp. 630-637, US.

Nguyen et al., An Integrated CMOS Micromechanical Resonator High-Q Oscillator, IEEE Journal of Solid State Circuits, vol. 34, No. 4, Apr. 1999, pp. 440-455, US.

Otis et a., A 300 µW 1.9-GHz CMOS Oscillator Utilizing Micromechanical Resonators, IEEE Journal of Solid State Circuits, vol. 38, No. 7, Jul. 2003, pp. 1271-1274, US.

Shimanouchi M., An Approach to Consistent Jitter Modeling for Various Jitter Aspects and Measurement Methods, IEEE 2001, ITC International Test Conference, 0-7803-7169-0/01, pp. 848-857.

Sundaresan et al., Electronically Temperature Compensated Silicon Bulk Acoustic Resonator Reference Oscillators, IEEE Journal of Solid State Circuits, vol. 42, No. 6, Jun. 2007, pp. 1425-1434, US.

Sundaresan et al., Process and Temperature Compensation in a 7-MHz CMOS Clock Oscillator, IEEE Journal of Solid State Circuits, vol. 41, No. 2, Feb. 2006, pp. 433-442, US.

Wang et al., VHF Free-Free Beam High-Q Micromechanical Resonators, IEEE 2000, Journal of Microelectromechanical Systems, vol. 9, No. 3, Sep. 2000, pp. 347-360, US.

Zamek et al., Crystal Oscillators' Jitter Measurements and ITs Estimation of Phase Noise, IEEE 2003, Proceedings of the 2003 IEEE International Frequency Control Symposium and PDA Exhibition Jointly with the 17th European Frequency and Time Forum, 0-7803-7688-9/03, pp. 547-555.

* cited by examiner

CLOCK, FREQUENCY REFERENCE, AND OTHER REFERENCE SIGNAL GENERATOR WITH FREQUENCY STABILITY OVER TEMPERATURE VARIATION

CROSS-REFERENCE TO RELATED APPLICATIONS

This application claims priority to U.S. Provisional Application Ser. No. 61/172,570, filed Apr. 24, 2009.

FIELD OF THE INVENTION

The present invention, in general, relates to reference signal, reference frequency or clocking signal generation, and more particularly, relates to a free-running or self-referenced oscillator or resonator which generates a clock, frequency reference or other reference signal.

BACKGROUND

Accurate clock generators or timing references have generally relied upon crystal oscillators, such as quartz oscillators, which provide a mechanical, resonant vibration at a particular frequency. The difficulty with such crystal oscillators is that they cannot be fabricated as part of the same integrated circuit ("IC") that is to be driven by their clock signal. For example, microprocessors such as the Intel Pentium processor require a separate clock IC. As a consequence, virtually every circuit requiring an accurate clock signal requires an off-chip clock generator. Accordingly, accurate and stable clocking capability is one of the last functional components in electronic systems that have not been subject to integration.

There are several consequences for such non-integrated solutions. For example, because such a processor must be connected through outside circuitry (such as on a printed circuit board (PCB)), power dissipation is comparatively increased. In applications which rely on a finite power supply, such as battery power in mobile communications, such additional power dissipation is detrimental.

In addition, such non-integrated solutions, by requiring an additional IC, increase space and area requirements, whether on the PCB or within the finished product, which is also detrimental in mobile environments. Moreover, such additional components increase manufacturing and production costs, as an additional IC must be fabricated and assembled with the primary circuitry (such as a microprocessor).

Other clock generators which have been produced as integrated circuits with other circuits are generally not sufficiently accurate, particularly over fabrication process, voltage, and temperature ("PVT") variations. For example, ring, relaxation and phase shift oscillators may provide a clock signal suitable for some low-sensitivity applications, but have been incapable of providing the higher accuracy required in more sophisticated electronics, such as in applications requiring significant processing capability or data communications. In addition, these clock generators or oscillators often exhibit considerable frequency drift, jitter, have a comparatively low Q-value, and are subject to other distortions from noise and other interference.

As a consequence, a need remains for a reference signal or clock generator which may be integrated monolithically with other circuitry, as a single IC, or which may be a discrete IC utilized to provide a clock or other reference signal to the other circuitry, and which is highly accurate over PVT variations. Such a reference signal or clock generator should be free-running and/or self-referencing, and should not require locking or referencing to another reference signal. Such a reference signal or clock generator should exhibit minimal frequency drift and have comparatively low jitter, and should be suitable for applications requiring a highly accurate system clock. Such a clock generator or timing reference should provide for control over output frequency, to provide a stable and desired frequency in response to variation in ambient or junction temperature or variation in other parameters such as voltage, fabrication process, frequency, and age.

SUMMARY

Exemplary embodiments of the invention provide a reference signal generator, system and method which provides a superior reference signal, and which is capable of being fully integrated with other electronics. The exemplary reference signal generator and system provides a very accurate reference and/or clock signal, with very low error, very low phase noise and period jitter, and with extremely fast rise and fall times, rendering the exemplary embodiments suitable for highly exacting applications. The exemplary embodiments provide for accurate frequency control over variable parameters such as temperature, fabrication process variation, and IC aging.

In an exemplary embodiment, switchable circuits are utilized to provide a substantially stable resonant or center frequency $f_0$, within a predetermined variance, over variations in operating (and/or ambient) temperature within a predetermined or specified range. For these embodiments, the apparatuses and systems are calibrated over temperature variation, with different types and/or amounts of resistances (resistors or more generally, the real component of any impedance) selected during calibration to offset or cancel any potential frequency changes which would otherwise occur due to a temperature dependence of other components, resulting in a substantially "flat" overall temperature response, i.e., a substantially stable resonant (or center) frequency $f_0$, within a predetermined variance, over variations in operating (and/or ambient) temperature within a specified range. For example, an inductor typically exhibits a first, negative temperature dependence which, without temperature compensation, would result in a decrease in the resonant or center frequency with increasing temperature. Similarly, various types of capacitances and resistances may be selected which typically exhibit a second, positive temperature dependence which, without temperature compensation, would provide an increase in the resonant (or center) frequency with increasing temperature. Accordingly, for a given resonant (or center) frequency $f_0$ and a selected or given inductance, resistances and/or both reactances and resistances are selected to provide an offsetting or cancelling temperature dependence, as a calibrated form of temperature compensation, such that the resulting resonant (or center) frequency $f_0$ is substantially stable over a predetermined range of temperature variation.

In this way, resistive and reactive components are selected during a temperature calibration process to provide offsetting or cancelling temperature dependencies throughout a predetermined range, resulting in an apparatus and/or system having a selected resonant (or center) frequency $f_0$, within a predetermined variance, over variations in operating (and/or ambient) temperature within a predetermined or specified range. Such a temperature calibration process may be performed jointly with or separately from a frequency calibration process utilized to select or determine the resonant (or center) frequency $f_0$.

An exemplary apparatus embodiment to generate a harmonic reference signal is disclosed. The exemplary apparatus comprises: a reference resonator to generate a first reference signal having a resonant frequency, the reference resonator comprising a first component having a first temperature dependence; and a plurality of switchable circuits couplable to the reference resonator, at least one switchable circuit of the plurality of switchable circuits having a second temperature dependence opposing the first temperature dependence to maintain the resonant frequency within a predetermined variance over a temperature variation.

In an exemplary embodiment, each switchable circuit of the plurality of switchable circuits may comprise: a first reactance; a resistance; and a second reactance coupled to the resistance; and each switchable circuit may further comprise: a first switch coupled in series to the first reactance; and a second switch coupled in series to the second reactance or to the resistance.

In an exemplary embodiment, the first switch may be responsive to a control signal of a plurality of control signals to electronically couple or decouple the first reactance to or from a voltage, a ground potential, or the reference resonator; and the second switch may be responsive to an inverted control signal of a plurality of control signals to electronically couple or decouple the second reactance or the resistance to or from a voltage, a ground potential, or the reference resonator. The plurality of control signals may be determined during a temperature calibration process over a predetermined range of temperature variation to determine selected resistances of the plurality of switchable circuits to be coupled to the reference resonator to provide the second temperature dependence to maintain the resonant frequency within the predetermined variance.

In another exemplary embodiment, the apparatus may further comprise a coefficient register to store a plurality of control coefficients; wherein the first switch is responsive to a control coefficient of the plurality of control coefficients to electronically couple or decouple the first reactance to or from a voltage, a ground potential, or the reference resonator, and wherein the second switch is responsive to an inverted control coefficient of the plurality of control coefficients to electronically couple or decouple the second reactance or the resistance to or from a voltage, a ground potential, or the reference resonator. The plurality of control coefficients may be determined during a temperature calibration process over a predetermined range of temperature variation to determine selected resistances of the plurality of switchable circuits to be coupled to the reference resonator to provide the second temperature dependence to maintain the resonant frequency within the predetermined variance.

In such an exemplary embodiment, the first component may comprise an inductor, and the second reactance coupled to the resistance has the second temperature dependence opposing the first temperature dependence.

In various exemplary embodiments, the resistance may comprise a resistor having a resistance value greater than a nominal resistance, or may comprise a transistor having an on resistance value greater than a nominal resistance, or may comprise a switch having an on resistance value greater than a nominal resistance. The first reactance may comprise a first capacitor and the second reactance may comprise a second capacitor, and the first capacitor and the second capacitor may have either a fixed or variable capacitance.

In exemplary embodiments, the temperature variation is within a predetermined range. In various exemplary embodiments, the predetermined variance is substantially constant.

Another exemplary apparatus embodiment to generate a harmonic reference signal may comprise a reference resonator to generate a first reference signal having a resonant frequency, the reference resonator having a first temperature dependence, the reference resonator comprising an inductor and a capacitor; and a plurality of switchable resistance circuits couplable to the reference resonator, and when coupled to the reference resonator, at least one switchable resistance circuit of the plurality of switchable resistance circuits providing a second temperature dependence opposing the first temperature dependence to maintain the resonant frequency within a predetermined variance.

In various exemplary embodiments, each switchable resistance circuit of the plurality of switchable resistance circuits may comprise a transistor having an on resistance value greater than a nominal resistance; or may comprise a resistor having a resistance value greater than a nominal resistance and a transistor coupled in series to the resistor; or may comprise a resistor having a resistance value greater than a nominal resistance; and a switch coupled in series to the resistor; or may comprise a switch having an on resistance value greater than a nominal resistance.

In other various exemplary embodiments, each switchable resistance circuit of the plurality of switchable resistance circuits may comprise a first reactance; a resistance; and a second reactance coupled to the resistance; and may further comprise: a first switch coupled in series to the first reactance; and a second switch coupled in series to the second reactance or to the resistance.

In various exemplary embodiments, the second reactance coupled to the resistance has the second temperature dependence opposing the first temperature dependence. Also in various exemplary embodiments, the resistance comprises a resistor having a resistance value greater than a nominal resistance, a transistor having an on resistance value greater than a nominal resistance, or a switch having an on resistance value greater than a nominal resistance.

Another exemplary apparatus embodiment may comprise a reference resonator to generate a first reference signal having a resonant frequency, the reference resonator having a first temperature dependence; a plurality of switchable circuits couplable to the reference resonator, and when coupled to the reference resonator, at least one switchable circuit of the plurality of switchable circuits providing a second temperature dependence opposing the first temperature dependence to maintain the resonant frequency within a predetermined variance over a temperature variation; and at least one feedback circuit coupled to the reference resonator, the at least one feedback circuit to maintain substantially constant a peak amplitude of the reference signal or a common mode voltage level of the reference resonator.

Another exemplary apparatus embodiment may be an integrated circuit comprising: a reference oscillator to generate a reference signal having a reference frequency, the reference oscillator having a first temperature dependence; and a plurality of switchable circuits couplable to the reference resonator, and when coupled to the reference resonator, at least one switchable circuit of the plurality of switchable resistance circuits providing a second temperature dependence opposing the first temperature dependence to maintain the resonant frequency within a predetermined variance over a temperature variation, each switchable resistance circuit of the plurality of switchable resistance circuits comprising: a first reactance; a first switch coupled in series to the first reactance; a resistance; a second reactance coupled to the resistance; a second switch coupled in series to the second reactance or to the resistance; and an inverter coupled to the first switch or to the second switch.

Exemplary embodiments may further comprise a frequency controller coupled to the reference resonator, with the frequency controller to maintain substantially constant a peak amplitude of the first reference signal and/or a common mode voltage level of the reference resonator.

Various exemplary embodiments may further comprise a first variable current source to provide a current to the reference resonator; wherein the frequency controller is further to generate a first control signal to the first variable current source to modify the current to the reference resonator to maintain the peak amplitude of the first reference signal substantially constant at a predetermined magnitude.

In an exemplary embodiment, such an exemplary frequency controller may further comprise: an amplitude detector to detect a magnitude of the peak amplitude of the first reference signal; and an operational amplifier coupled to the amplitude detector and the first current source, the operational amplifier to generate the first control signal to the first variable current source to modify the current level when the detected magnitude is not substantially equal to the predetermined magnitude. In another exemplary embodiment, such an exemplary frequency controller may further comprise: an amplitude detector to detect a magnitude of the peak amplitude of the first reference signal; and a comparator coupled to the amplitude detector and the first variable current source, the comparator to generate the first control signal to the first variable current source to modify the current level when the detected magnitude is not substantially equal to the predetermined magnitude.

Various exemplary embodiments may further comprise a second variable current source to provide the current to the reference resonator; wherein the frequency controller is further to generate a second control signal to the second variable current source to modify the current to the reference resonator to maintain the common mode voltage level of the reference resonator substantially constant at a predetermined voltage level. In an exemplary embodiment, such an exemplary frequency controller may further comprise: a voltage detector to detect the common mode voltage level of the reference resonator; and an operational amplifier coupled to the voltage detector and the second variable current source, the operational amplifier to generate the second control signal to the second variable current source to modify the current level when the detected common mode voltage level is not substantially equal to the predetermined common mode voltage level. In another exemplary embodiment, such an exemplary frequency controller may further comprise: a voltage detector to detect the common mode voltage level of the reference resonator; and a comparator coupled to the voltage detector and the second variable current source, the comparator to generate the second control signal to the second variable current source to modify the current level when the detected common mode voltage level is not substantially equal to the predetermined common mode voltage level. Various exemplary embodiments may further comprise a plurality of variable capacitors coupled to the reference resonator to modify a corresponding reactance in response to a control voltage to maintain the resonant frequency substantially constant.

Exemplary apparatus and system embodiments may include additional features and components, such as a frequency divider coupled to the reference resonator to receive the first reference signal having the resonant frequency, with the frequency divider to generate a second reference signal having a second frequency which is substantially equal to the resonant frequency divided by a rational number. The first reference signal may be a differential signal and the frequency divider may be further to convert the differential signal to a single-ended signal. The first reference signal may be a substantially sinusoidal signal and the frequency divider (or square wave generator) may be further to generate the second reference signal as a substantially square wave signal having a substantially equal high and low duty cycle.

A sustaining amplifier is also typically coupled to the reference resonator, such as a cross-coupled negative transconductance amplifier. Other exemplary embodiments may also include a current mirror to provide a fixed current to the reference resonator, the current mirror having a cascade configuration; and a fixed current source coupled to the current mirror.

Various exemplary embodiments also provide for a frequency calibration module which is couplable to the reference resonator, with the frequency calibration module being to calibrate the resonant frequency to a selected frequency in response to an external reference signal.

An exemplary reference resonator may comprise an inductor (L) and a capacitor (C) coupled to form an LC-tank, the LC-tank having a selected configuration of a plurality of LC-tank configurations. For example, the reference resonator may have at least one configuration of the following configurations: a double-balanced, differential LC configuration; a differential n-MOS cross-coupled topology; a differential p-MOS cross-coupled topology; a single-ended Colpitts LC configuration; a single-ended Hartley LC configuration; a differential, common base Colpitts LC configuration; a differential, common collector Colpitts LC configuration; a differential, common base Hartley LC configuration; a differential, common collector Hartley LC configuration; a single-ended Pierce LC oscillator, or a quadrature LC oscillator configuration. In other exemplary embodiments, resonator may be selected from a group comprising: a ceramic resonator, a mechanical resonator, a microelectromechanical resonator, and a film bulk acoustic resonator.

Another exemplary embodiment provides a reference oscillator apparatus, with the apparatus comprising: a reference resonator to generate a reference signal having a resonant frequency; a plurality of reactance modules couplable to the reference resonator, each reactance module of the plurality of reactance modules comprising at least one reactance unit cell, and each reactance unit cell comprising a capacitor having a predetermined and fixed unit of capacitance coupled in series to a switch; and at least one feedback circuit coupled to the reference resonator, the at least one feedback circuit to maintain substantially constant a peak amplitude of the reference signal or a common mode voltage level of the reference resonator.

Another exemplary embodiment provides an integrated circuit, comprising: a reference oscillator to generate a reference signal having a reference frequency; a controller coupled to the reference oscillator, the controller to maintain substantially constant a peak amplitude of the reference signal and a common mode voltage level of the reference oscillator; a plurality of reactance modules couplable to the reference resonator, each reactance module of the plurality of reactance modules comprising one or more reactance unit cells, and each reactance unit cell comprising a reactance element coupled in series to a switching element; a control voltage generator to provide a control voltage which varies in response to temperature; and a plurality of varactors to receive the control voltage and provide a corresponding capacitance to maintain the reference frequency within a predetermined variance of a predetermined frequency in response to temperature variation.

Yet another exemplary embodiment provides a reference signal generator, comprising: a reference resonator to generate a first reference signal having a resonant frequency; a coefficient register to store a plurality of control coefficients; a plurality of reactance modules couplable to the reference resonator, each reactance module of the plurality of reactance modules comprising one or more reactance unit cells, and each reactance unit cell comprising a capacitor coupled in series to a transistor, each capacitor having a fixed and predetermined unit of capacitance and each transistor having a predetermined resistance when in an off state, wherein each transistor is responsive to a corresponding control coefficient or inverted control coefficient to couple or uncouple a corresponding capacitor to or from the reference oscillator to select or to modify the resonant frequency; and a frequency controller coupled to the reference resonator, the frequency controller to maintain substantially constant a peak amplitude of the first reference signal and a common mode voltage level of the reference resonator.

Another exemplary embodiment provides an apparatus to generate a harmonic reference signal, the apparatus comprising: an integrated circuit comprising a reference resonator to generate a first reference signal having a resonant frequency, the reference resonator comprising a first component having a first temperature dependence; and a plurality of switchable circuits couplable to the reference resonator, at least one switchable circuit of the plurality of switchable circuits having a second temperature dependence opposing the first temperature dependence to maintain the resonant frequency within a predetermined variance over a temperature variation; and a coating coupled to a first surface of the integrated circuit.

In various exemplary embodiments, the coating may be one or more of the following compounds, mixtures or suspensions: silicone; benzocyclobutane (BCB); polybenzoxazole (PBO), cyclotenes; polyimides; polyamides; Teflon; spin-on glass; glass frit; a sol gel; or a sol gel precursor. Various exemplary embodiments also may further comprise a metal layer coupled to a second surface of the integrated circuit.

Yet another of the various exemplary embodiments provides an apparatus to generate a harmonic reference signal, the apparatus comprising: a reference resonator to generate a first reference signal having a resonant frequency, the reference resonator having a first temperature dependence, the reference resonator comprising an inductor and a capacitor; a plurality of switchable resistance circuits couplable to the reference resonator, and when coupled to the reference resonator, at least one switchable resistance circuit of the plurality of switchable resistance circuits providing a second temperature dependence opposing the first temperature dependence to maintain the resonant frequency within a predetermined variance; and a coating. In an exemplary embodiment, the coating is coupled to a first surface of an integrated circuit comprising the reference resonator and the plurality of switchable resistance circuits.

Another exemplary embodiment includes a reference oscillator apparatus, comprising: a reference resonator to generate a first reference signal having a resonant frequency, the reference resonator having a first temperature dependence; a plurality of switchable circuits couplable to the reference resonator, and when coupled to the reference resonator, at least one switchable circuit of the plurality of switchable circuits providing a second temperature dependence opposing the first temperature dependence to maintain the resonant frequency within a predetermined variance over a temperature variation; at least one feedback circuit coupled to the reference resonator, the at least one feedback circuit to maintain substantially constant a peak amplitude of the reference signal or a common mode voltage level of the reference resonator; and a coating.

In an exemplary embodiment, the coating may be coupled to a first surface of an integrated circuit comprising the reference resonator and the plurality of switchable resistance circuits. Alternatively, the coating may also comprise metal layer coupled to a second surface of the integrated circuit.

Lastly, another exemplary embodiment provides an apparatus, comprising: a reference oscillator to generate a reference signal having a reference frequency, the reference oscillator having a first temperature dependence; a plurality of switchable circuits couplable to the reference oscillator, and when coupled to the reference oscillator, at least one switchable circuit of the plurality of switchable resistance circuits providing a second temperature dependence opposing the first temperature dependence to maintain the resonant frequency within a predetermined variance over a temperature variation, each switchable circuit of the plurality of switchable circuits comprising: a first reactance, a first switch coupled in series to the first reactance; a resistance, a second reactance coupled to the resistance, a second switch coupled in series to the second reactance or to the resistance, and an inverter coupled to the first switch or to the second switch; a coating coupled to a first surface of the integrated circuit comprising the reference oscillator and the plurality of switchable circuits; and a metal layer coupled to a second surface of the integrated circuit.

These and additional embodiments are discussed in greater detail below. Numerous other advantages and features of the present invention will become readily apparent from the following detailed description of the invention and the embodiments thereof, from the claims and from the accompanying drawings.

BRIEF DESCRIPTION OF THE DRAWINGS

The objects, features and advantages of the present invention will be more readily appreciated upon reference to the following disclosure when considered in conjunction with the accompanying drawings, wherein like reference numerals are used to identify identical components in the various views, and wherein reference numerals with alphabetic characters are utilized to identify additional types, instantiations or variations of a selected component embodiment in the various views, in which.

DETAILED DESCRIPTION OF EXEMPLARY EMBODIMENTS

Figure 1:
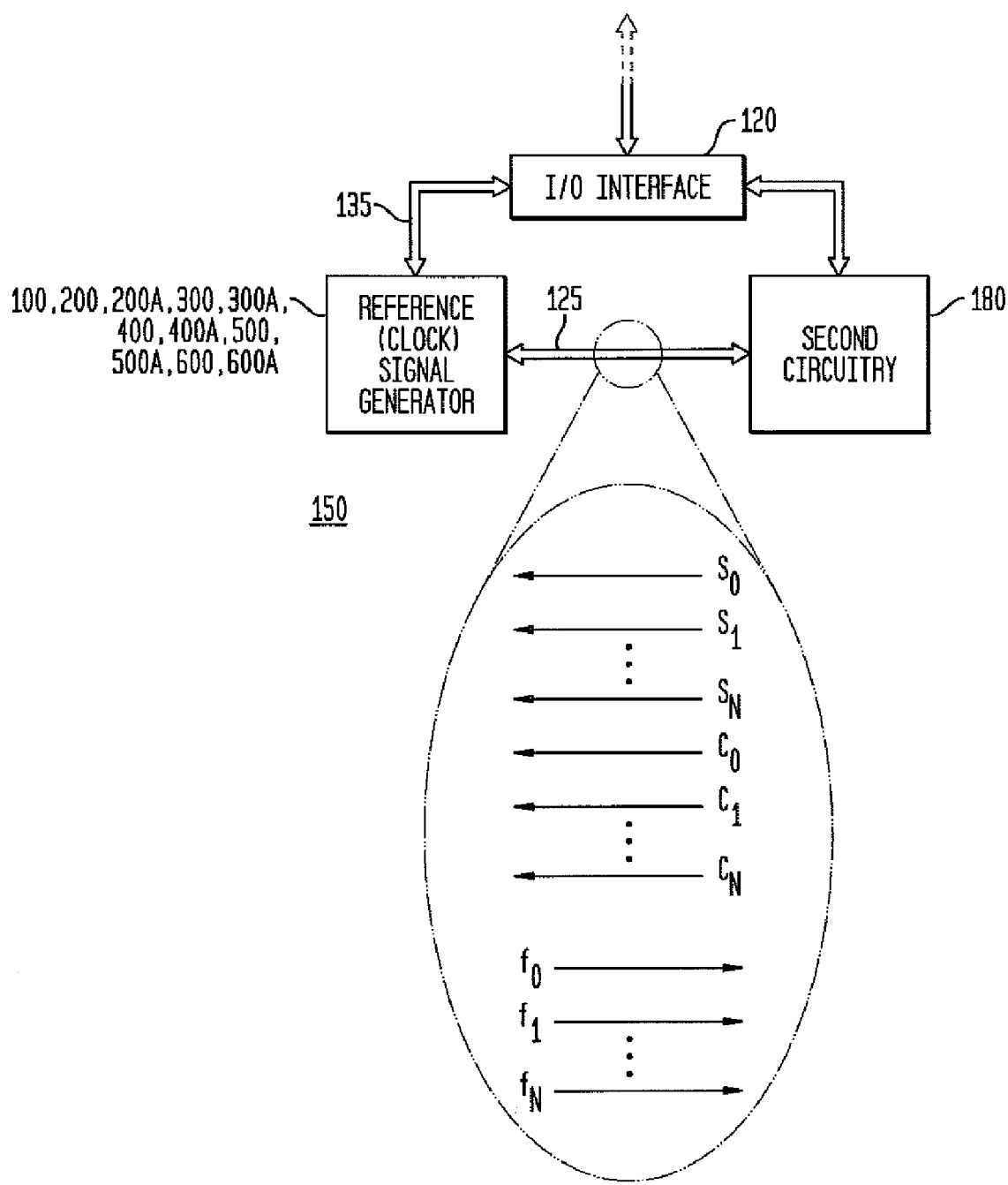
FIG. 1 a block diagram illustrating a first exemplary system embodiment in accordance with the teachings of the present invention.

While the present invention is susceptible of embodiment in many different forms, there are shown in the drawings and will be described herein in detail specific exemplary embodiments thereof, with the understanding that the present disclosure is to be considered as an exemplification of the principles of the invention and is not intended to limit the invention to the specific embodiments illustrated. In this respect, before explaining at least one embodiment consistent with the present invention in detail, it is to be understood that the invention is not limited in its application to the details of construction and to the arrangements of components set forth above and below, illustrated in the drawings, or as described in the examples. Methods and apparatuses consistent with the present invention are capable of other embodiments and of being practiced and carried out in various ways. Also, it is to be understood that the phraseology and terminology employed herein, as well as the abstract included below, are for the purposes of description and should not be regarded as limiting.

Figure 32:
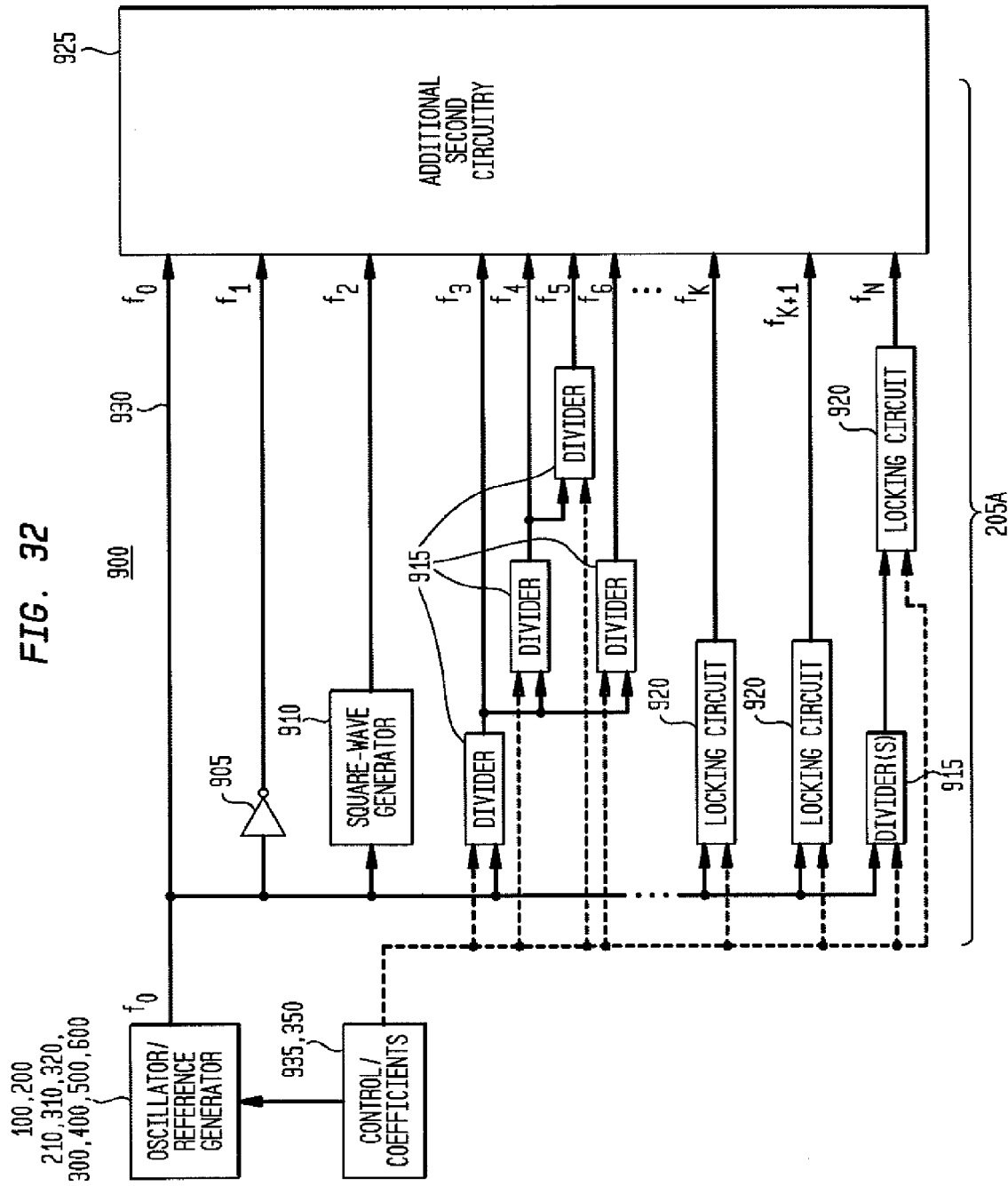
FIG. 32 is a block diagram illustrating an exemplary frequency (and mode) selector embodiment and an exemplary second system embodiment in accordance with the teachings of the present invention.

As indicated above, the various embodiments of the invention provide numerous advantages, including the ability to integrate a highly accurate (over PVT and age), low-jitter, free-running clock generator and/or a timing and frequency reference with other circuitry, such as illustrated in FIG. 1. FIG. 1 is a block diagram illustrating an exemplary first system embodiment 150 in accordance with the teachings of the present invention. The discussion below is also equally applicable to exemplary second and third system embodiments 900, 950 is illustrated in FIGS. 32 and 34. As illustrated in FIG. 1, the system 150 is a single integrated circuit, having a reference signal generator 100, 200, 200A, 300, 300A, 400, 400A, 500, 500A, 600, 600A (e.g., clock generator and/or timing/frequency reference generator) of the present invention integrated with other, or second, circuitry 180, together with an input/output (I/O) interface 120 or other I/O circuitry. Exemplary reference signal generators 100, 200, 200A, 300, 300A, 400, 400A, 500, 500A, 600, 600A are illustrated in FIGS. 2-6, 33, and 37, 39-42. Second circuitry 180 may be any type or kind of circuitry such as, for example, a microprocessor, a frequency divider, a phase or delay locked loop, switching circuitry, etc., with many examples illustrated and discussed below. The I/O interface 120 will generally provide power, such as from a power supply (not illustrated), ground, and other lines or busses to the reference signal generator 100, 200, 200A, 300, 300A, 400, 400A, 500, 500A, 600, 600A, such as for calibration and frequency selection, and other I/O functionality, such as driver circuitry and impedance matching. For example, the I/O interface 120 may be utilized for input/output communication, providing appropriate connection to a relevant channel, network or bus, and may provide additional functionality, such as impedance matching, drivers and other functions for a wireline interface, may provide demodulation and analog to digital conversion for a wireless interface, and may provide a physical interface with other devices for the second circuitry 180 or the reference signal generator 100, 200, 200A, 300, 300A, 400, 400A, 500, 500A, 600, 600A. In general, the I/O interface 120 is used for coupling to power and ground connections, and potentially also to receive and transmit data, depending upon the selected embodiment, such as control or calibration signals, for example. Also for example and without limitation, the I/O interface 120 may implement communication protocols such as DMX 512, DALI, SPI, SBus, I-squared C ($I^2C$), etc.

As illustrated, one or more output reference (or clock) signals are provided on bus 125, at one or more of a plurality of frequencies, such as a first frequency ($f_0$), a second frequency ($f_1$), and so on, through an $(n+1)^{th}$ frequency ($f_n$). In addition, the various one or more reference signals may have any of a plurality of shapes, such as substantially square or substantially sinusoidal, for example. The second circuitry 180 (or the I/O interface 120) may also provide input into the reference signal generator 100, 200, 200A, 300, 300A, 400, 400A, 500, 500A, 600, 600A, such as through selection signals ($S_0$, $S_1$, through $S_N$), and one or more calibration signals ($C_0$, $C_1$, through $C_N$). Alternatively, the selection signals ($S_0$, $S_1$, through $S_N$) and one or more calibration signals ($C_0$, $C_1$, through $C_N$) may be provided directly to the reference signal generator 100 through the interface 120, such as on bus 135, along with power and ground connections (not separately illustrated).

The reference signal generator 100, 200, 200A, 300, 300A, 400, 400A, 500, 500A, 600, 600A may also have a plurality of modes, such as a low power mode and other modes discussed in greater detail below. For example, in a clock mode, the apparatus 100, 200, 200A, 300, 300A, 400, 400A, 500, 500A, 600, 600A will provide one or more clock signals, as output signals, to the second circuitry 180. The second circuitry 180 also may be any type or kind of circuitry, such as a microprocessor, a digital signal processor ("DSP"), a radio-frequency circuit, for example, or any other circuit which could utilize the one or more output clock signals. Also for example, in a timing or frequency reference mode, the output signal from the apparatus 100, 200, 200A, 300, 300A, 400, 400A, 500, 500A, 600, 600A may be a reference signal, such as a reference signal for synchronization for a second oscillator. As a consequence, the terminology reference signal generator, clock generator and/or timing/frequency reference will be utilized interchangeably herein, with the understanding that the clock generator will also generally provide a square-wave signal, which may or may not be provided with a reference signal generator or other timing/frequency reference, which may utilize a substantially sinusoidal signal instead. In addition, as discussed in greater detail below, the various embodiments of the invention also provided a pulsed mode, in which the output signal from reference signal generator 100, 200, 200A, 300, 300A, 400, 400A, 500, 500A, 600, 600A is provided in bursts or intervals, for increased instruction processing efficiency and lower power consumption, for example.

It should be noted that the various signals, voltages, parameter-independent current sources, and so on, are referred to as "substantially" sinusoidal or square-wave signals, substantially constant control voltages, or substantially parameter-independent voltages or currents, for example. This is to accommodate the various fluctuations, noise sources and other distortions introduced which may cause such signals, voltages or currents to differ in practice from the more ideal depictions found in textbooks. For example, as discussed in greater detail below, exemplary "substantially" square-wave signals provided by the exemplary reference signal generator 100, 200, 200A, 300, 300A, 400, 400A, 500, 500A, 600, 600A may and typically do exhibit a variety of distortions, such as undershoots, overshoots, and other variations, and are nonetheless considered to be very high quality square-waves in practice.

In other instances, "substantially constant" may be construed more broadly, to mean "within a predetermined variance" of a selected value or parameter. For example, a substantially constant magnitude of an amplitude, a substantially constant common mode voltage, or a substantially constant resonant frequency, will typically have some variance from a specific value, such as plus or minus a predetermined percentage or error, and will generally not be constant as a theoretical ideal. Accordingly, in practice, what is acceptable as substantially constant nonetheless has some degree of variance, and in accordance with the exemplary embodiments of the invention, should be understood to mean and be measured as having some measurable variance from, for example, a predetermined magnitude, a predetermined common mode voltage, and a calibrated or predetermined resonant frequency. The amount of allowable variance from a specified or predetermined value will depend upon product specifications or product requirements for a degree of allowable error. Continuing with the example, a substantially constant resonant frequency will depend upon the acceptable specifications, and the various exemplary embodiments will typically have some frequency error, such as on the order of 50-100 ppm in exemplary embodiments. Also for example, exemplary embodiments maintain a substantially constant resonant frequency (or center frequency for spread-spectrum applications) over variation in temperature within a predetermined range, such that frequency variation will be within the specified margin of error for temperature variations occurring within a specified range, such as from −10 to +100 degrees C., with potentially higher frequency error for temperatures outside of the specified range, for example and without limitation. Similar variations are to be expected with other parameters which are to be maintained substantially constant, such as the magnitude of the peak amplitude of the resonant signal and the common mode voltage of the reference resonator.

Several important features of the present invention are in system 150 (and 900, 950). First, a highly accurate, low-jitter, free-running reference signal generator 100, 200, 200A, 300, 300A, 400, 400A, 500, 500A, 600, 600A is integrated monolithically with other (second) circuitry 180, to form a singular integrated circuit (system 150, 900, 950). This is in sharp contrast with the prior art, in which a reference oscillator is used to provide a clock signal, such as a crystal reference oscillator, which cannot be integrated with other circuitry and is off-chip, as a second and separate device which must be connected through a circuit board to any additional circuitry. For example, in accordance with the present invention, the system 150, 900, 950, including reference signal generator 100, 200, 200A, 300, 300A, 400, 400A, 500, 500A, 600, 600A, may be fabricated with other, second circuitry using conventional CMOS (complementary metal oxide semiconductor), BJT (bipolar junction transistor), BiCMOS (bipolar and CMOS), or other fabrication technologies utilized in modern IC manufacturing.

Second, no separate reference oscillator is required. Rather, in accordance with the invention, the reference signal generator 100, 200, 200A, 300, 300A, 400, 400A, 500, 500A, 600, 600A is free-running, such that it is not referenced to or locked to another signal, such as being synchronized in a phase locked loop ("PLL"), delay locked loop ("DLL"), or via injection locking to a reference signal, which is typical of the prior art. Instead, the exemplary embodiments may be utilized as such a reference oscillator which generates the reference signal itself, which may then be locked to by one or more phase-locked or delay-locked loops, for example. In these latter embodiments, in which a PLL or DLL provides a secondary reference signal by locking to the reference signal provided by the reference signal generator 100, 200, 200A, 300, 300A, 400, 400A, 500, 500A, 600, 600A, the resulting system (150, 900, 950) may be viewed as "self-referencing", as no separate, external, or other independent source of a reference signal is required.

Third, the reference signal generator 100, 200, 200A, 300, 300A, 400, 400A, 500, 500A, 600, 600A may provide a plurality of output frequencies and a power conservation mode, such that frequencies may be switched with low latency and in a glitch-free manner. For example, second circuitry 180 may shift to a power conservation mode, such as a battery or lower frequency mode, and request (through selection signals) a lower clock frequency for minimizing power consumption, or request a low power clock signal to enter a sleep mode. As discussed in greater detail below, such frequency switching is provided with substantially negligible latency, with low latency introduced for glitch prevention (in proportion to the number of glitch prevention stages utilized), using a merely a handful of clock cycles, rather than the thousands of clock cycles required to change the output frequency from a PLL/DLL.

Additional embodiments also provide for generating a plurality of frequency reference signals, whether sinusoidal or square-wave, such as for use as one or more clock signals or reference frequency sources. In exemplary embodiments, the clock/frequency reference of the invention is coupled to one or more phase-locked loops ("PLLs") or delay-locked loops ("DLLs"), to provide a corresponding plurality of output reference signals at selected frequencies. These exemplary embodiments are typically programmable, through control signals or stored coefficients, such as to adjust the divide ratios of the PLLs or DLLs for corresponding frequency selection.

In addition, given the significantly high available output frequencies of the reference signal generator 100, 200, 200A, 300, 300A, 400, 400A, 500, 500A, 600, 600A discussed below, new operating modes are available. For example, clock start-up times are effectively or substantially negligible, allowing the reference signal generator 100, 200, 200A, 300, 300A, 400, 400A, 500, 500A, 600, 600A to be repeatedly started and stopped, such as turned off entirely or to be pulsed for power conservation. For example, rather than running continuously as a clock, the reference signal generator 100, 200, 200A, 300, 300A, 400, 400A, 500, 500A, 600, 600A can be operated in comparatively short, discrete intervals or bursts (i.e., pulsed), periodically or non-periodically, for instruction processing by a second circuit 180, such as a processor. As discussed in greater detail below, with the rapid start-up time, such pulsed operation provides a power savings, as more instructions (million instructions per second or MIPS) are processed per milliwatt (mW) of power consumption. In addition, such a pulsed mode may also be utilized to periodically synchronize a second clock or oscillator, in addition to other uses. As a consequence, the reference signal generator 100, 200, 200A, 300, 300A, 400, 400A, 500, 500A, 600, 600A (and the other embodiments discussed below) has a plurality of operating modes, including a clock mode, a timing and/or frequency reference mode, a power conservation mode, and a pulsed mode.

Fourth, as discussed in greater detail below, the reference signal generator 100 includes features for highly accurate frequency generation over fabrication process, voltage, temperature ("PVT") and age variations. These features include frequency tuning and selection, and compensation for frequency variations which may be caused due to temperature and/or voltage fluctuations, fabrication process variations, and IC aging.

Fifth, the reference signal generator 100, 200, 200A, 300, 300A, 400, 400A, 500, 500A, 600, 600A generates a significantly and comparatively high frequency, such as in the hundreds of MHz and GHz range, which then may be divided to a plurality of lower frequencies. Each such division by "N" (a rational number, as a ratio of integers) results in a significant noise reduction, with phase noise reduced by N and phase noise power reduced by $N^2$. As a consequence, the clock generator of the present invention results in significantly less relative period jitter than available with other oscillators that generate their output directly or through frequency multiplication.

Figure 2:
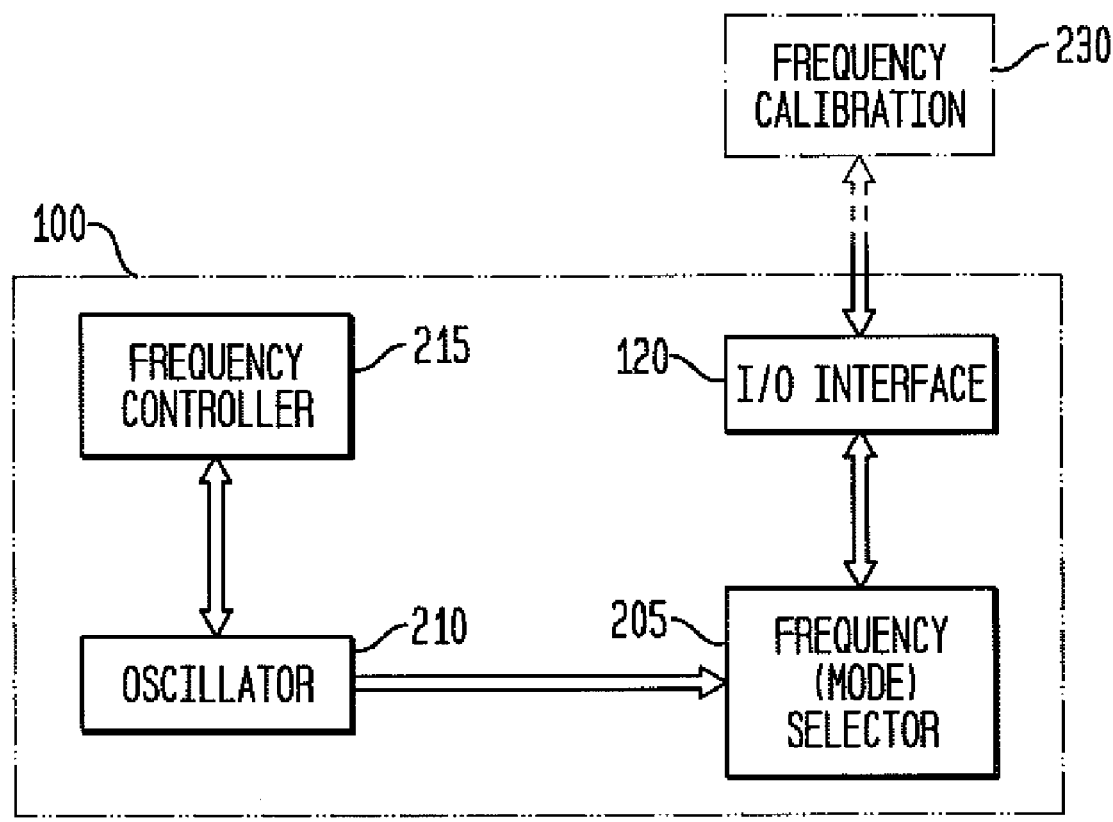
FIG. 2 a block diagram illustrating a first exemplary apparatus embodiment in accordance with the teachings of the present invention.

These features are illustrated in greater detail in FIG. 2, which is a block diagram illustrating in greater detail a first exemplary apparatus 100 embodiment in accordance with the teachings of the present invention, namely, a reference signal generator 100 which comprises an oscillator 210 (typically having a resonant element, such as an LC oscillator) and a frequency controller 215. The reference signal generator 100 may also include a frequency (and/or mode) selector 205. Depending on the selected embodiment, the reference signal generator 100 may also include an I/O interface 120 as previously discussed. In addition, the reference signal generator 100 may also include or be couplable to a module for frequency calibration (230), as described in the related applications and as discussed in greater detail below.

It should be noted that the term "module", as used herein, should be understood to mean and comprise electronic circuitry. Typically, such a module is an array of a plurality of similar circuits having identical circuit layouts or repeatable circuit configurations, with the modules varying by a corresponding weighting or amount of included components. For example and without limitation, various arrays or modules are illustrated and discussed herein in which such circuits having identical layouts vary from each other by an amount of reactance or resistance, or type of reactance or resistance.

More specifically, the present application also refers to inventions, features and components disclosed in prior patents and patent applications filed by many of the inventors herein. In the interests of brevity, those disclosures will not be repeated herein, and interested readers may refer to the referenced applications as cited below. Accordingly, all of the following patents and patent applications (collectively referred to as the "related applications") are each incorporated in their entirety herein by reference, with the same full force and effect as if set forth in their entirety herein, as follows:

(1) McCorquodale, Michael S. et al., U.S. Pat. No. 7,227,423, issued Jun. 5, 2007, entitled "Monolithic Clock Generator and Timing/Frequency Reference," from U.S. patent application Ser. No. 11/084,962, filed Mar. 21, 2005 (the "first related application"), which claims priority to McCorquodale, Michael S., U.S. Provisional Patent Application Ser. No. 60/555,193, filed Mar. 22, 2004, entitled "Monolithic and Top-Down Clock Synthesis with Micromachined Radio Frequency Reference";

(2) McCorquodale, Michael S. et al., U.S. Pat. No. 7,248,124, issued Jul. 24, 2007, entitled "Frequency Calibration for a Monolithic Clock Generator and Timing/Frequency Reference," from U.S. patent application Ser. No. 11/232,409, filed Sep. 20, 2005 (the "second related application"), U.S. Patent Application Publication No. 2006/0071718, which is a continuation-in-part of and claims priority to U.S. patent application Ser. No. 11/084,962;

(3) Carichner, Gordon et al., U.S. Pat. No. 7,548,125, issued Jun. 16, 2009, entitled "Frequency Calibration for a Monolithic Clock Generator and Timing/Frequency Reference," from patent application Ser. No. 11/805,427, filed May 23, 2007, (the "third related application"), U.S. Patent Application Publication No. 2007/022529US, which is a continuation-in-part of and claims priority to McCorquodale, Michael S. et al., U.S. patent application Ser. No. 11/232,409;

(4) McCorquodale, Michael S. et al., U.S. Pat. No. 7,358,826, issued Apr. 15, 2008, entitled "Discrete Clock Generator and Timing/Frequency Reference," from U.S. patent application Ser. No. 11/384,973, filed Mar. 20, 2006, (the "fourth related application"), U.S. Patent Application Publication No. 2006/0158268, which is a continuation-in-part of and claims priority to McCorquodale, Michael S. et al., U.S. patent application Ser. No. 11/084,962;

(5) McCorquodale, Michael S. et al., U.S. Pat. No. 7,365,614, issued Apr. 29, 2008, entitled "Integrated Clock Generator and Timing/Frequency Reference," from U.S. patent application Ser. No. 11/384,758, filed Mar. 20, 2006, (the "fifth related application"), U.S. Patent Application Publication No. 2006/0152293, which is a continuation-in-part of and claims priority to McCorquodale, Michael S. et al., U.S. patent application Ser. No. 11/084,962;

(6) McCorquodale, Michael S. et al., U.S. Pat. No. 7,504,899, issued Mar. 17, 2009, entitled "Inductor and Capacitor-Based Clock Generator and Timing/Frequency Reference," from U.S. patent application Ser. No. 11/384,605, filed Mar. 20, 2006, (the "sixth related application"), U.S. Patent Application Publication No. 2006/0158267, which is a continuation-in-part of and claims priority to McCorquodale, Michael S. et al., U.S. patent application Ser. No. 11/084,962;

(7) Pernia, Scott M. et al., U.S. Pat. No. 7,307,486, issued Dec. 11, 2007, entitled "Low-Latency Startup for a Monolithic Clock Generator and Timing/Frequency Reference," from U.S. patent application Ser. No. 11/233,414, filed Sep. 21, 2005, (the "seventh related application"), U.S. Patent Application Publication No. 2006/0017519, which is a continuation-in-part of and claims priority to McCorquodale, Michael S. et al., U.S. patent application Ser. No. 11/084,962; and (8) Pernia, Scott M. et al., U.S. patent application Ser. No. 11/950,707, filed Dec. 5, 2007, entitled "Clock, Frequency Reference, and Other Reference Signal Generator" (the "eighth related application"), U.S. Patent Application Publication No. 2009/0146751.

In addition, the various control methodologies and other features, such as spread spectrum functionality, unit capacitance, and so on, are equally applicable to the circuit configurations of the related applications, and are also within the scope of the present invention.

As illustrated in FIG. 2, the reference signal generator 100 provides one or more output reference signals, such as a clock or reference signal having any of a plurality of frequencies, selected using frequency (and/or mode) selector 205. In accordance with the invention, the oscillator 210 generates a signal having a comparatively high frequency, $f_0$. Due to PVT or age variations mentioned above, the frequency controller 215 is utilized to frequency select or tune the oscillator 210, such that the oscillation frequency $f_0$ is selectable from a plurality of potential oscillation frequencies, i.e., the frequency controller 215 provides for output signals having frequencies which are accurate over PVT and age variations.

A variety of exemplary frequency controllers 215, 315 (FIG. 3) are discussed in greater detail below.

For example, given these PVT variations, the output frequency from an oscillator, such as oscillator 210, could potentially vary as much as plus or minus 5%. For some applications, such as those utilizing ring oscillators, such frequency variability may be acceptable. In accordance with the present invention, however, greater accuracy for the reference signal generator 100, 200, 200A, 300, 300A, 400, 400A, 500, 500A, 600, 600A is desirable, particularly for more sensitive or complex applications, such as providing clock signals for integrated microprocessors, microcontrollers, digital signal processors, communication controllers, and so on. As a consequence, frequency controller 215, 315 is utilized to adjust for these PVT variations, such that the output frequency from the oscillator is the selected or desired frequency $f_0$ with much less variance by several orders of magnitude, such as ±0.25% or less, and having a comparatively low-jitter. In addition, various embodiments of the reference signal generator 100 also provide for such stable frequency control with the aging of the integrated circuitry.

To improve performance and decrease jitter (noise) and other interference, instead of generating a low frequency output and multiplying it up to a higher frequency, as is typically done using PLLs and DLLs, the present invention generates a comparatively high frequency output, $f_0$, which is then divided to one or more lower frequencies ($f_1$ through $f_n$), using frequency (and/or mode) selector 205, which may include a frequency divider (not separately illustrated) and may also include a square-wave generator, such as illustrated in the various related applications. Reference or clock signals having one or more of the plurality of frequencies from a frequency divider may then be selected, using frequency (and/or mode) selector 205. As indicated above, such frequency selection is provided glitch-free and with low latency, providing comparatively and significantly fast and glitch-free frequency switching. In addition, a plurality of operating modes are provided as an option, using mode selection capability of frequency (and/or mode) selector 205.

Alternatively, one or more reference signals provided directly as one or more output signals, with the frequency (and/or mode) selector 205 providing merely basic I/O functions such as impedance matching and output drivers, or the frequency (and/or mode) selector 205 may be omitted, with I/O functionality provided by an I/O interface 120.

Figure 3:
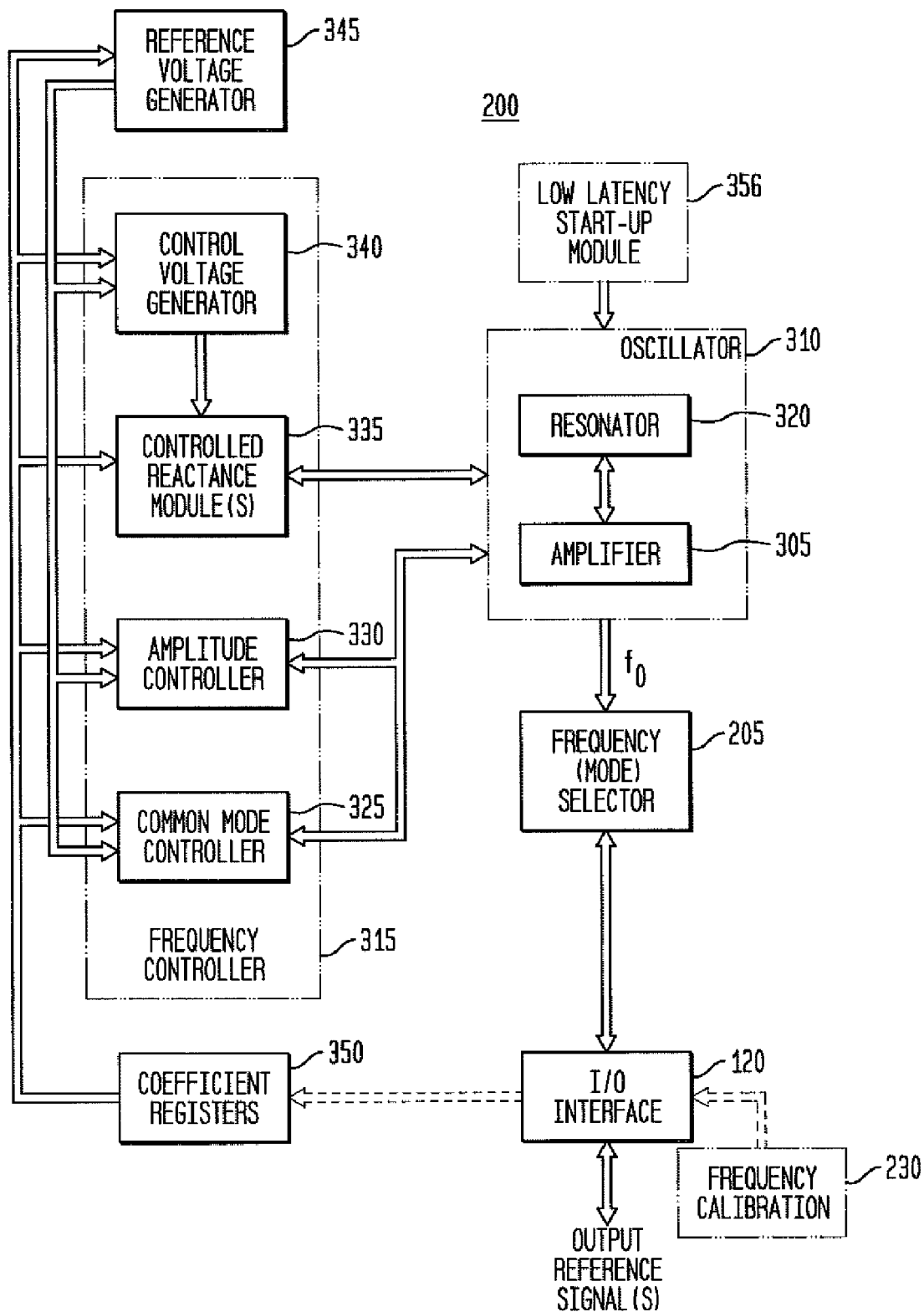
FIG. 3 a block diagram illustrating in greater detail a second exemplary apparatus embodiment in accordance with the teachings of the present invention.

FIG. 3 is a block diagram illustrating in greater detail a second exemplary apparatus embodiment, reference signal generator 200, in accordance with the teachings of the present invention. Referring to FIG. 3, reference signal generator 200 comprises a frequency controller 315, an oscillator 310, a reference voltage generator 345, and one or more coefficient registers 350 (as a more specific type or instantiation of a memory, as described/defined below). The reference signal generator 200 may also include a frequency (and/or mode) selector 205 and/or an I/O interface 120 as previously discussed, and may also include a low-latency start-up module 356 (as described in the seventh related application). The reference signal generator 200 may also comprise or be couplable to a frequency calibration module 230 (as described in the second and third related applications).

In this embodiment, the oscillator 310 comprises a resonator 320 and a sustaining amplifier 305, while the frequency controller 315 comprises a common mode controller 325, an amplitude controller 330, controlled reactance modules 335 (also referred to equivalently as controlled reactances), and a control voltage generator 340. In another exemplary apparatus 200A embodiment discussed in greater detail below with reference to FIG. 37, the frequency controller 315 further comprises reactance-resistance modules 337, and either or both the controlled reactance modules 335 and the control voltage generator 340 are not required but may be included as another available alternative or option. In another alternative, exemplary embodiment of apparatus 200A, resistance modules 338 may be utilized, either in addition to or in lieu of reactance-resistance modules 337; for example, resistance modules 338 may be utilized in conjunction with controlled reactance modules 335, with or without utilization of reactance-resistance modules 337. A plurality of configurations of the reactance-resistance modules 337 and resistance modules 338 are discussed below and illustrated in FIGS. 37 and 43-47. In the apparatus 200A embodiment, the apparatus 200A may also comprise or be couplable to a temperature calibration module 231, also as discussed in greater detail below.

The amplitude controller 330 is utilized to sense and control the peak amplitude of the signal generated by the resonator 320, and thereby control the resonant frequency ($f_0$) of the resonator 320, by determining or varying the amount of current input into the resonator 320 in selected embodiments. By doing so, the amplitude controller 330 decreases the sensitivity of the resonator 320 to variations in bias voltage, power supply voltage and other voltages, providing for a substantially more constant, selected resonant frequency ($f_0$) of the resonator 320.

The common mode controller 325 is utilized to sense and control a common mode voltage level of the resonator 320, and also thereby control the resonant frequency ($f_0$) of the resonator 320, also by determining or varying the amount of current input into the resonator 320 in selected embodiments. By doing so, the common mode controller 325 decreases the sensitivity of the resonator 320 to variations in transistor gate-to-source and threshold voltages due to transistor (or device) aging, such as due to changes in transistor threshold voltage from sources such as oxide tunneling and hot carrier effect, thereby also providing for a substantially more constant, selected resonant frequency ($f_0$) of the resonator 320 over time, and especially over longer periods of time (years).

The exemplary controlled reactance modules 335 are one or more switchable or otherwise controllable modules having a reactance component (a reactive impedance), such as one or more inductors or capacitors, any or all of which may be fixed or variable. In accordance with the exemplary embodiments, and as discussed in greater detail below and in the related applications, the switching of the controlled reactance modules 335 to the resonator 320, or the modification of a control voltage ("$V_{CTL}$") applied to a controlled reactance module 335 coupled to the resonator 320, is utilized to select or alter the resonant frequency ($f_0$) of the resonator 320. For example, during an initial calibration, an amount of reactance is determined, for coupling to the resonator 320, to select the resonant frequency ($f_0$) of the resonator 320. Various calibration methods and systems are disclosed in the second and third related applications. The calibration determines a plurality of control coefficients, stored in control coefficient register(s) 350, which are then utilized to provide the corresponding switching of different amounts of capacitance (or other reactance) to the resonator 320 or switching to a control voltage or other voltage (e.g., $V_{DD}$ or ground). Through such a calibration process which determines the amount of reactance effectively coupled to the resonator 320, frequency control is provided for the resonator 320, enabling selection and adjustment of the oscillation frequency (resonant frequency ($f_0$)) separately and/or independently of process variations inherent in semiconductor fabrication technologies, including both process variations within a given foundry (e.g., batch or run variations, variations within a given wafer, and die-to-die variations within the same wafer) and process variations among different foundries and foundry processes (e.g., 130 nm and 90 nm processes)).

Also for example, in accordance with the present invention, a control voltage ("$V_{CTL}$") generated by control voltage generator 340 is utilized to determine an amount of variable capacitance presented or coupled to the resonator 320 by the controlled reactance modules 335, such that varying the control voltage correspondingly varies the amount of capacitance (of varactors comprising the controlled reactance modules 335) which, in turn, correspondingly varies the resonant frequency ($f_0$) of the resonator 320. A plurality of configurations of the controlled reactance modules 335 are discussed below and illustrated in FIGS. 27-31.

The control voltage generator 340 is also utilized to provide for a substantially more constant, selected resonant frequency ($f_0$) of the resonator 320 in response to variations in temperature (or another parameter), such as variations of the operating temperature of the system 150, 900, 950, as the system 150, 900, 950 may generate heat during operation, may be subject to heat from additional devices, and may be subject to temperature fluctuations due to ambient or other operating temperature variations. The control voltage generator 340 is utilized to provide a corresponding control voltage which tracks such temperature changes ($V_{CTL}(T)$) and which, in turn, affects the amount of effective capacitance or other reactance coupled to the resonator 320, with corresponding effects on the resonant frequency ($f_0$) of the resonator 320.

Such a temperature-dependent control voltage ($V_{CTL}(T)$) may be utilized to affect the resonant frequency $f_0$ through, for example, modifying the effective reactance or impedance (e.g., capacitance, inductance or resistance) coupled to and effectively forming part of the resonator 310. For example, the effective reactance (or impedance) may be modified by coupling to or decoupling from the resonator 320 fixed or variable capacitances, or by modifying the magnitudes of one or more reactances which are already coupled to the resonator, such as by modifying a control voltage or other continuous control parameter. In other embodiments, the control voltage ($V_{CTL}(T)$) may be utilized to modify the current through the resonator 310 and sustaining amplifier 305, also affecting the resonant frequency.

In the various illustrated embodiments discussed below, the control voltage generator 340 is generally implemented to utilize a temperature parameter, such that a substantially stable resonant frequency $f_0$ is provided over variations in operating temperature. It will be understood by those of skill in the art that the control voltage generator 340 and controllers 325, 330 may be implemented to provide a substantially stable resonant frequency $f_0$ as a function or in response to other variable parameters, such as variations due to fabrication process, voltage variations, aging, and other frequency variations.

In contrast, in the apparatus 200A and other embodiments discussed below with reference to FIGS. 37-47, reactance-resistance modules 337 and/or resistance modules 338 are utilized to provide a substantially stable resonant frequency $f_0$ over variations in operating (and/or ambient) temperature, without separate or additional use of a temperature-dependent control voltage ($V_{CTL}(T)$). For these embodiments, the apparatuses and systems are calibrated over temperature variation, with different types and/or amounts of resistances (resistors or more generally, the real component of any impedance) selected during calibration to offset or cancel any potential frequency changes which would otherwise occur due to a temperature dependence of other components, resulting in a substantially "flat" overall temperature response, i.e., a substantially stable resonant (or center) frequency $f_0$ over variations in operating temperature. Using either or both reactance-resistance modules 337 or controlled reactance modules 335, the amounts of reactance (such as fixed or variable capacitances) are selected during a frequency calibration process, to provide the selected or desired resonant frequency $f_0$ (or center frequency), respectively either with the various resistances or separately without the various resistances. In other exemplary embodiments, different types and/or amounts of resistances (without a reactance component, such as a capacitor), may be selected jointly (as part of reactance-resistance modules 337) or separately (via resistance modules 338) to provide temperature calibration, with exemplary resistance modules 338 illustrated in and discussed below with reference to FIG. 47. For example, an inductor such as inductor 435 typically exhibits a first, negative temperature dependence which, without temperature compensation, would result in a decrease in the resonant or center frequency with increasing temperature. Similarly, various types of capacitances and resistances may be selected which typically exhibit a second, positive temperature dependence which, without temperature compensation, would provide an increase in the resonant (or center) frequency with increasing temperature. Accordingly, for a given resonant (or center) frequency $f_0$ and a selected or given inductance, resistances and/or both reactances and resistances are selected to provide an offsetting or cancelling temperature dependence, as a calibrated form of temperature compensation, such that the resulting resonant (or center) frequency $f_0$ is substantially stable over a predetermined range of temperature variation.

In this way, resistive and reactive components are selected during a temperature calibration process to provide offsetting or cancelling temperature dependencies throughout a predetermined range, resulting in an apparatus and/or system having a selected resonant (or center) frequency $f_0$ which is substantially stable over temperature variation within the predetermined range. Such a temperature calibration process may be performed jointly with or separately from a frequency calibration process utilized to select or determine the resonant (or center) frequency $f_0$.

These embodiments may be considered counter-intuitive or otherwise departing from what would be commonly known or accepted by those having skill in the art, because the resulting temperature compensation which intentionally incorporates added resistance typically results in an overall lower quality factor ("Q") for the apparatus 200A compared to the Q value which it would have otherwise. In various embodiments, however, such a comparatively lower Q may nonetheless be sufficiently high for selected or given applications, while simultaneously using lower power potentially compared to the power utilized to generate a temperature-dependent control voltage ($V_{CTL}(T)$), for example.

Referring again to FIG. 3, the reference voltage generator 345 is utilized to provide reference voltages for use by the control voltage generator 340, the common mode controller 325, and the amplitude controller 330, in addition to other components. The reference voltage generator 345 includes a conditioning circuit structure used for some of the reference voltages, described below, such that the reference voltage which is generated also tracks and is a function of corresponding fabrication process variations, temperature fluctuations, and IC aging.

For clock signal generation, reference signal generator 100, 200, 200A, 300, 300A, 400, 400A, 500, 500A, 600, 600A may utilize a frequency divider (in frequency (mode)

selector 205) to convert the output oscillation frequency $f_0$ to a plurality of lower frequencies ($f_1$ through $f_n$), and may utilize a square wave generator (also in frequency (mode) selector 205) to convert a substantially sinusoidal oscillation signal to a substantially square wave signal for clock applications. Frequency (mode) selector 205 then provides for selection of one or more of the available output signals having the plurality of frequencies, and may also provide for operating mode selection, such as providing a low power mode, a pulsed mode, a reference mode, and so on. Using these components, the reference signal generator 100, 200, 200A, 300, 300A, 400, 400A, 500, 500A, 600, 600A provides a plurality of highly accurate (over PVT), low jitter, and stable output frequencies, $f_0$, $f_1$ through $f_n$, with minimal to negligible frequency drift due to such PVT variations, thereby providing sufficient accuracy and stability for sensitive or complex applications, as mentioned above.

Figure 4:
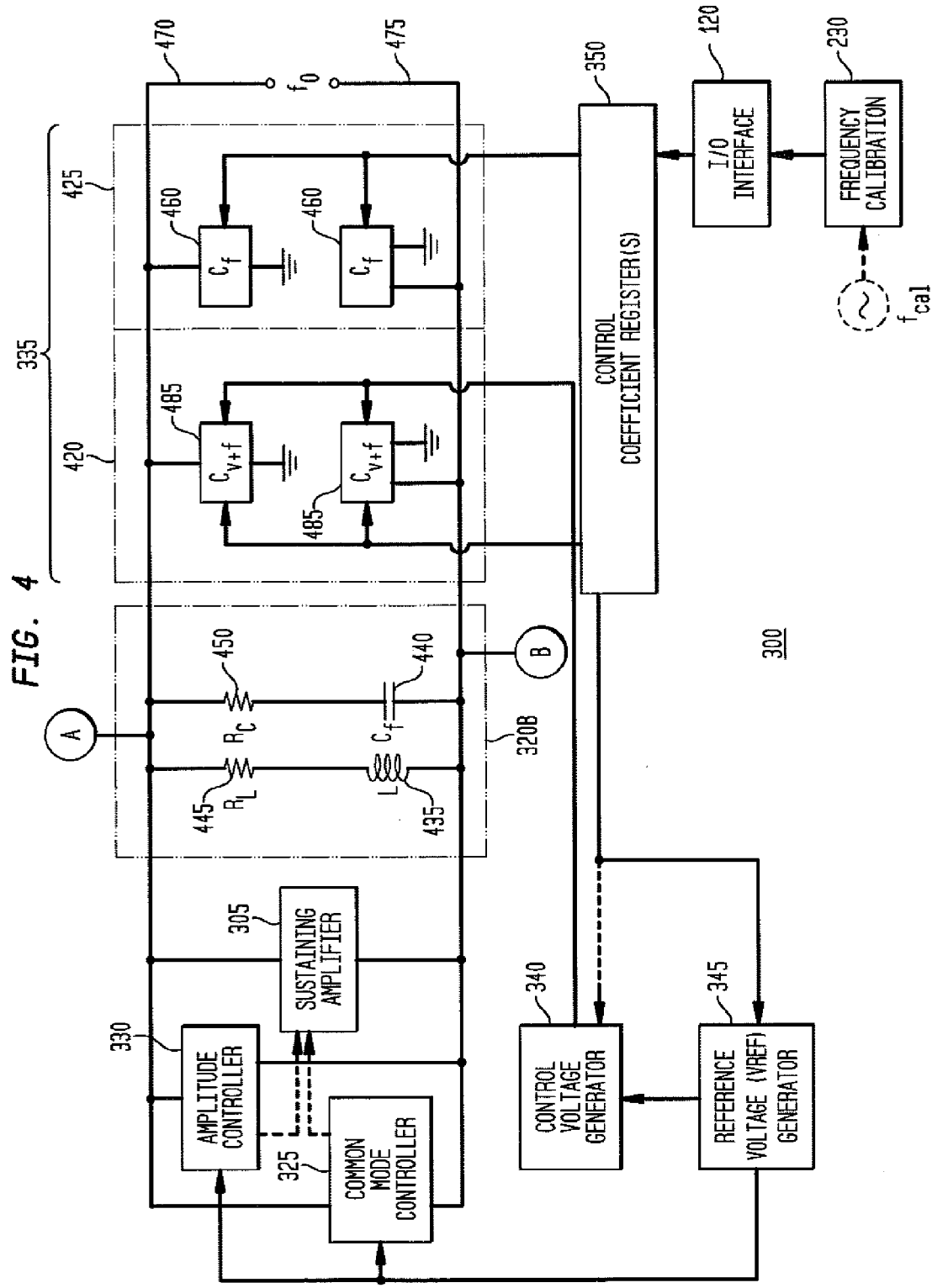
FIG. 4 is a high-level circuit and block diagram illustrating in greater detail an exemplary apparatus, exemplary resonator, exemplary controlled reactance modules, and an exemplary frequency calibration module in accordance with the teachings of the present invention.

The sustaining amplifier 305 provides for both start-up and sustaining amplification for the resonator 320. The resonator 320 may be any type of resonator which stores energy, such as an inductor (L) and a capacitor (C) coupled to form an LC-tank, where the LC-tank has a selected configuration of a plurality of LC-tank configurations, or is otherwise electrically or electromechanically equivalent to or otherwise typically represented in the art as an inductor coupled to a capacitor. Such an LC-resonator is illustrated as resonator 320B in FIGS. 4 and 39. FIG. 4 is a high-level schematic and block diagram illustrating in greater detail such an exemplary resonator 320 (illustrated as resonator 320B), exemplary controlled reactance modules 335, illustrated as modules 420, 425, and an exemplary frequency calibration module 230 in accordance with the teachings of the present invention. In addition to LC resonators, other resonators are considered equivalent and within the scope of the present invention; for example, the resonator 320 may be a ceramic resonator, a mechanical resonator (e.g., XTAL), a microelectromechanical ("MEMS") resonator, or a film bulk acoustic resonator. In other cases, various resonators may be represented by electrical or electromechanical analogy as LC resonators, and are also within the scope of the present invention.

In exemplary embodiments, an LC-tank has been utilized as a resonator 320, to provide for a high Q-value for a completely integrated solution. A plurality of LC-tank configurations and other circuit configurations were described in the sixth related application, such as a double-balanced, differential LC configuration (also illustrated in FIGS. 4, 5 and 6 herein); a differential n-MOS cross-coupled topology; a differential p-MOS cross-coupled topology; a single-ended Colpitts LC configuration; a single-ended Hartley LC configuration; a differential, common base Colpitts LC configuration; a differential, common collector Colpitts LC configuration; a differential, common base Hartley LC configuration; a differential, common collector Hartley LC configuration; a single-ended Pierce LC oscillator, a quadrature LC oscillator configuration, and an active inductor configuration. Any and all such LC and active inductor configurations are considered equivalent and within the scope of the present invention.

For example, as illustrated in FIG. 4, the oscillator 310 is embodied as a resonant LC tank 320B with a sustaining amplifier 305, and may be equally described as a harmonic oscillator or harmonic core, and all such variations are within the scope of the present invention. It should be noted that while the resonant LC tank 320B is an inductor 435 in parallel with a capacitor 440, other circuit topologies are also known and equivalent to that illustrated, such as an inductance in series with a capacitance, and the other LC configurations mentioned above. Other equivalent topologies or configurations are illustrated in FIGS. 5, 6, 40 and 41. In addition, as indicated above, other types of resonators may be utilized and all are considered equivalent to the exemplary resonant LC tank illustrated herein. Moreover, as discussed in greater detail below, additional capacitances and/or inductances, both fixed and variable (and referred to more generally as impedances or reactances (or reactive elements)), are distributed in the various controlled reactance modules 335 (and/or reactance-resistance modules 337) and effectively form part of the resonant LC tank 320B (and 320A and 320C) and are utilized as part of the frequency controller 315 of the invention. In addition, corresponding resistances (resistive components of the various impedances) $R_L$ 445 and $R_C$ 450 are illustrated separately, but should be understood to be intrinsic to the inductor 435 and capacitor 440, respectively, occurring as part of fabrication, and are not additional or separate components from the respective inductor 435 and capacitor 440. As mentioned above, resistances may be utilized as well, such as for temperature calibration, separately in resistance modules 338 or as part of reactance-resistance modules 337. In addition, such inductances, capacitances, and resistances may also vary with temperature, and are therefore illustrated as fixed and variable capacitances $C_f(T)$ 321, $C_v(T)$ 322, inductance $L(T)$ 323, and resistances $R_L(T)$ 445 and $R_C(T)$ 450 in FIGS. 5 and 6. Conversely, such additional or intrinsic (parasitic) resistances can also be included as part of compensation for PVT variations, as discussed in the fourth, fifth and sixth related applications. Accordingly, while for ease of reference the various modules 335 are referred to as controlled "reactance" modules 335, it should be understood that in any selected embodiment, such reactances may more generally mean and include any type of impedance, whether reactive, resistive, or both, such as the modules 895 illustrated in FIG. 30. In addition, any of the various reactance modules illustrated with capacitances (or capacitors) may be equivalently implemented with inductances (or inductors). Reference to reactance-resistance modules 337 means and includes any type of impedance having both reactive and resistive components, while reference to resistance modules 338 means and includes any type of impedance substantially or primarily having resistive components (although some reactance may be typically included, such as the parasitic capacitance of a switch or resistor, for example and without limitation).

The inductor 435, capacitor 440, and controlled reactance modules 335 (and/or reactance-resistance modules 337) of the resonant LC tank or oscillator are sized to substantially or approximately provide the selected oscillation frequency, $f_0$, or range of oscillation frequencies around $f_0$. In addition, inductor 435, capacitor 440 and controlled reactance modules 335 (and/or reactance-resistance modules 337) may be sized to have or to meet IC layout area requirements, with higher frequencies requiring less area. Those of skill in the art will recognize that $f_0 \approx 1/2\pi\sqrt{LC}$, but only as a first order approximation because, as discussed below, other factors such as the resistances $R_L$ and $R_C$, any additional resistors (or, more generally, impedances), along with temperature and fabrication process variations and other distortions, affect $f_0$, and may be included in second and third order approximations. For example, the inductor 435 and capacitor 440 may be sized to generate a resonant frequency in the 1-5 GHz range; in other embodiments, higher or lower frequencies may be desirable, and all such frequencies are within the scope of the invention. In addition, the inductor 435 and capacitor 440 may be fabricated using any semiconductor or other circuitry process technology, and may be CMOS-compatible, bipolar-junction transistor-compatible, for example, while in other embodiments, the inductor 435 and capacitor 440 may be fabricated using silicon-on-insulator (SOI), metal-insulator-metal (MiM), polysilicon-insulator-polysilicon (PiP), GaAs, strained-silicon, semiconductor heterojunction technologies, or MEMS-based (microelectromechanical) technologies, also for example and without limitation. It should be understood that all such implementations and embodiments are within the scope of the invention. In addition, other resonator and/or oscillator embodiments, in addition to or instead of the resonant LC tank 320B, may also be utilized and are also within the scope of the present invention. As used herein, "LC tank" will mean and refer to any and all inductor and capacitor circuit layouts, configurations or topologies which may provide oscillation, however embodied. It should be noted that the capability of the oscillator 310 to be fabricated using a conventional process, such as CMOS technology, allows the reference signal generator 100, 200, 200A, 300, 300A, 400, 400A, 500, 500A, 600, 600A to be fabricated integrally and monolithically with other circuitry, such as the second circuitry 180, and provides a distinct advantage of the present invention.

In addition, the capacitance 440 illustrated in FIG. 4 is only a portion of the overall capacitance involved in the resonance and frequency determination of the resonant LC tank 320B, and may be a fixed capacitance in an exemplary embodiment. In selected embodiments, this fixed capacitance may represent approximately 10% to 90% of the total capacitance ultimately utilized in the oscillator, as an example. Alternatively, the capacitance 440 may also be implemented as a variable capacitance, if desired. As discussed in greater detail below, the overall capacitance is distributed, such that additional fixed and variable capacitance is selectively included within the reference signal generator 100, 200, 200A, 300, 300A, 400, 400A, 500, 500A, 600, 600A, and is provided, for example, by components of the frequency controller 315, to provide for both selecting the resonant frequency $f_0$ and to allow the resonant frequency $f_0$ to be substantially stable over and substantially independent of temperature variations, aging, voltage variations, and fabrication process variations.

In the selected embodiments, the inductance 435 has been fixed, but also could be implemented in a variable manner, or as a combination of fixed and variable inductances. As a consequence, those of skill in the art will recognize that the detailed discussions of fixed and variable capacitance, for both frequency tuning and temperature and fabrication process independence, pertain similarly to inductance choices. For example, different inductances could be switched in or out of the oscillator, to similarly provide tuning. In addition, a single inductor's inductance may also be modulated. As a consequence, all such inductance and capacitance variations are within the scope of the present invention, and are illustrated as switchable, variable and/or fixed reactive elements or components. For ease of reference, such reactances are illustrated as inductance 323, fixed capacitance(s) 321 and variable capacitance(s) 322 in FIGS. 5 and 6.

It should be noted that the terms "fixed" and "variable" are utilized as known in the art, with "fixed" being understood to mean configured generally to be non-varying with respect to a selected parameter, and "variable" meaning configured generally to be varying with respect to the selected parameter. For example, a fixed capacitor generally means that its capacitance does not vary as a function of an applied voltage, while a variable capacitor (varactor) will have a capacitance which does vary as a function of applied voltage. Both, however, may have and generally will have capacitances which vary as a function of fabrication process variation. In addition, a fixed capacitor may be formed as a varactor coupled to a constant voltage, for example. Similarly, components may be coupled to each other either directly or indirectly or, stated another way, operatively coupled or coupled via signal transmission. For example, one component may be coupled to a second component via a third component, such as through a switching arrangement, a divider, a multiplier, etc. Those of skill in the art will recognize these various circumstances and contexts, as illustrated and as discussed below, and what is meant when such terms are utilized.

Also as illustrated in FIGS. 4-6, 33, and 39-42, the resonant LC tank 320 (illustrated as specific instantiations 320A, 320B and 320C) and resulting output signal, referred to as a first (output) signal at nodes "A" and "B" (nodes or lines 470 and 475), is a differential signal and provides common-mode rejection. Other configurations, including non-differential or other single-ended configurations are also within the scope of the present invention. For example, in single-ended configurations, only one instantiation of the various modules (e.g., 485, 460) would be required, rather than the use of two for a balanced configuration as illustrated. Similarly, other components and features discussed below, such as frequency dividers, would also have a single-ended rather than differential configuration. Such additional exemplary LC oscillators, both differential and single-ended, are discussed below and in the related applications, in addition to the differential LC oscillators illustrated in FIGS. 4-6, 33, and 39-42. In addition, various embodiments illustrated utilize MOSFET transistors (metal oxide semiconductor field effect transistors) in various forms (such as CMOS, accumulation-mode MOSFET ("AMOS"), inversion-mode MOSFET ("IMOS"), and so on); other implementations are also available, such as using bipolar junction transistors ("BJTs"), BiCMOS, etc. All such embodiments are considered equivalent and are within the scope of the present invention.

Figure 5:
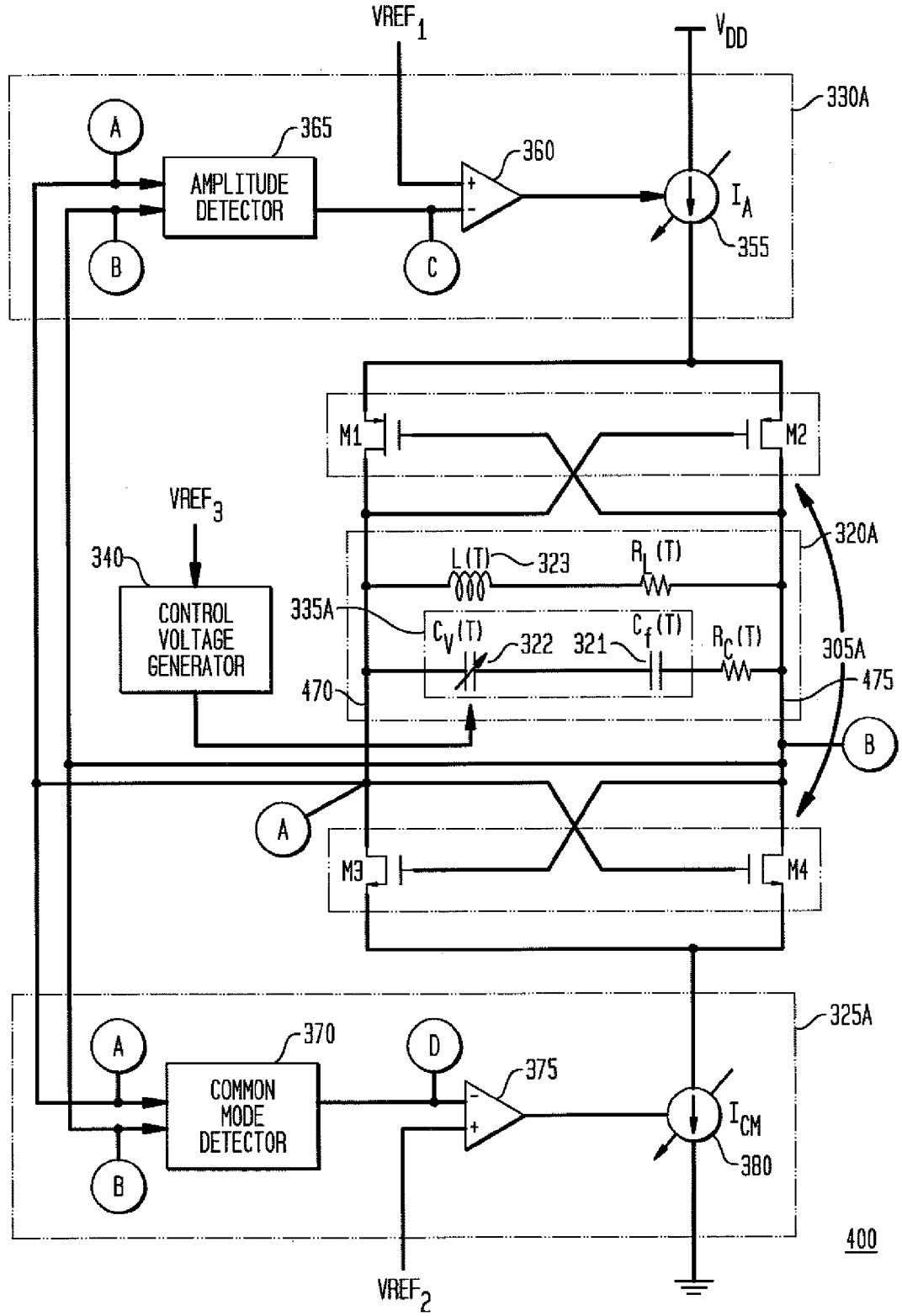
FIG. 5 is a circuit and block diagram illustrating a third exemplary apparatus embodiment in accordance with the teachings of the present invention.
Figure 6:
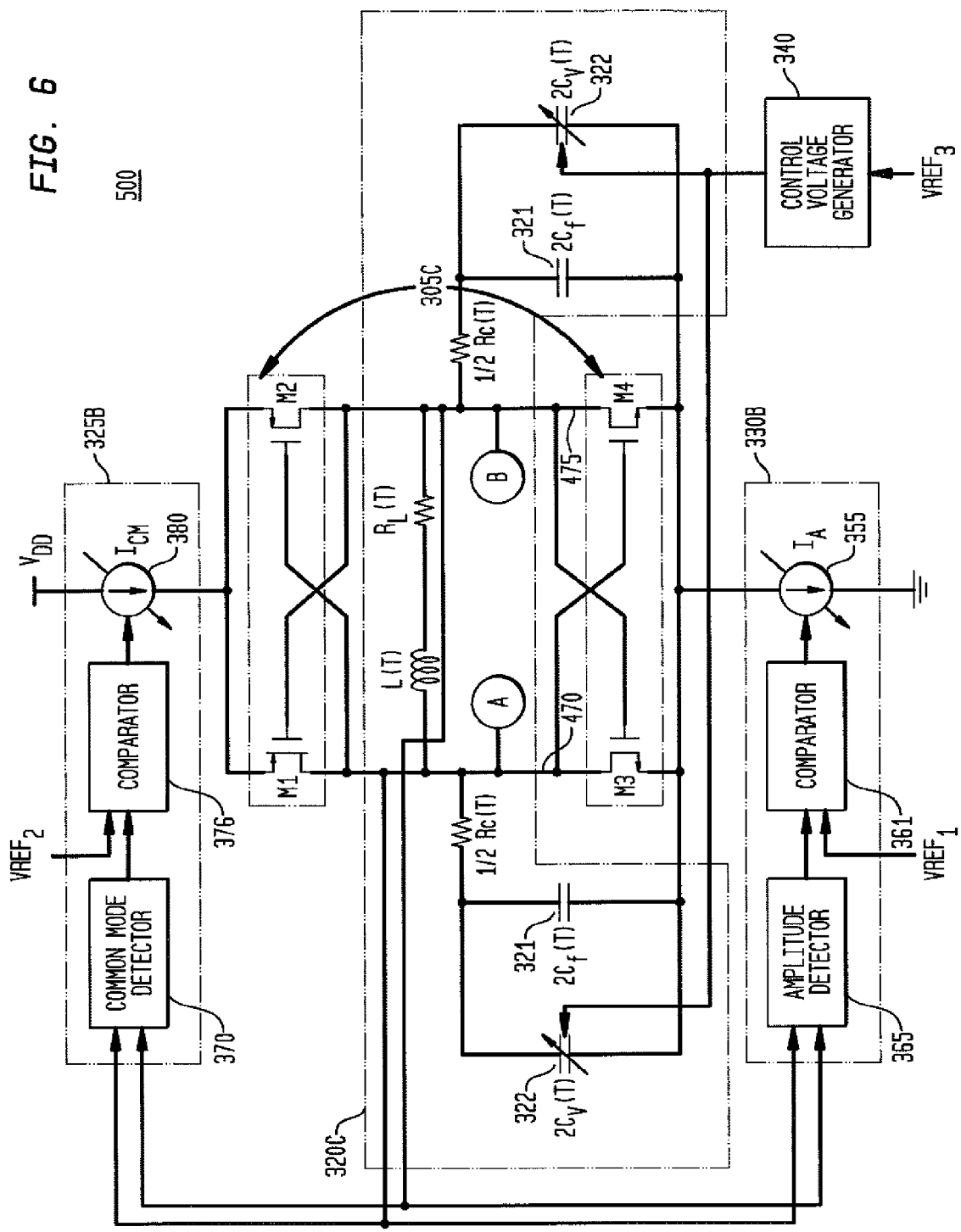
FIG. 6 is a circuit and block diagram illustrating a fourth exemplary apparatus embodiment in accordance with the teachings of the present invention.

FIG. 5 is a circuit and block diagram illustrating a third exemplary apparatus embodiment, reference signal generator 400, in accordance with the teachings of the present invention. FIG. 6 is a circuit and block diagram illustrating a fourth exemplary apparatus embodiment, reference signal generator 500, in accordance with the teachings of the present invention. As illustrated in FIGS. 5 and 6, reference signal generator 400 and reference signal generator 500 differ with regard to the circuit configuration of the respective LC-tanks 320A and 320C, the circuit locations of amplitude controller 330A, 330B and common mode controller 325A, 325B, and the use of operational amplifiers 360, 375 (respectively in amplitude controller 330A and common mode controller 325A) in contrast with comparators 361, 376 (respectively in amplitude controller 330B and common mode controller 325B), and otherwise function substantially identically. In addition, FIGS. 5 and 6 illustrate in greater detail exemplary instantiations of an amplitude controller 330 and a common mode controller 325, illustrated in FIGS. 5 and 6 as amplitude controllers 330A, 330B and common mode controllers 325A, 325B, and an exemplary instantiation of a sustaining amplifier 305, illustrated as cross-coupled negative transconductance amplifiers 305A and 305C (comprising transistors M1, M2, M3, and M4). The following discussion of the operation of reference signal generators 400 and 500 is equally applicable to reference signal generator 300 of FIG. 4, and to reference signal generators 300A, 400A, 500A, 600 and 600A of FIGS. 33, and 39-42.

Figure 7:
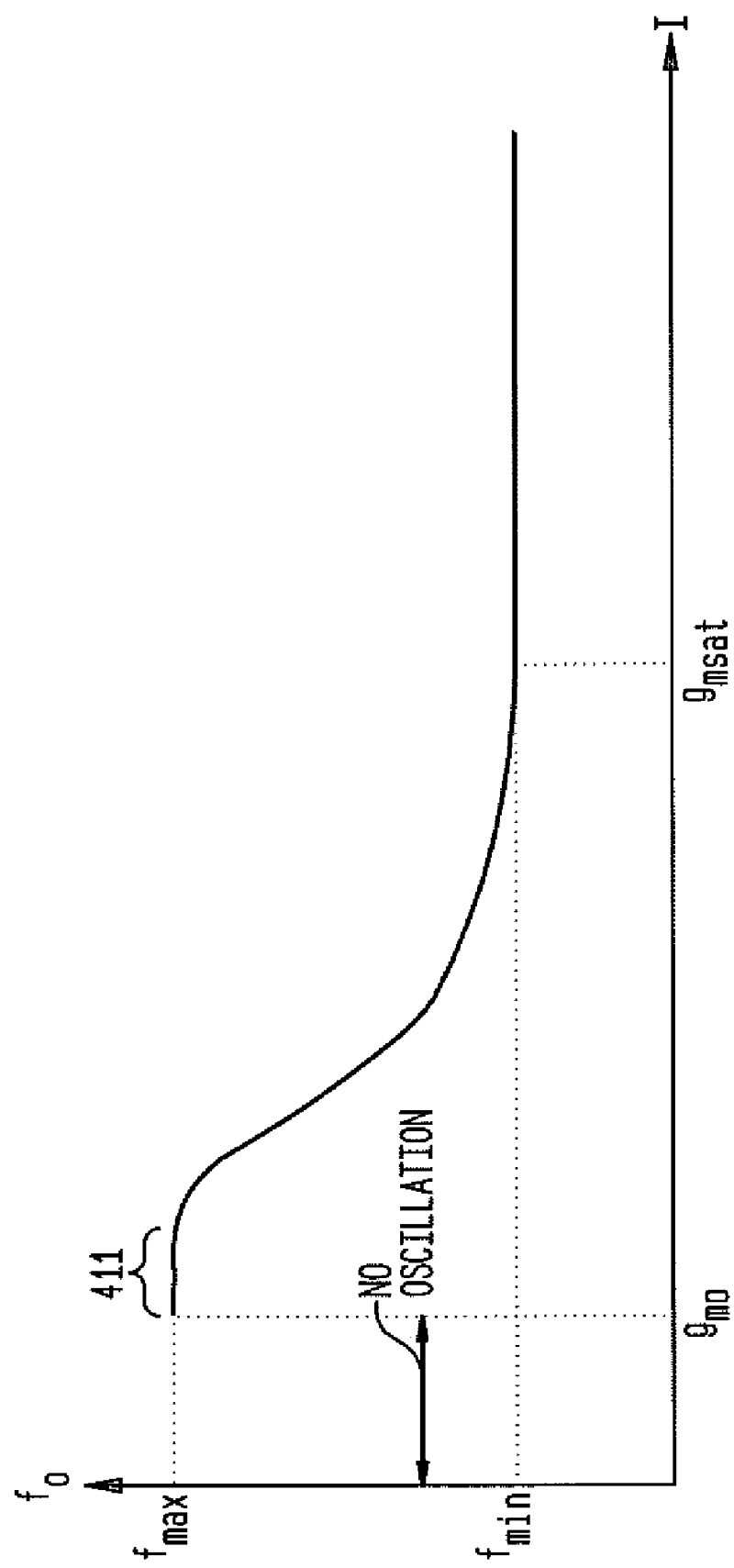
FIG. 7 is a graphical diagram illustrating resonant frequency as a function of current as utilized in accordance with the teachings of the present invention.

FIG. 7 is a graphical diagram illustrating resonant frequency as a function of current as utilized in accordance with the teachings of the present invention. More specifically, the amplitude controller 330 will regulate (and maintain substantially constant) the peak amplitude of the resonant frequency signal across differential nodes "A" and "B" (lines or nodes 470, 475), by comparing the peak amplitude with a first reference voltage (VREF$_1$) and, in turn, correspondingly controlling the amount of current input (from a variable current source 355) into the sustaining amplifier 305A, 305C and LC resonator 320A, 320C. The amplitude controller 330 will thereby maintain the level of current within the region illustrated as region 411, with the resulting signal having comparatively less harmonic content, such that any variation in current produces considerably less variation in resonant frequency, compared with frequency variations created by current fluctuations at higher current levels. The amplitude controller 330 thereby reduces the sensitivity of the reference signal generator 100, 200, 200A, 300, 300A, 400, 400A, 500, 500A, 600, 600A to fluctuations in bias voltages, power supply and other voltages, for example, and operates to maintain the resonant frequency ($f_0$) substantially stable despite such variations. The amplitude controller 330 provides an additional benefit as well, namely, reducing power consumption by maintaining a comparatively lower current through the sustaining amplifier 305A, 305C and LC resonator 320A, 320C. As discussed below, the common mode controller 325 also controls the current through the sustaining amplifier 305A, 305C and LC resonator 320A, 320C.

Referring again to FIGS. 5 and 6, the amplitude controller 330 and common mode controller 325 provide two independent controls, with separate feedback circuits (or feedback loops) from the differential nodes "A" and "B" of the resonator 320, which serve in conjunction with the control voltage generator 340 to maintain the resonant frequency $f_0$ substantially constant despite variations in temperature, bias voltage, power supply voltage, and other circuit parameters which may vary over time, such as changes in transistor threshold voltages (or, correspondingly, gate-to-source voltages) which may occur with aging, such as due to oxide tunneling and/or a hot carrier effects.

Exemplary amplitude controllers 330 are illustrated in FIG. 5 as amplitude controller 330A and in FIG. 6 as amplitude controller 330B. While illustrated as coupled to the power supply voltage rail $V_{DD}$ in FIG. 5, the amplitude controller 330A may instead be coupled to ground, as illustrated in FIG. 6 for amplitude controller 330B, essentially switching locations in the circuit with the common mode controller 325. As discussed below with respect to FIG. 34, a power rail having a voltage lower than $V_{DD}$ may also be utilized. In addition, those of skill in the art will recognize that additional circuit configurations may be utilized to implement the amplitude controller 330, in addition to the illustrated amplitude controllers 330A, 330B, and all such variations are considered equivalent and within the scope of the present invention.

Figure 11:
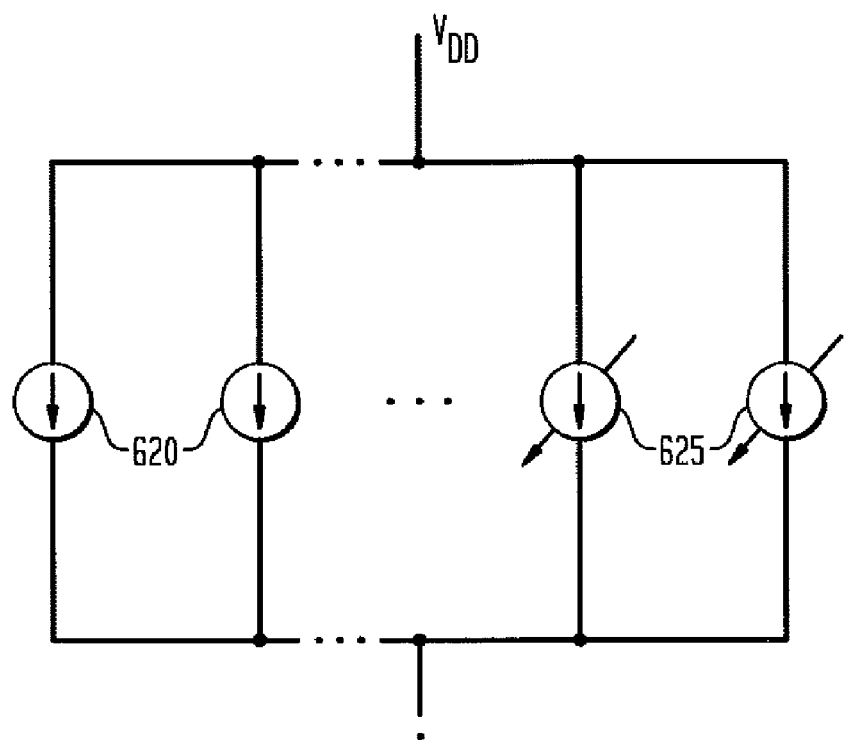
FIG. 11 is a circuit diagram illustrating exemplary fixed and variable current source embodiments in accordance with the teachings of the present invention.
Figure 33:
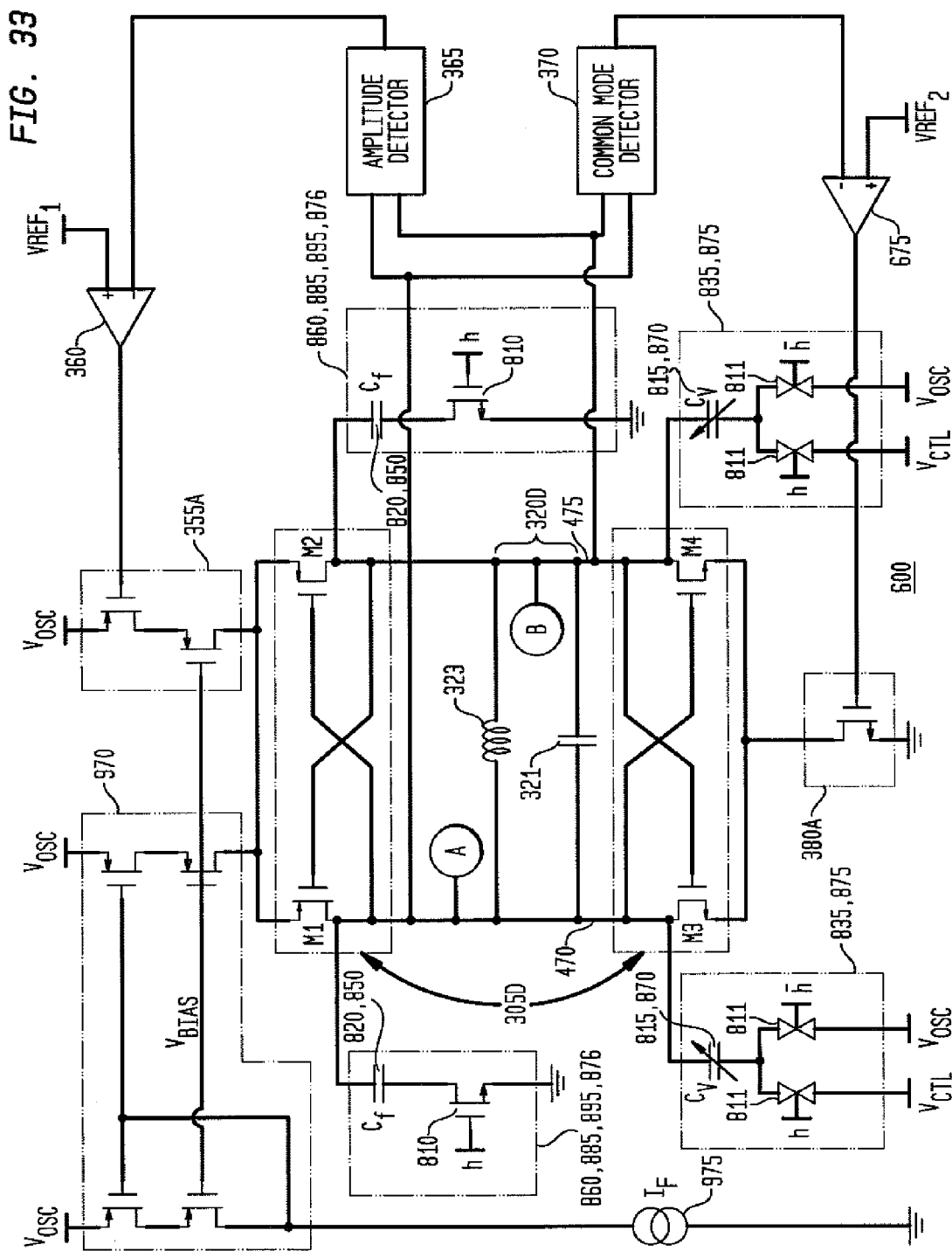
FIG. 33 is a circuit and block diagram illustrating an exemplary fifth apparatus embodiment in accordance with the teachings of the present invention.
Figure 34:
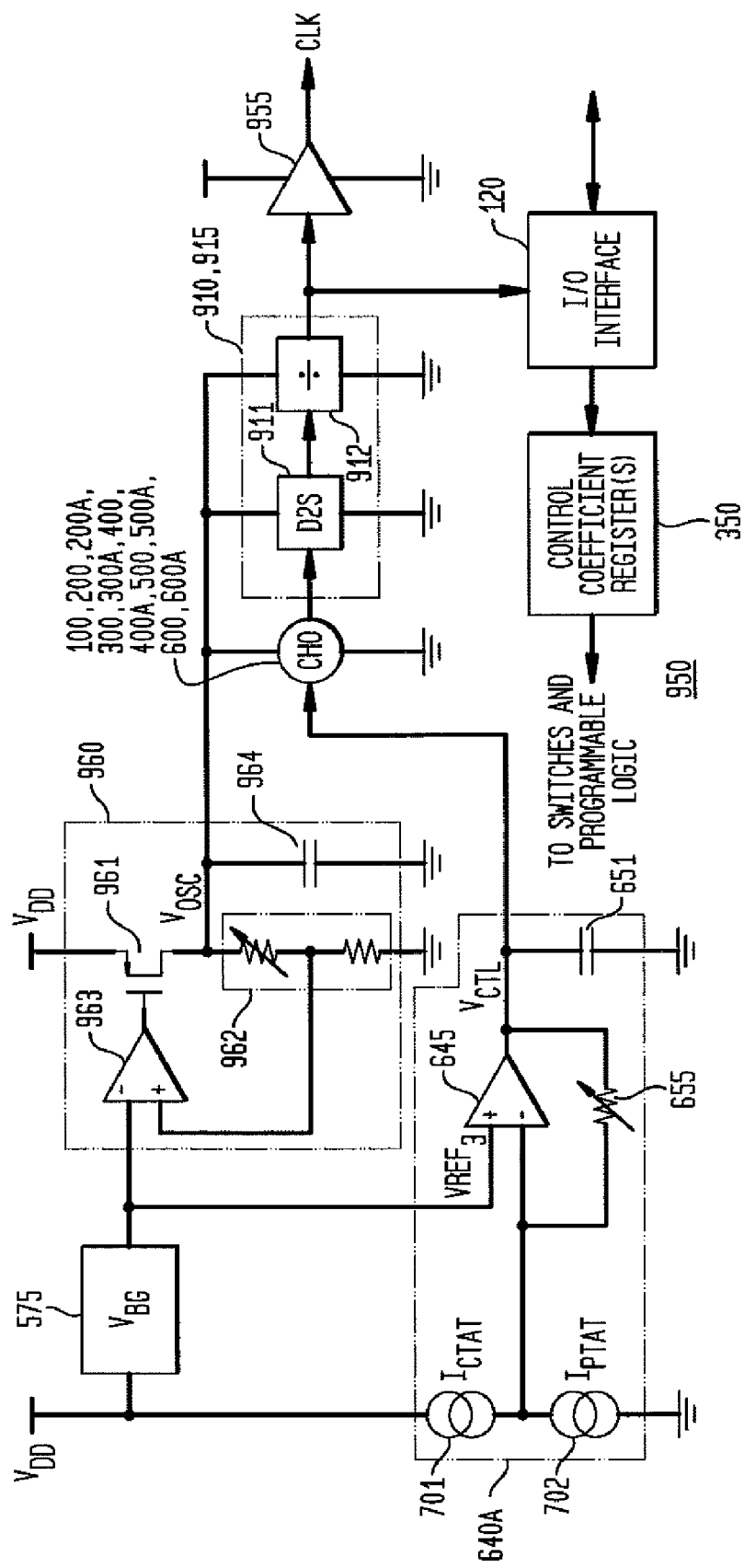
FIG. 34 a block diagram illustrating an exemplary third system embodiment in accordance with the teachings of the present invention.

Amplitude controller 330A comprises an amplitude detector (or sensor) 365 and an operational amplifier 360, and may also include a variable current source 355 (which may be implemented as one or more transistors, such as in a cascode configuration or a current mirror configuration, for example, as illustrated in FIG. 33). Amplitude controller 330B comprises an amplitude detector (or sensor) 365 and a comparator 361, and may also include a variable current source 355 (also which may be implemented as one or more transistors, such as in a cascode configuration or a current mirror configuration). (A plurality of such cascode and current mirror configurations are illustrated and discussed in the related applications, and such current sources also may be otherwise implemented as known or becomes known in the electronic arts). In addition to a variable current, the current input into the sustaining amplifier 305A, 305C and LC resonator 320A, 320C may also include a fixed current (from a fixed current source, as illustrated in FIG. 11, and not separately illustrated in FIGS. 5 and 6), such that a first portion of the current input into the sustaining amplifier 305A, 305C and LC resonator 320A, 320C is fixed, while a second portion of the current is variable and controlled by the amplitude detector 365 and operational amplifier 360 (or comparator 361).

The amplitude detector 365 is to determine the magnitude of the peak amplitude of the resonant frequency signal across differential nodes "A" and "B". There are innumerable ways to implement such an amplitude detector 365, and an exemplary amplitude detector circuit 565 is discussed below with reference to FIG. 8. The magnitude of the peak amplitude of the resonant frequency signal may be determined during any one or more half-cycles of the oscillation, as the signals appearing on differential nodes "A" and "B" are 180 degrees out of phase with each other. The magnitude of the peak amplitude is then effectively compared by the operational amplifier 360 or comparator 361 with the first reference voltage (VREF$_1$) provided by reference voltage generator 345, and as a result of the comparison, a corresponding control signal is provided to the variable current source 355.

More specifically, referring to FIG. 5, a first reference voltage (VREF$_1$) corresponding to a selected or desired magnitude of the peak amplitude has been predetermined, such as through a previously performed calibration or a design process. The operational amplifier 360 will provide a corresponding control signal to the variable current source 355, to increase or decrease the current input into the sustaining amplifier 305A, 305C and LC resonator 320A, 320C, to effectively force the magnitude of the peak amplitude (as a corresponding voltage level determined by the amplitude detector 365) to substantially equal the first reference voltage (VREF$_1$) level. Once the magnitude of the peak amplitude is substantially equal to the first reference voltage (VREF$_1$) level, the corresponding control signal from the operational amplifier 360 to the variable current source 355 will tend to maintain that corresponding current level being input into the sustaining amplifier 305A, 305C and LC resonator 320A, 320C, with adjustments as may be needed based on the feedback provided through the amplitude detector 365.

Also more specifically, referring to FIG. 6, comparator 361 will compare the magnitude of the peak amplitude (as a corresponding voltage level determined by the amplitude detector 365 to a predetermined first reference voltage (VREF$_1$) corresponding to a selected or desired magnitude of the peak amplitude. As a result of the comparison, the comparator 361 will provide a corresponding control signal to the variable current source 355, to increase or decrease the current input into the sustaining amplifier 305A, 305C and LC resonator 320A, 320C, also effectively forcing the magnitude of the peak amplitude (as a corresponding voltage level determined by the amplitude detector 365) to substantially equal the first reference voltage (VREF$_1$) level. Once the magnitude of the peak amplitude is substantially equal to the first reference voltage (VREF$_1$) level, the corresponding control signal from the comparator 361 to the variable current source 355 will tend to maintain that corresponding current level being input into the sustaining amplifier 305A, 305C and LC resonator 320A, 320C, with adjustments as may be needed based on the feedback provided through the amplitude detector 365.

As a consequence, through this first feedback circuit (or first feedback loop), the magnitude of the peak amplitude of the resonant frequency signal across nodes "A" and "B" is maintained substantially constant at a predetermined level corresponding to the predetermined, first reference voltage (VREF$_1$) level. (Such a correspondence may be substantially equal to the first reference voltage (VREF$_1$) level or substantially equal to a scaled version of the first reference voltage (VREF$_1$) level, e.g., based upon how the corresponding voltage level at differential nodes "A" or "B" may be determined by the amplitude detector 365). As indicated above, the resulting current regulation maintains the resonant frequency f$_0$ substantially constant over variations in bias voltages, power supply voltages, etc.

At a high level, the common mode controller 325 operates similarly to the amplitude controller 330, but serves to maintain substantially constant a common mode voltage across differential nodes "A" and "B", rather than a magnitude of a peak amplitude. Exemplary common mode controllers 325 are illustrated in FIG. 5 as common mode controller 325A and in FIG. 6 as common mode controller 325B. While illustrated as coupled to the ground rail in FIG. 5, the common mode controller 325A may instead be coupled to the power supply voltage rail V$_{DD}$, as illustrated in FIG. 6 for common mode controller 325B, essentially switching locations in the circuit with the amplitude controller 330. As mentioned above and as discussed below with respect to FIG. 34, a power rail having a voltage lower than V$_{DD}$ may also be utilized. In addition, those of skill in the art will recognize that additional circuit configurations may be utilized to implement the common mode controller 325, in addition to the illustrated common mode controllers 325A and 325B, and all such variations are considered equivalent and within the scope of the present invention.

The common mode controller 325 is utilized to maintain substantially constant the common mode voltage level of the resonant frequency signal across differential nodes "A" and "B", i.e., the DC level of the oscillation (the DC level about which the resonant frequency signal oscillates). Without such control from the common mode controller 325, the common mode voltage level at differential nodes "A" and "B" would tend to change over time, due to aging-related changes in transistor threshold voltages and gate-to-source voltages, such as due to oxide tunneling and hot carrier effects, for example. In turn, that potential change in common mode voltage level could have an additional effect, namely, changing the voltage level across the variable reactances (capacitances), such as variable capacitance 322, which is determined by the voltage levels at nodes "A", "B" and corresponding control voltages provided to the variable reactances (capacitances). In that event, the effective reactance across the resonator 320 would also change, resulting in a corresponding and undesirable change in resonant frequency. Accordingly, the common mode controller 325 maintains this common mode voltage level substantially constant, thereby operating to maintain the resonant frequency (f$_0$) substantially stable despite such parameter variations which may occur due to temperature fluctuations, aging, voltage variations, and fabrication process variations.

Common mode controller 325A comprises a common mode detector (or sensor) 370 and an operational amplifier 375, and may also include a variable current source 380 (which may be implemented as one or more transistors, such as in a current mirror configuration, for example). Common mode controller 325B comprises a common mode detector (or sensor) 370 and a comparator 376, and may also include a variable current source 380 (which may be implemented as one or more transistors, such as in a current mirror configuration, for example). In addition to a variable current, the current input into the sustaining amplifier 305A, 305C and LC resonator 320A, 320C may also include a fixed current (from a fixed current source, as illustrated in FIG. 11 and not separately illustrated in FIGS. 5 and 6), such that a first portion of the current input into the sustaining amplifier 305A, 305C and LC resonator 320A, 320C is fixed, while a second portion of the current is variable and controlled by the common mode detector 370 and operational amplifier 375.

The common mode detector 370 is to determine the common mode voltage level of the resonant frequency signal across differential nodes "A" and "B". There are innumerable ways to implement such a common mode detector 370, and an exemplary common mode detector circuit 670 is discussed below with reference to FIG. 10. The common mode voltage level of the resonant frequency signal may be determined during any one or more cycles of the oscillation, providing the DC level of the oscillation. The common mode voltage level is then effectively compared by the operational amplifier 375 or comparator 376 with a second reference voltage (VREF$_2$) provided by reference voltage generator 345, and as a result of the comparison, a corresponding control signal is provided to the variable current source 380.

More specifically, referring to FIG. 5, a second reference voltage (VREF$_2$) corresponding to a selected or desired common mode voltage level has been predetermined, such as through a previously performed calibration or a design process, typically a predetermined level above ground to avoid distortion. The operational amplifier 375 will provide a corresponding control signal to the variable current source 380, to increase or decrease the current input into the sustaining amplifier 305A, 305C and LC resonator 320A, 320C, to effectively force the common mode voltage level (as a corresponding voltage level determined by the common mode detector 370) to substantially equal the second reference voltage (VREF$_2$) level. Once the common mode voltage level is substantially equal to the second reference voltage (VREF$_2$) level, the corresponding control signal from the operational amplifier 375 to the variable current source 380 will tend to maintain that corresponding current level being input into the sustaining amplifier 305A, 305C and LC resonator 320A, 320C, with adjustments as may be needed based on the feedback provided through the common mode detector 370.

Also more specifically, referring to FIG. 6, comparator 376 will compare the common mode voltage level (as a corresponding voltage level determined by the common mode detector 370) with a predetermined, second reference voltage (VREF$_2$) corresponding to a selected or desired common mode voltage level, also typically a predetermined level above ground to avoid distortion. As a result of the comparison, the comparator 376 will provide a corresponding control signal to the variable current source 380, to increase or decrease the current input into the sustaining amplifier 305A, 305C and LC resonator 320A, 320C, also effectively forcing the common mode voltage level (as a corresponding voltage level determined by the common mode detector 370) to substantially equal the second reference voltage (VREF$_2$) level. Once the common mode voltage level is substantially equal to the second reference voltage (VREF$_2$) level, the corresponding control signal from the comparator 376 to the variable current source 380 will tend to maintain that corresponding current level being input into the sustaining amplifier 305A, 305C and LC resonator 320A, 320C, with adjustments as may be needed based on the feedback provided through the common mode detector 370.

As a consequence, through this second feedback circuit (or second feedback loop), the common mode voltage level of the resonant frequency signal across nodes "A" and "B" is maintained substantially constant at a predetermined level corresponding to the predetermined, second reference voltage (VREF$_2$) level. (Such a correspondence also may be substantially equal to the second reference voltage (VREF$_2$) level or substantially equal to a scaled version of the second reference voltage (VREF$_2$) level, e.g., based upon how the corresponding common mode voltage level at differential nodes "A" or "B" may be determined by the common mode detector 370). As indicated above, the resulting substantially stable common mode voltage level maintains the resonant frequency $f_0$ substantially constant over parameter variations such as temperature fluctuations, aging, voltage variations, and fabrication process variations, etc.

As a result of these two feedback mechanisms, the resonant frequency $f_0$ of the resonator 320 of the reference signal generator 100, 200, 200A, 300, 300A, 400, 400A, 500, 500A, 600, 600A is maintained substantially constant over parameter variations, such as variations in bias voltage or power supply voltage, temperature fluctuations, aging, and fabrication process variations. In order to provide convergence of these two feedback circuits (and avoid the feedback from the two loops potentially working against each other), the two feedback loops are designed to operate at different speeds in accordance with the exemplary embodiments of the invention. More specifically, the common mode controller 325 is to operate comparatively faster than the amplitude controller 330, converging comparatively quickly to the predetermined or selected common mode voltage level of the oscillation (typically predetermined and provided as VREF$_2$). The amplitude controller 330, which is to operate comparatively slower than the common mode controller 325, then more slowly converges the magnitude of the oscillation amplitude to the predetermined or selected magnitude (the amplitude magnitude above and below the common mode voltage level) (typically predetermined and provided as VREF$_1$). Typically for reference signal generator 400, the operational amplifier 375 is designed to have a comparatively low gain, and therefore a higher bandwidth and faster operation, compared to operational amplifier 360. Additional gain (for the variable current source 380) may then be provided by transistor sizing of corresponding current mirrors, as known in the art, for example.

The circuit structures illustrated in FIGS. 5 and 6 have an additional benefit, namely, providing less sensitivity to the power and ground rails. More particularly, with the variable current sources 355, 380 respectively coupled to the power and ground rails, respectively, or vice-versa, the resonant frequency signal has a voltage level fluctuating a predetermined distance (magnitude) from both the power and ground rails, providing greater immunity to various types of noise and other distortions.

Figure 8:
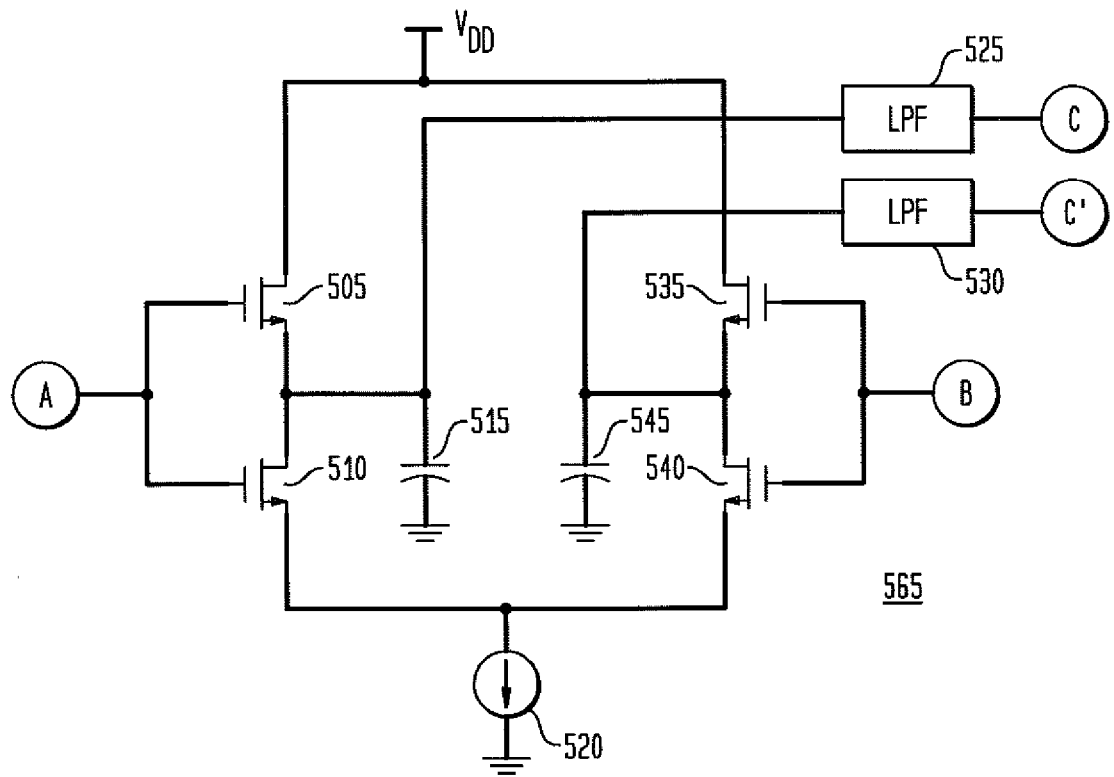
FIG. 8 is a circuit diagram illustrating an exemplary amplitude detector embodiment in accordance with the teachings of the present invention.

FIG. 8 is a circuit diagram illustrating an exemplary amplitude detector 565 embodiment in accordance with the teachings of the present invention. As mentioned above, an amplitude detector 365 may be implemented in innumerable ways; accordingly, the illustrated amplitude detector 565 is merely exemplary, and should not be regarded as limiting the scope of the invention. As illustrated in FIG. 8, the amplitude detector 565 is symmetrical for coupling to and providing substantially equal loading of the differential nodes "A" and "B". The output from the amplitude detector 565 may be from either node "C" or node "C'" (C prime), and coupled to the inverting node of operational amplifier 360 or one of the two inputs of comparator 361, as illustrated in FIGS. 5 and 6. Not separately illustrated, in the event an output will be utilized from both nodes "C" and "C'", a differential to single-ended (D2S) converter may be utilized to then provide a single output. During operation, when its voltage level is comparatively high (e.g., having a large amplitude during a first, positive portion of the oscillation), the resonant frequency signal on differential node "A" will turn on transistor 505 (depending on its gate-to-source voltage, with its source voltage determined by the capacitor 515) and provide a current path to charge capacitor 515, and will also turn on transistor 510, providing a second current path through current source 520. When its voltage level is comparatively lower (e.g., having a small amplitude during a first, positive portion of the oscillation), and depending upon the voltage of the capacitor 515, the resonant frequency signal on differential node "A" may not have sufficient voltage to turn on transistor 505 (also depending on its gate-to-source voltage, with its source voltage determined by the capacitor 515), but may be sufficient to turn on transistor 510 and provide a discharge path for capacitor 515, also with current source 520 tending to pull the source of transistor 510 toward ground. When its voltage level is even lower (e.g., during a second, negative portion of the oscillation, depending on the common mode voltage level of the oscillation), the resonant frequency signal on differential node "A" may not have sufficient voltage to turn on transistor 505 or transistor 510, isolating the capacitor 515 and allowing the capacitor 515 to hold its charge.

Similarly during operation, when its voltage level is comparatively high (e.g., having a large amplitude), the resonant frequency signal on differential node "B" will turn on transistor 535 (depending on its gate-to-source voltage, with its source voltage determined by the capacitor 545) and provide a current path to charge capacitor 545, and will also turn on transistor 540, providing a second current path through current source 520. When its voltage level is comparatively lower (e.g., having a small amplitude), and depending upon the voltage of the capacitor 545, the resonant frequency signal on differential node "B" may not have sufficient voltage to turn on transistor 535 (also depending on its gate-to-source voltage, with its source voltage determined by the capacitor 545), but may be sufficient to turn on transistor 540 and provide a discharge path for capacitor 545, also with current source 520 tending to pull the source of transistor 540 toward ground. When its voltage level is even lower (e.g., during a second, negative portion of the oscillation, depending on the common mode voltage level of the oscillation), the resonant frequency signal on differential node "B" also may not have sufficient voltage to turn on transistor 535 or transistor 540, isolating the capacitor 545 and allowing the capacitor 545 to hold its charge.

Following start up, as the voltage on the capacitor 515, 545 will not yet have charged to its steady-state level, such that the voltage provided on nodes C or C' (C-prime) will be lower than a predetermined level (in comparison to VREF1), and the operational amplifier or comparator 361 will provide a corresponding signal to variable current source 355 to increase the current to the sustaining amplifier 305A, 305C and LC resonator 320A, 320C, which will serve to increase the magnitude of the amplitude of the oscillation. Over a plurality of cycles following start up, and subject to leakage currents and other sources of voltage dissipation, as the amplitude of the resonant frequency signal increases toward its predetermined magnitude, the capacitor 515, 545 will charge to a corresponding voltage level (i.e., charge through transistor 505, 535 more than it discharges through transistor 510, 540), converging to this voltage level at steady-state, as determined by its capacitance and by the relative on-times and sizes of transistors 505, 510 or 535, 540. The corresponding voltage level of the capacitor 515, 545 then provides a relative or indirect measure of the magnitude of the amplitude (i.e., a larger amplitude provides a longer on time of both of the transistors 505, 510 or 535, 540 and increases the voltage on capacitor 515, 545), and is correlated with the desired or predetermined peak magnitude of the amplitude of the resonant frequency signal. The desired or predetermined corresponding voltage level of the capacitor 515, 545 should be designed to be substantially equal (or scaled) to the first reference voltage ($VREF_1$) level, and predetermined to provide the desired magnitude of the amplitude of the resonant frequency signal. Any ripple in the voltage level of the capacitor 515, 545 may be filtered by a corresponding low pass filter 525, 530, with the resulting voltage level (representing the magnitude of the amplitude of the resonant frequency signal) provided to the inverting node of operational amplifier 360 or one of the inputs of comparator 361, for use in providing the amplitude control discussed above.

Figure 9:
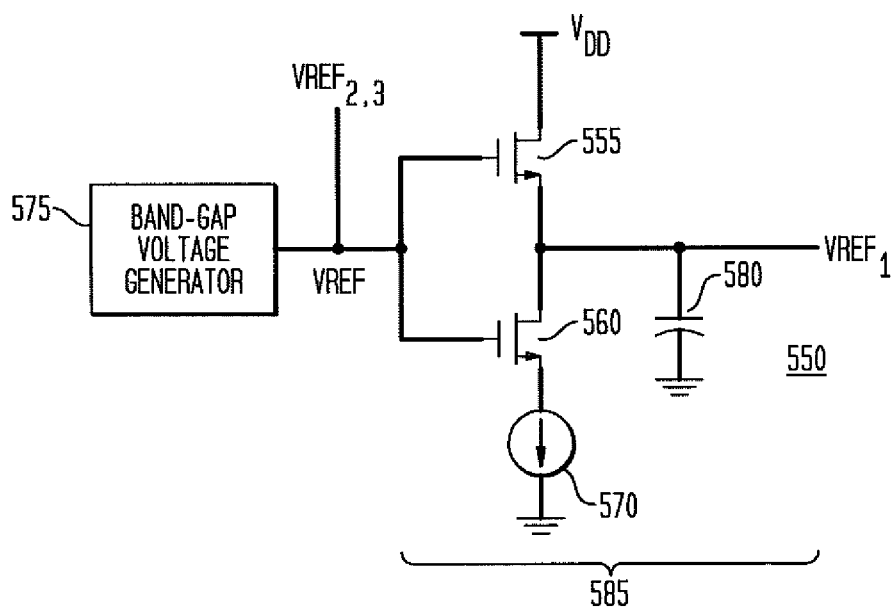
FIG. 9 is a circuit diagram illustrating an exemplary reference voltage generator and conditioning circuit embodiment in accordance with the teachings of the present invention.

FIG. 9 is a circuit diagram illustrating an exemplary reference voltage generator 550 and reference voltage conditioning circuit 585 embodiment in accordance with the teachings of the present invention. Depending upon the circuit structure of the amplitude controller 330, common mode controller 325, and control voltage generator 340, a reference voltage (provided by a voltage source such as a band-gap voltage generator 575) should be "conditioned" by a reference voltage conditioning circuit (such as exemplary reference voltage conditioning circuit 585), to provide consistency in the voltage levels used for comparisons, substantially eliminating differences which might otherwise arise due to changing parameters from fabrication process variations, temperature, aging, etc. For example, the exemplary reference voltage conditioning circuit 585 may be utilized to accommodate changes in transistor threshold voltages and gate-to-source voltages which may occur over time, due to temperature variations, as well as fabrication process variations, as mentioned above. Therefore, to provide a first reference voltage ($VREF_1$) level for use by the amplitude detector 565, a similar circuit structure (one-half of the symmetric amplitude detector 565, comprising transistors 555, 560, capacitor 580 and current source 570) is combined with the band-gap voltage generator 575. The reference voltage (VREF) provided by the band-gap voltage generator 575 is then modified using the same circuit configuration of the amplitude detector 565, providing a resulting first reference voltage ($VREF_1$) level that has the same or similar variation over time or fabrication process as amplitude detector 565, and thereby continues to provide an accurate correspondence to the voltage level provided by the amplitude detector 565.

Depending upon the circuit structure of the amplitude controller 330, common mode controller 325, and control voltage generator 340, a reference voltage (provided by a voltage source such as a band-gap voltage generator 575) may each be separately "conditioned" by a corresponding reference voltage conditioning circuit, i.e., reference voltage conditioning circuits which each correspond to a respective circuit implementation of the amplitude controller 330, common mode controller 325, and control voltage generator 340. For example, an exemplary common mode detector 670 illustrated below utilizes a passive circuit structure and is not subject to changes in transistor threshold voltages and gate-to-source voltages and, accordingly, the second reference voltage ($VREF_2$) level utilized for comparison in an exemplary embodiment does not need to be conditioned to track such changes. In addition, and not separately illustrated, any of the various reference voltage levels may be further level-shifted or divided, such as through suitable voltage dividers, to provide any selected or predetermined voltage level, as known or may become known in the electronic arts. Depending upon the implementation of the control voltage generator 340, the third reference voltage ($VREF_3$) level utilized may or may not be conditioned by a corresponding conditioning circuit.

Figure 10:
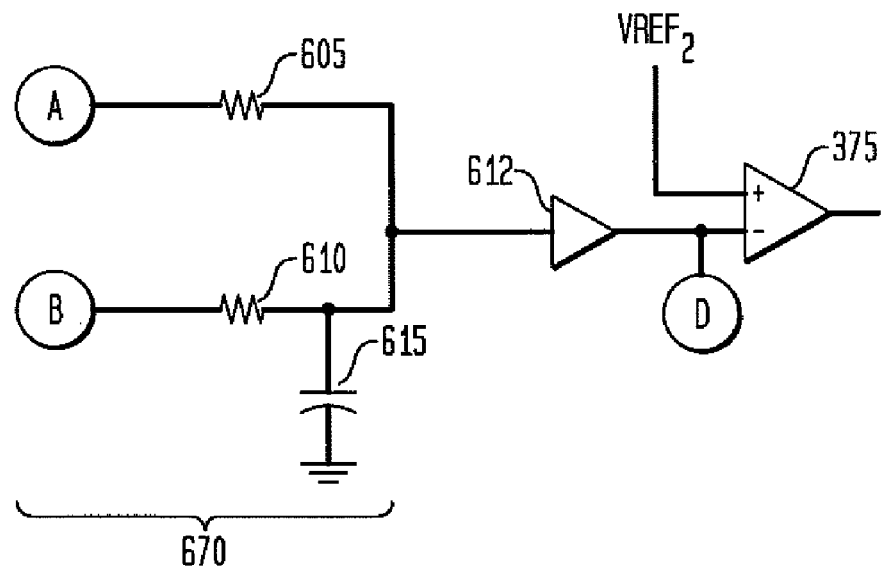
FIG. 10 is a circuit diagram illustrating an exemplary common mode detector embodiment in accordance with the teachings of the present invention.

FIG. 10 is a circuit diagram illustrating an exemplary common mode detector 670 embodiment in accordance with the teachings of the present invention. As mentioned above, a common mode detector 370 may be implemented in innumerable ways; accordingly, the illustrated common mode detector 670 is merely exemplary, and should not be regarded as limiting the scope of the invention. As illustrated in FIG. 10, the common mode detector 670 essentially functions as a low pass filter and is symmetrical for coupling to and providing substantially equal loading of the differential nodes "A" and "B". The output from the common mode detector 670 is at node "D" and is coupled to the inverting node of operational amplifier 375 or to one of the inputs of comparator 376, as illustrated in FIGS. 5 and 6. An optional buffer 612 may also be utilized to provide the output at node "D", as illustrated. The resistors 605, 610 of the common mode detector 670 are sized to have a comparatively large resistance, e.g., 20 k Ohms, to decrease or minimize loading on the LC-tank 320, and a capacitor 615 has a comparatively small capacitance to provide low pass filtering. During operation, the resonant frequency signal on differential node "A" will provide a voltage across resistor 605 and charge capacitor 615, and the resonant frequency signal on differential node "B" will provide a voltage across resistor 610 and also charge capacitor 615. With the rejection of high frequency components provided by the filter capacitor 615, the signals on each differential nodes "A" and "B" combine or are summed, providing a DC voltage level at node "D" corresponding to the common mode voltage level. The resulting voltage level (representing the common mode voltage level of the resonant frequency signal) is provided to the inverting node of operational amplifier 375 or to one of the inputs of comparator 376, for use in providing the common mode voltage level control discussed above. Also as mentioned above, for this type of implementation, the second reference voltage ($VREF_2$) level is not conditioned in exemplary embodiments.

Figure 22:
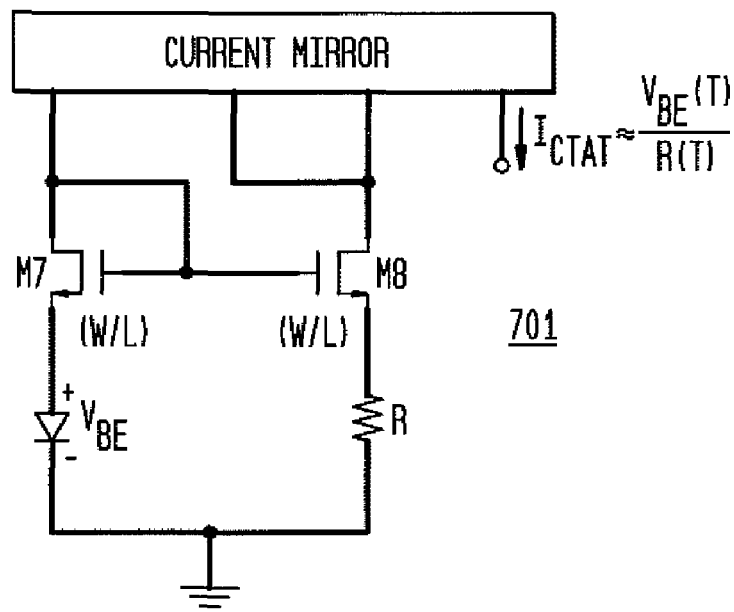
FIG. 22 is a circuit diagram illustrating an exemplary temperature-responsive CTAT current generator in accordance with the teachings of the present invention.
Figure 23:
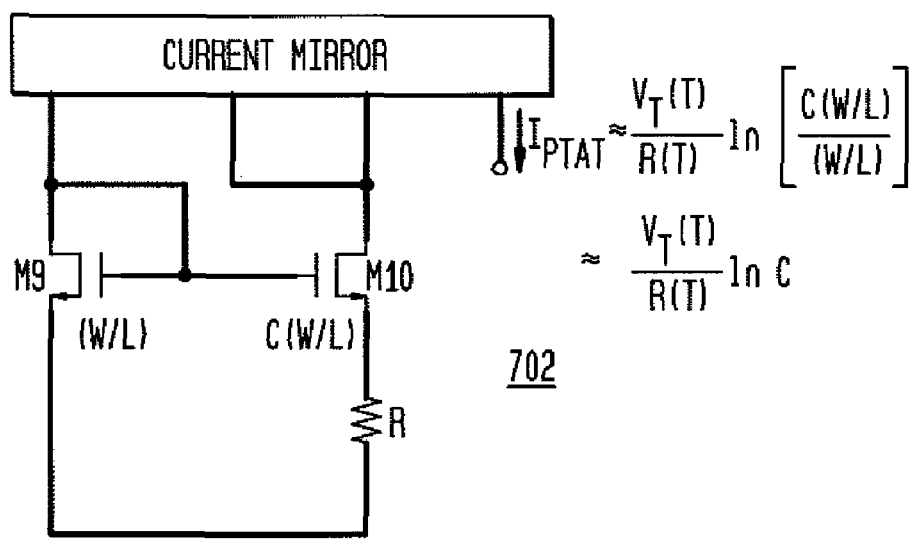
FIG. 23 is a circuit diagram illustrating an exemplary temperature-responsive PTAT current generator in accordance with the teachings of the present invention.
Figure 24:
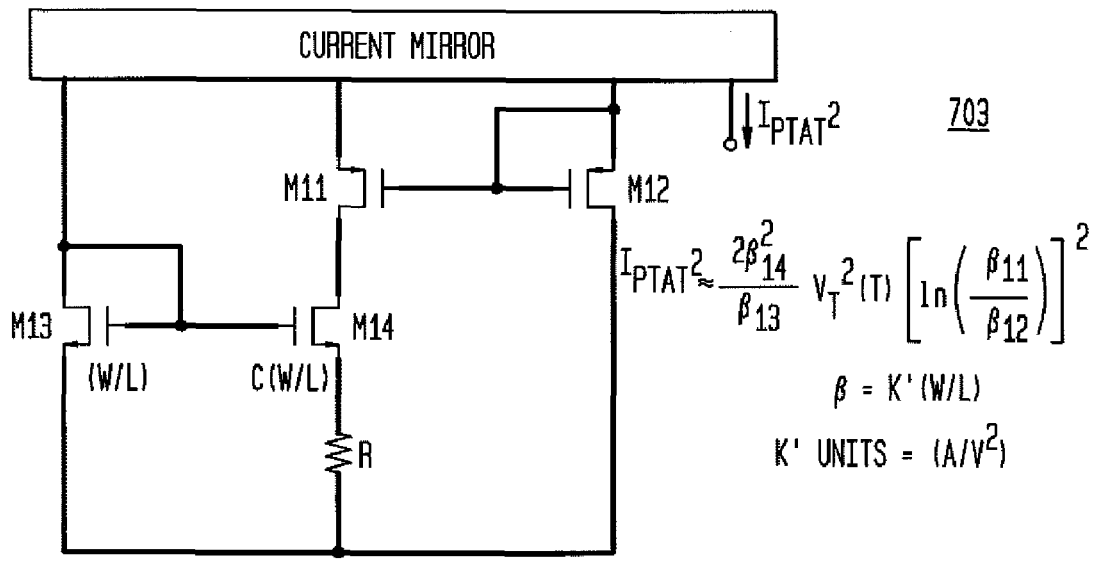
FIG. 24 is a circuit diagram illustrating an exemplary temperature-responsive $PTAT^2$ current generator in accordance with the teachings of the present invention.
Figure 25:
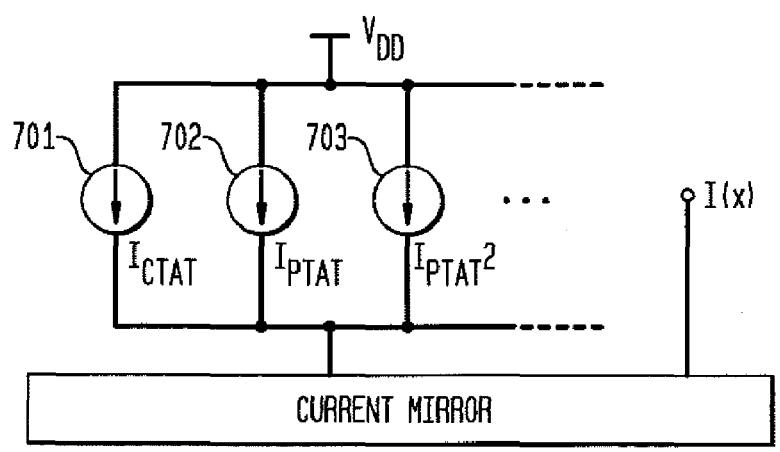
FIG. 25 is a circuit diagram illustrating an exemplary selectable and scalable temperature-responsive current generator, with selected CTAT, PTAT, and $PTAT^2$ configurations, in accordance with the teachings of the present invention.

FIG. 11 is a circuit diagram illustrating exemplary fixed and variable current source embodiments in accordance with the teachings of the present invention. As mentioned above, the current sources 355 and 380 may be comprised of a combination of one or more fixed current sources 620 and variable current sources 625, to provide both the desired level of current into and the desired control of the current into the sustaining amplifier 305A, 305C and LC resonator 320A, 320C. In addition, the various current sources may be selected to provide comparatively stable current levels over temperature and other parameter variations, such as by utilizing topologies such as a CTAT (complementary to absolute temperature) current source 701, a PTAT (proportional to absolute temperature) current source 702, or a $PTAT^2$ (proportional to absolute temperature squared) current source 703, as illustrated in FIGS. 22, 23 and 24, respectively, and combinations of CTAT, PTAT, and $PTAT^2$, as illustrated in FIG. 25. In each case, the resulting current injected into the sustaining amplifier 305A, 305C and LC resonator 320A, 320C may have a temperature dependence, such as increasing current (PTAT and $PTAT^2$) or decreasing current (CTAT) as a function of increasing temperature, as illustrated. One or more combinations of these temperature-responsive current generators may also be implemented, as illustrated in FIG. 25, such as CTAT in parallel with PTAT, for example, and also may be respectively scaled through appropriate transistor sizing of current mirrors, also for example. Such combinations may be selected such that the overall, combined current produced (I(x)) does not have a temperature dependence, with any selected current level then being substantially constant over temperature variations. This is particularly useful for providing fixed current sources 620, with any current variation provided through variable current sources controlled by the common mode controller 325 and the amplitude controller 330 using the two feedback mechanisms discussed above.

The selection of a particular temperature-responsive or temperature-dependent current generator is also a function of the fabrication process utilized; for example, CTAT may be utilized for a Taiwan Semiconductor (TSMC) fabrication process. More generally, as different fabricators utilize different materials, such as aluminum or copper, $R_L$ typically varies, resulting in different temperature coefficients which, in turn, change the temperature coefficient of the oscillator, thereby requiring differences in I(T) compensation. Correspondingly, different ratios of CTAT, PTAT, and $PTAT^2$ compensation may be required to provide an effectively flat frequency response as a function of temperature. For example, the band-gap voltage generator 575 may be configured to utilize different ratios of CTAT, PTAT, and $PTAT^2$ compensation to provide an effectively flat reference voltage as a function of temperature. Not separately illustrated, the various temperature-responsive current generators illustrated in FIGS. 22-25 may include a start-up circuit. In addition, the transistors comprising the selected temperature-responsive current generator configuration may be biased differently, such as biased in strong inversion for CTAT (M7 and M8) and $PTAT^2$ (M13 and M14), and in subthreshold for PTAT (M9 and M10) and $PTAT^2$ (M11 and M12), for the exemplary topologies illustrated.

Figure 12:
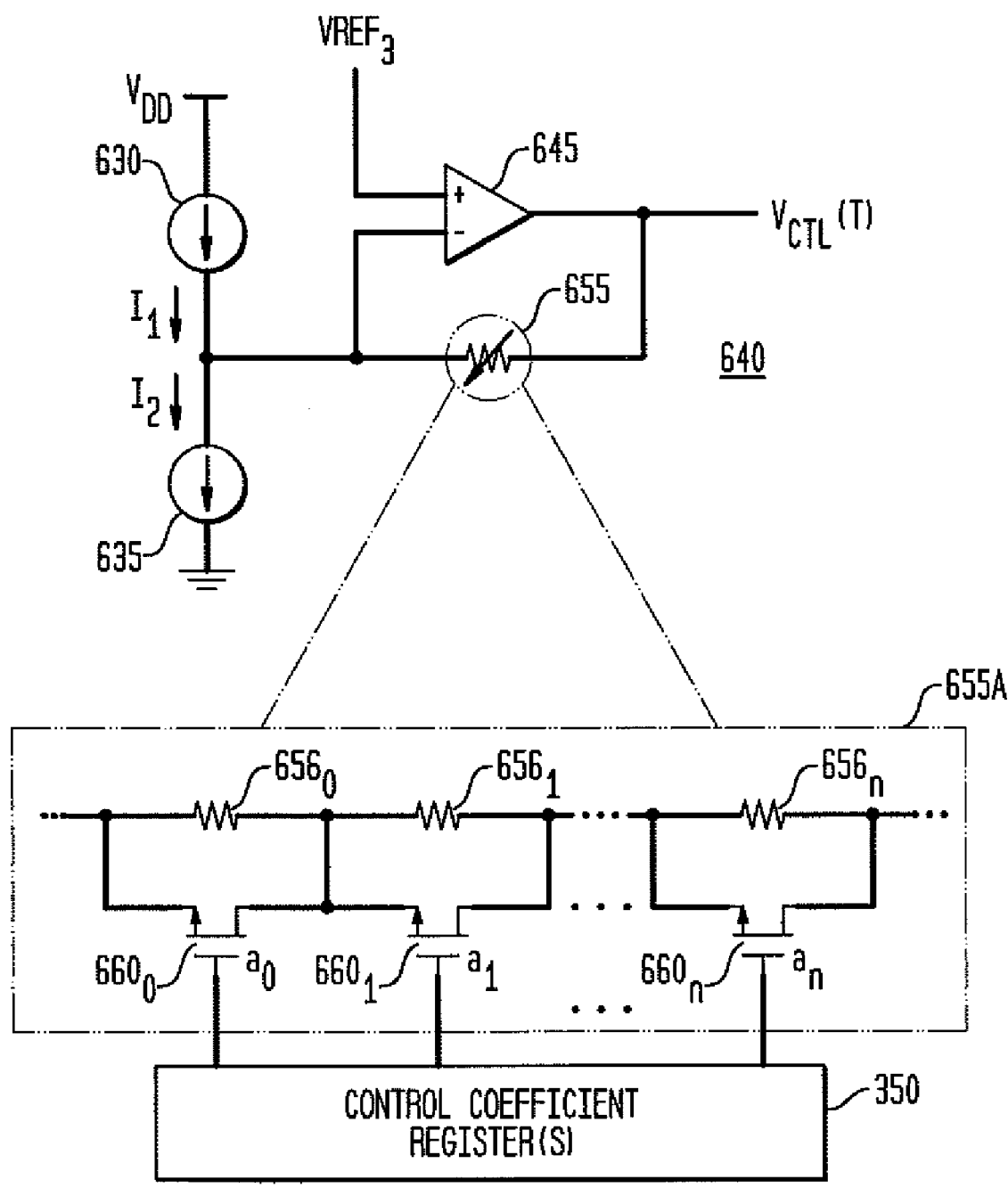
FIG. 12 is a circuit and block diagram illustrating an exemplary first control voltage generator embodiment and an exemplary first variable resistor embodiment in accordance with the teachings of the present invention.

FIG. 12 is a circuit and block diagram illustrating an exemplary first control voltage generator 640 embodiment in accordance with the teachings of the present invention. In the exemplary embodiments, the resulting control voltage provided exhibits a temperature-dependence, $V_{CTL}(T)$, which may then be utilized to maintain the resonant frequency (A) substantially stable despite such temperature variations. For example, resulting changes in the control voltage $V_{CTL}(T)$ have the further effect of modifying the effective capacitance presented to the LC-tank (resonator) 320 by the variable capacitances 322 or other variable reactances or impedances, thereby substantially "canceling" the temperature response of the LC-tank (resonator) 320 which would otherwise occur, and maintaining the resonant frequency ($f_0$) substantially constant. In exemplary embodiments of the control voltage generator 640, the first current source 630 and second current source 635 are typically selected to have opposing responses to temperature variation. For example, first current source 630 may be a CTAT current source 701, while second current source 635 may be a PTAT or $PTAT^2$ current source 702, 703. In addition, as indicated above, various combinations of CTAT, PTAT, and $PTAT^2$ current sources may be utilized to provide any desired temperature response. In other exemplary embodiments, such as those illustrated and discussed with reference to FIGS. 37-42, such a temperature-dependent control voltage $V_{CTL}(T)$ is not utilized, with temperature compensation provided through reactance-resistance modules 337 and resistance modules 338 to provide offsetting or cancelling temperature responses, thereby providing a substantially stable resonant frequency $f_0$ over variations in operating temperature.

A third reference voltage ($VREF_3$) level is provided to the non-inverting node of the operational amplifier 645, and may be a conditioned reference voltage, or may be provided directly by the band-gap voltage reference 575 with any desired voltage level shifting or scaling. The inverting node of the operational amplifier 645 is coupled to the first and second current sources 630, 635 and to a variable resistance 655. The variable resistance 655 may be configured in innumerable ways, with an exemplary first variable resistance 655A circuit configuration illustrated as comprising a bank of resistors $656_0$, $656_1$ through $656_n$, which are switched in or out of the circuit (and thereby vary the overall resistance provided by variable resistor 655A) by corresponding transistors ($660_0$, $660_1$ through $660_n$) under the control of a plurality of control coefficients $a_0$, $a_1$, through $a_n$, which may be calibrated or otherwise predetermined in advance of system 150, 900, 950 operation, and stored in coefficient register(s) 350. The comparative resistances of resistors $656_0$, $656_1$ through $656_n$ may be weighted in any of a plurality of ways, such as binary weighting or unit weighting. Other circuit configurations may also be utilized to provide a variable resistance 655, such as the "R2R" configuration illustrated in FIG. 20 and discussed below, and any and all such configurations are considered equivalent and within the scope of the invention.

In exemplary embodiments, to provide a consistent response over parameter variations, such as variations due to aging, temperature, and fabrication process, the resistors $656_0$, $656_1$ through $656_n$ may all be implemented using the same type of resistor, such as diffusion resistors, or chemical vapor deposition resistors, or polysilicon resistors, for example. This concept of utilizing the same type of resistors may also be extended to other circuits within reference signal generator 100, 200, 200A, 300, 300A, 400, 400A, 500, 500A, 600, 600A, such as the common mode detector 670 and the various current sources (e.g., CTAT, PTAT, and $PTAT^2$), for example. In an exemplary embodiment, the same type of resistor has been utilized throughout the system 150, 900, 950. The resistors may be any type, such as diffusion resistors (p or n), polysilicon, metal resistors, salicide or unsalicide polysilicon resistors, or well resistors (p or n well), for example. In other embodiments, combinations of different types of resistors may also be utilized, with all such variations considered equivalent and within the scope of the invention. Other types of resistors may also be utilized, such as in resistance modules 338 and/or reactance-resistance modules 337, to provide offsetting temperature dependencies, for example.

Figure 13A:
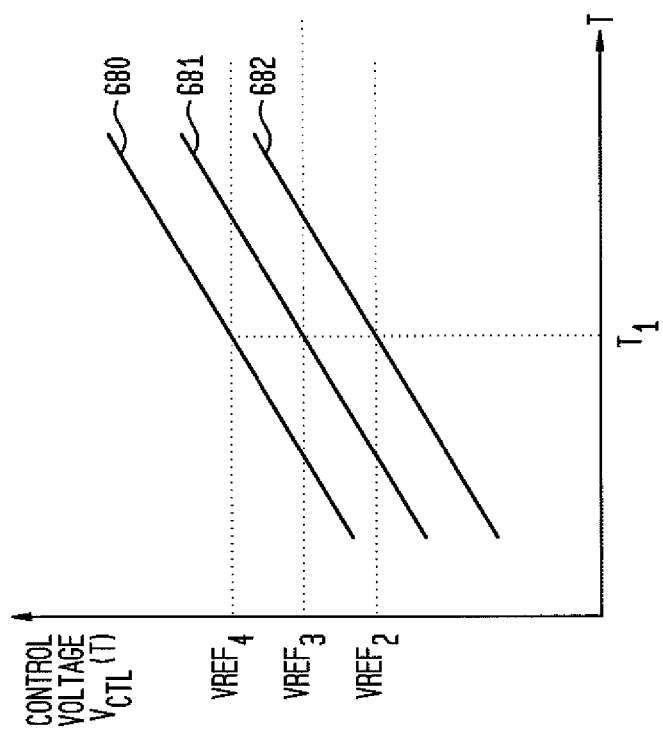
FIGS. 13A and 13B, are graphical diagrams illustrating control voltage as a function of temperature as utilized in accordance with the teachings of the present invention.
Figure 13B:
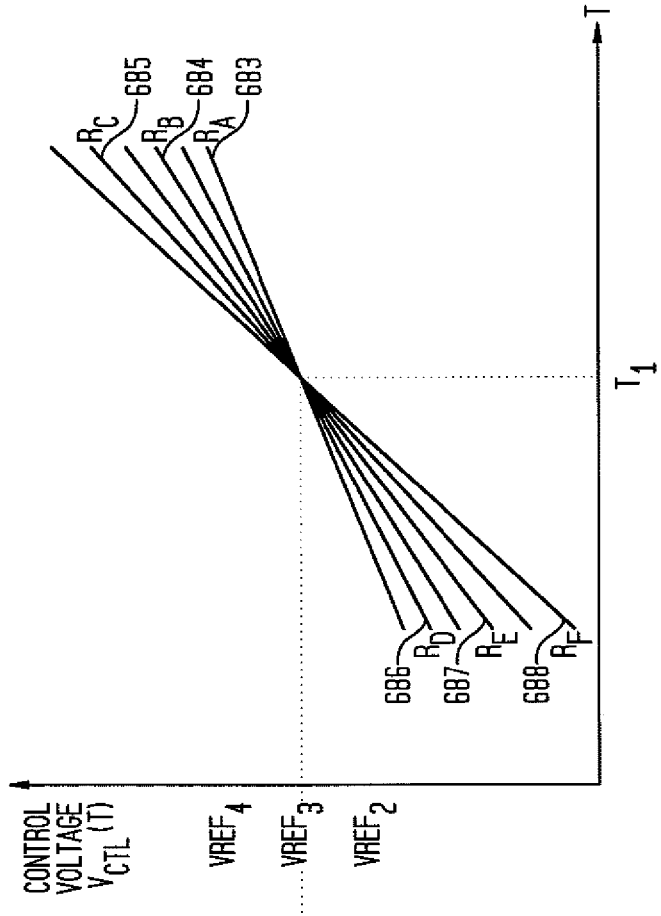

Appropriate selection of the first current source 630 (e.g., CTAT or selected combinations of CTAT, PTAT, and/or $PTAT^2$) and the second current source 635 (e.g., PTAT, $PTAT^2$, or selected combinations of CTAT, PTAT, and/or $PTAT^2$) can be utilized to provide a resulting control voltage which has a substantially linear response with temperature, and which does not vary substantially due to aging or fabrication process. FIGS. 13A and 13B, are graphical diagrams illustrating control voltage as a function of temperature as utilized in accordance with the teachings of the present invention. At a temperature (illustrated as $T_1$) where the first current $I_1$ (from first current source 630) is substantially equal to the second current $I_2$ (from the second current source 635), the resulting control voltage $V_{CTL}(T)$ linear response may be selected (lines 680, 681, or 682) by appropriate selection of a reference voltage (at the non-inverting input of operational amplifier 645), such as a fourth reference voltage ($VREF_4$) level, the third reference voltage ($VREF_3$) level, or the second reference voltage ($VREF_2$) level, as illustrated in FIG. 13A. In this case, using the third reference voltage ($VREF_3$), the resulting control voltage $V_{CTL}(T)$ is substantially equal to the third reference voltage ($VREF_3$) level at temperature $T_1$. The slope of such a substantially linear response (i.e., the rate of change of the control voltage with a change in temperature) is then adjustable by selection of a resistance value of the variable resistor 655, i.e., variable resistor 655 is utilized to adjust the gain, such that a change in the resistance value of resistor 655 modifies the slope of the control voltage response with temperature (lines 683, 684, 685, 686, 687, or 688, corresponding to resistance values $R_A$, $R_B$, $R_C$, $R_D$, $R_E$, and $R_F$), as illustrated in FIG. 13B. These selections of the third reference voltage (VREF$_3$) level and the resistance value of variable resistor 655 may be and typically are made during a calibration procedure for the embodiments utilizing such a temperature-dependent control voltage $V_{CTL}(T)$.

The resulting control voltage $V_{CTL}(T)$ is then substantially equal to the third reference voltage (VREF$_3$) level plus or minus the voltage across the variable resistor 655. For example, when the first current source 630 is CTAT and the second current source 635 is PTAT, and when temperature increases, the first current $I_1$ decreases and the second current $I_2$ increases. As the operational amplifier 645 may source or sink current, the resulting control voltage will increase with the increase in temperature, by an amount substantially equal to the voltage generated across the resistance 655. A larger or smaller resistance value will then generate a larger or smaller voltage difference for the same difference in first and second currents (thereby changing the slope of the control voltage response with temperature). During calibration, appropriate coefficients may be selected such that the resulting control voltage $V_{CTL}(T)$, by controlling the effective reactance presented to the LC-tank (resonator) 320, may effectively cancel the temperature response of the LC-tank (resonator) 320 which would otherwise occur, resulting in maintaining the resonant frequency (A) substantially stable despite such temperature variations.

Figure 14:
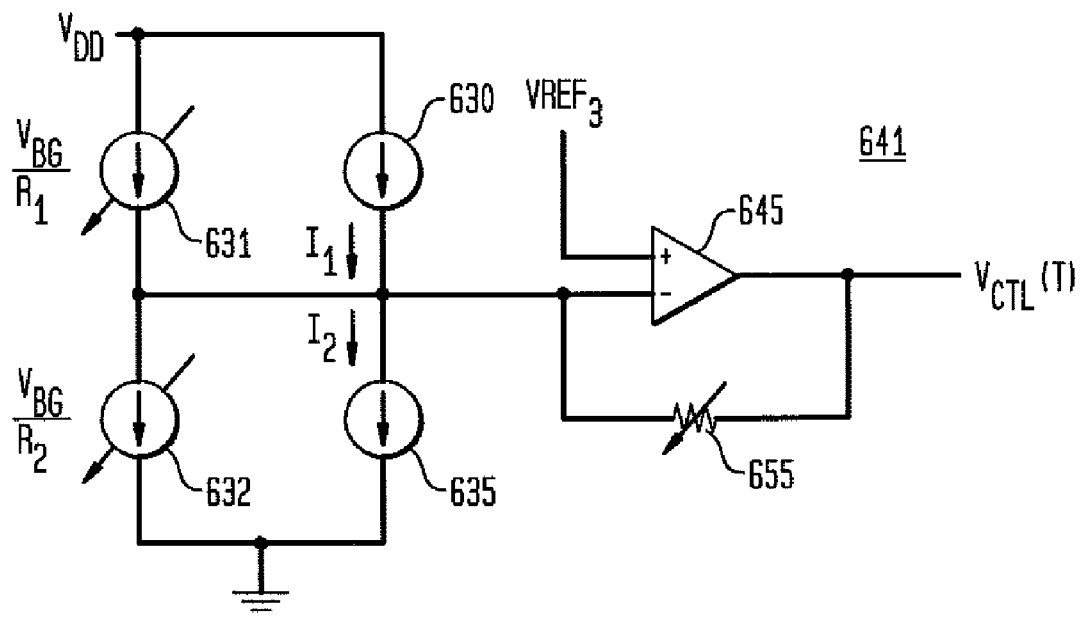
FIG. 14 is a circuit and block diagram illustrating an exemplary second control voltage generator embodiment in accordance with the teachings of the present invention.

FIG. 14 is a circuit and block diagram illustrating an exemplary second control voltage generator 641 embodiment in accordance with the teachings of the present invention. In the second control voltage generator 641, two variable current sources 631, 632 (illustrated as provided by a band-gap voltage divided by a corresponding resistance $R_1$ or $R_2$) are utilized to provide offset currents to adjust the DC value of the resulting control voltage $V_{CTL}(T)$, and otherwise functions as previously discussed for the first control voltage generator 640. The resulting control voltage $V_{CTL}(T)$ also is then substantially equal to the voltage of the non-inverting node of operational amplifier 645 (which is substantially equal to the third reference voltage (VREF$_3$) level) plus or minus the voltage across the variable resistor 655, which has the added contribution from the two variable current sources 631, 632. This second control voltage generator 641 embodiment is particularly useful when the various reference voltages having different voltage levels, such as VREF$_3$, may not be available, and only one reference voltage (e.g., directly from a band-gap voltage generator 575) is available. The various temperature dependencies of resistance $R_1$ and $R_2$ also may be utilized to offset any temperature dependence of variable resistance 655.

Figure 15:
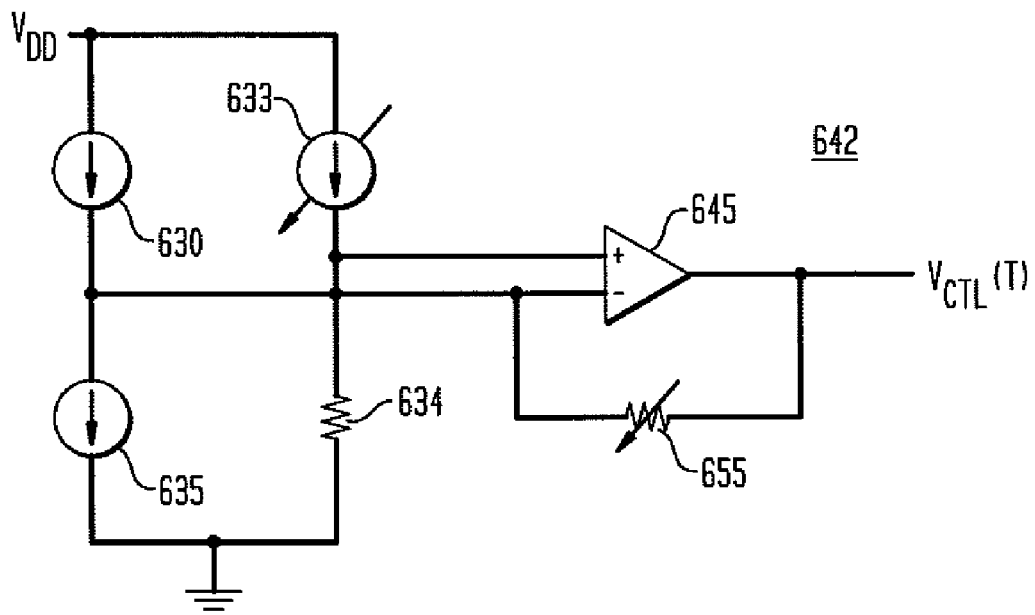
FIG. 15 is a circuit and block diagram illustrating an exemplary third control voltage generator embodiment in accordance with the teachings of the present invention.

FIG. 15 is a circuit and block diagram illustrating an exemplary third control voltage generator 642 embodiment in accordance with the teachings of the present invention. In the third control voltage generator 642, a variable current source 633 is digitally controlled, such as by using control coefficients, and is utilized to provide an adjustable reference voltage (across resistor 634) for input into operational amplifier 645, which correspondingly adjusts the DC level of the resulting control voltage $V_{CTL}(T)$, and otherwise functions as previously discussed for the first control voltage generator 640. The resulting control voltage $V_{CTL}(T)$ is then substantially equal to the voltage of the inverting node of operational amplifier 645 (which is substantially equal to the voltage level of the non-inverting node of operational amplifier 645) plus or minus the voltage across the variable resistor 655. The temperature dependency of resistor 634 also may be utilized to offset any temperature dependence of variable resistance 655.

Figure 16:
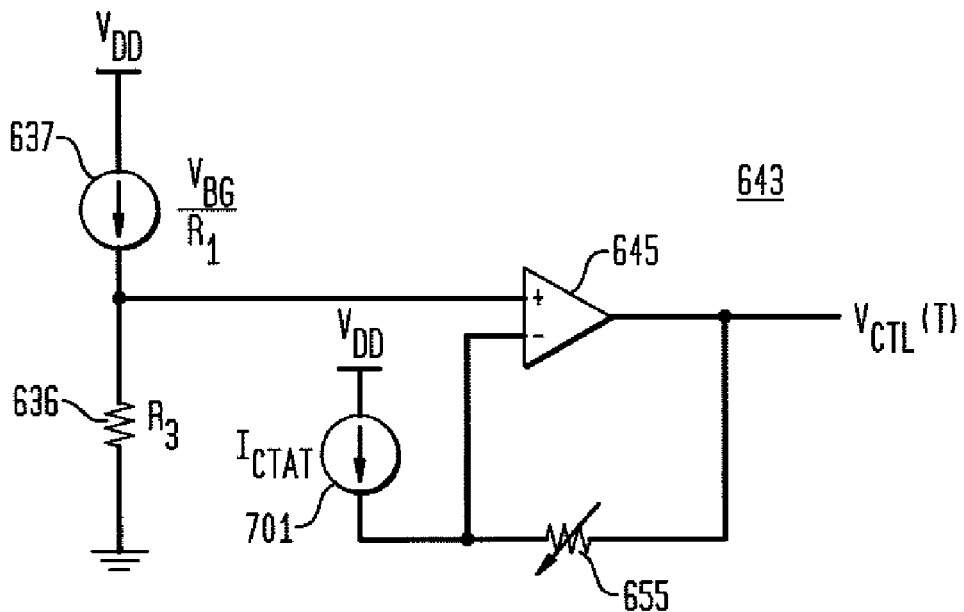
FIG. 16 is a circuit and block diagram illustrating an exemplary fourth control voltage generator embodiment in accordance with the teachings of the present invention.

FIG. 16 is a circuit and block diagram illustrating an exemplary fourth control voltage generator 643 embodiment in accordance with the teachings of the present invention. In the fourth control voltage generator 643, a fixed or variable current source 637 (illustrated as a provided by a band-gap voltage ($V_{BG}$) divided by a resistance $R_1$) through a resistance 636 ($R_3$) is utilized to provide a reference voltage input into the non-inverting node of operational amplifier 645. A CTAT current source 701 is utilized to provide the temperature dependence of the resulting control voltage $V_{CTL}(T)$. In comparison to the first control voltage generator 640 (when it is configured with the first current source 630 being a CTAT current source and the second current source 635 being a PTAT or PTAT$^2$ current source having an opposing temperature dependence), for a given resistance of variable resistor 655, the fourth control voltage generator 643 provides for a larger change in the resulting control voltage $V_{CTL}(T)$ for the same variation in temperature, and otherwise functions similarly to the first control voltage generator 640 as previously discussed. The resulting control voltage $V_{CTL}(T)$ is then substantially equal to the voltage of the inverting node of operational amplifier 645 (which is substantially equal to the voltage level of the non-inverting node of operational amplifier 645) minus the voltage across the variable resistor 655, and reaches a maximum when the CTAT current is zero.

Figure 17:
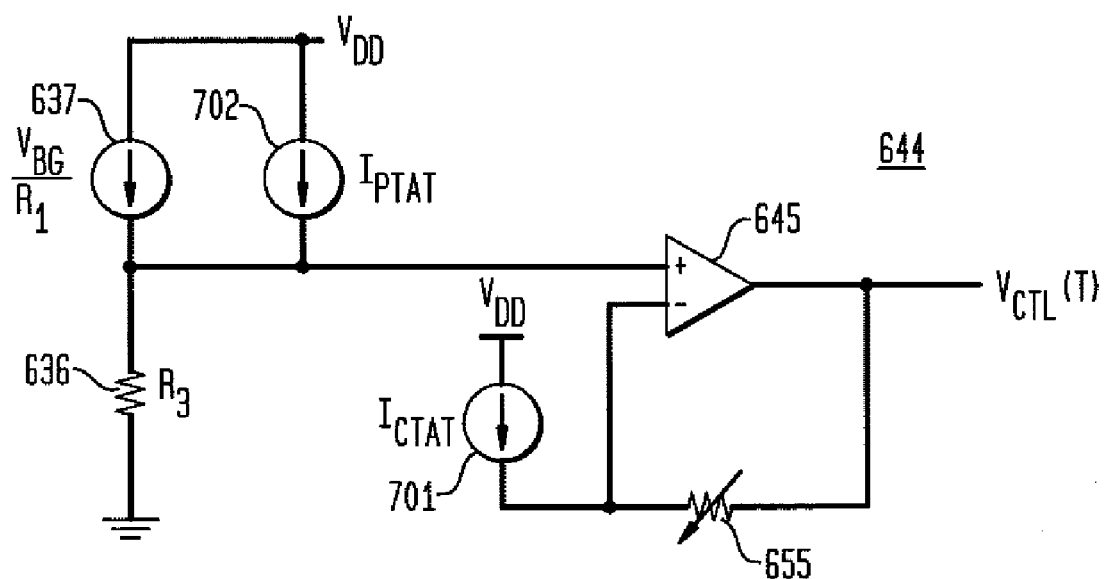
FIG. 17 is a circuit and block diagram illustrating an exemplary fifth control voltage generator embodiment in accordance with the teachings of the present invention.

FIG. 17 is a circuit and block diagram illustrating an exemplary fifth control voltage generator 644 embodiment in accordance with the teachings of the present invention. In the fifth control voltage generator 644, a fixed or variable current source 637 (also illustrated as a provided by a band-gap voltage ($V_{BG}$) divided by a resistance $R_1$) through a resistance 636 ($R_3$), and a PTAT current source 702 (which could also be a PTAT$^2$ current source), are utilized to provide a reference voltage input into the non-inverting node of operational amplifier 645. Both the PTAT current source 702 and a CTAT current source 701 are utilized to provide the temperature dependence of the resulting control voltage $V_{CTL}(T)$. In comparison to the first control voltage generator 640 (when it is configured with the first current source 630 being a CTAT current source and the second current source 635 being a PTAT or PTAT$^2$ current source having an opposing temperature dependence), and in comparison to the fourth control voltage generator 643, for a given resistance of variable resistor 655, the fifth control voltage generator 644 provides for a larger change in the resulting control voltage $V_{CTL}(T)$ for the same variation in temperature, and otherwise functions similarly to the first control voltage generator 640 and fourth control voltage generator 643 as previously discussed. The resulting control voltage $V_{CTL}(T)$ also is then substantially equal to the voltage of the inverting node of operational amplifier 645 (which is substantially equal to the voltage level of the non-inverting node of operational amplifier 645) minus the voltage across the variable resistor 655.

Figure 18:
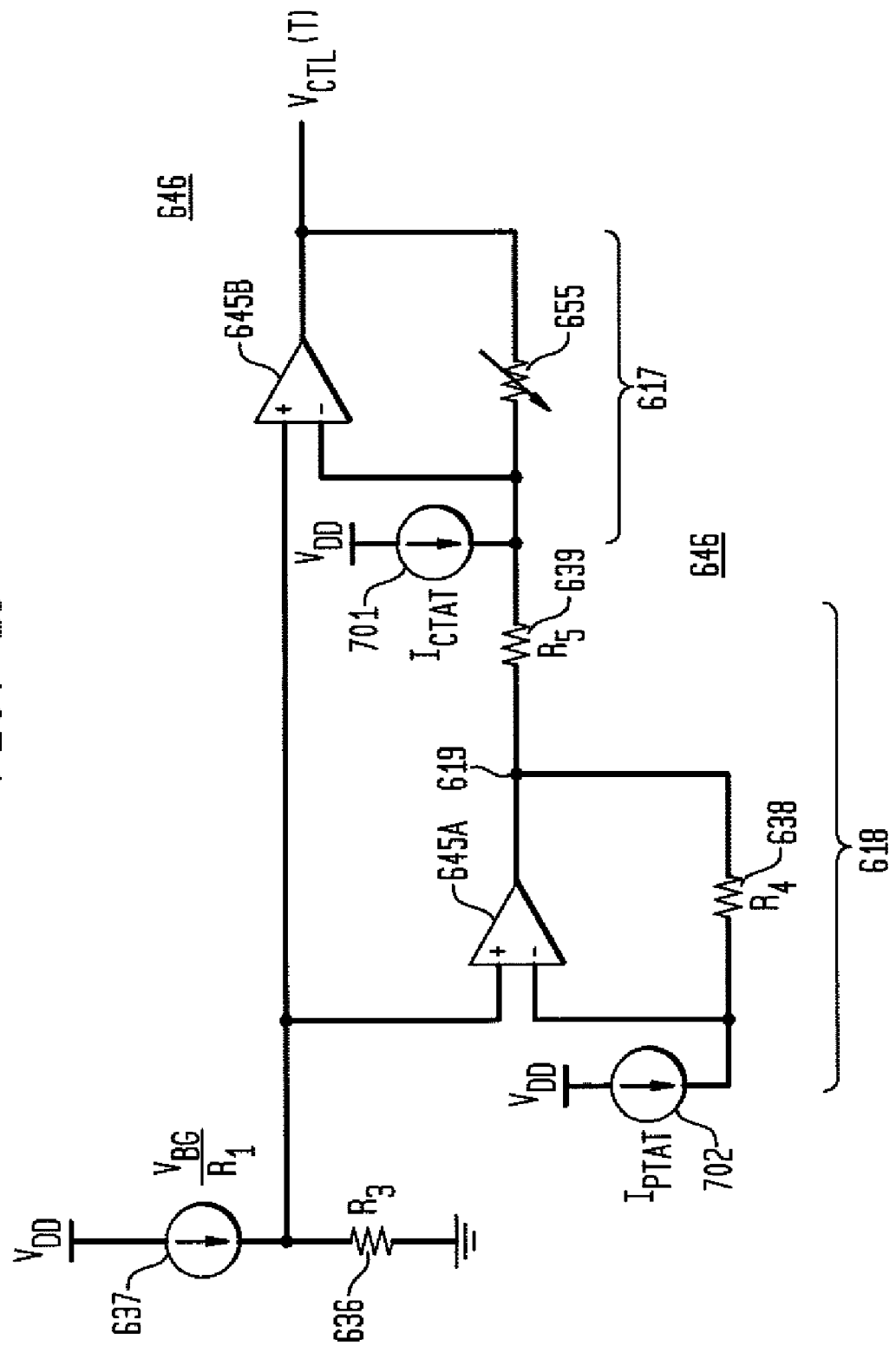
FIG. 18 is a circuit and block diagram illustrating an exemplary sixth control voltage generator embodiment in accordance with the teachings of the present invention.

FIG. 18 is a circuit and block diagram illustrating an exemplary sixth control voltage generator 646 embodiment in accordance with the teachings of the present invention. In this embodiment, the sixth control voltage generator 646 utilizes two stages 618 and 617, with two operational amplifiers, 645A and 645B. In the sixth control voltage generator 646, a fixed or variable current source 637 (illustrated as a provided by a band-gap voltage ($V_{BG}$) divided by a resistance $R_1$) through a resistance 636 ($R_3$) is utilized to provide a reference voltage input into the respective non-inverting nodes of operational amplifiers 645A and 645B. Second stage 617 operates similarly to the fourth control voltage generator 643 as previously discussed. With regard to the first stage 618, as temperature increases, the current provided by the PTAT current source 702 (which could also be a $PTAT^2$ current source) also increases, resulting in a voltage at node 619 substantially equal to the voltage of the inverting node of operational amplifier 645A (which is substantially equal to the voltage level of the non-inverting node of operational amplifier 645A) minus the voltage across the resistor 638 ($R_4$). Due to the voltage at the inverting node of operational amplifier 645B also be greater than the voltage at node 619, there is a net current into the output of operational amplifier 645A, which acts as a current sink, helping to eliminate the use of NMOS current sinks and reduce flicker noise. The resulting control voltage $V_{CTL}(T)$ also is then substantially equal to the voltage of the inverting node of operational amplifier 645B (which is substantially equal to the voltage level of the non-inverting node of operational amplifier 645B) minus the voltage across the variable resistor 655.

Figure 19:
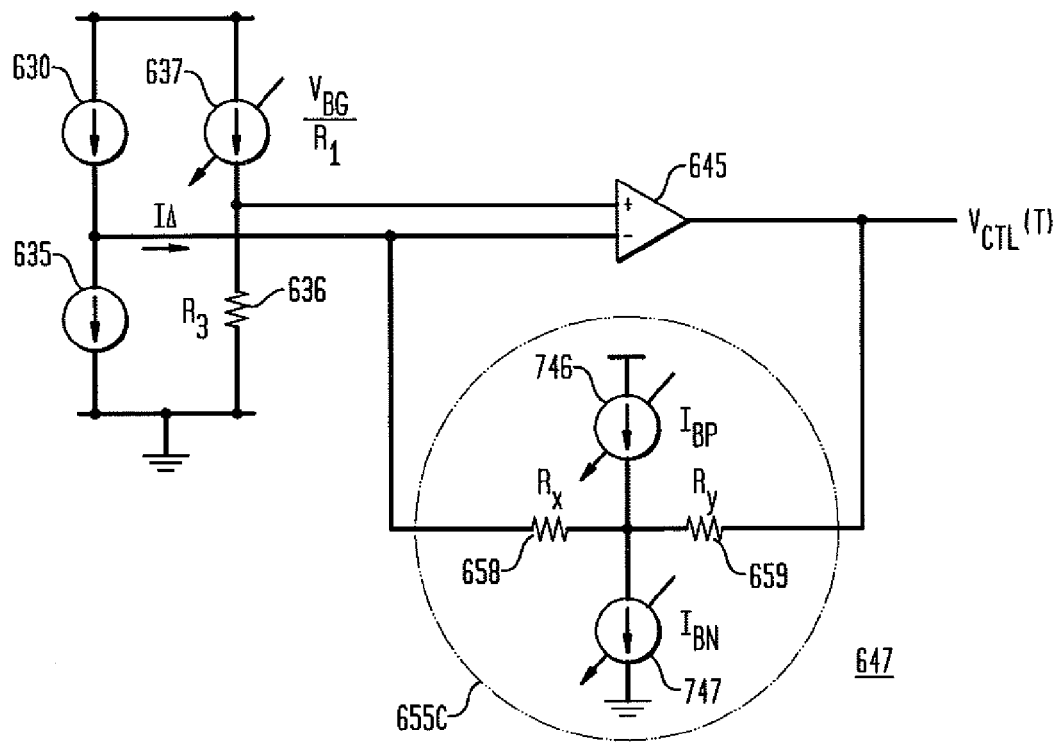
FIG. 19 is a circuit and block diagram illustrating an exemplary seventh control voltage generator embodiment in accordance with the teachings of the present invention.

FIG. 19 is a circuit and block diagram illustrating an exemplary seventh control voltage generator 647 embodiment in accordance with the teachings of the present invention. The seventh control voltage generator 647 functions similarly to the third control voltage generator 642 discussed above, but with an equivalent variable resistance 655C provided using two variable current sources 746 ($I_{BP}$) and 747 ($I_{BN}$) and two (fixed) resistors 658 and 659. The variable current sources 746 ($I_{BP}$) and 747 ($I_{BN}$) may each be comprised of one or more current unit cells 750, discussed below with reference to FIG. 21, with the amount of current provided being digitally controlled through the various control coefficients. The resistors 658 and 659 may be utilized to effectively cancel the temperature dependence (or temperature coefficient) of resistor 636 (utilized in generating the reference voltage input into the non-inverting node of operational amplifier 645). In addition, the variable resistance 655C (comprising two variable current sources 746 ($I_{BP}$) and 747 ($I_{BN}$) and two (fixed) resistors 658 and 659) also can be utilized to provide a constant offset from the voltage at the inverting node of operational amplifier 645 (which substantially equals the voltage at the non-inverting node of operational amplifier 645). When the first and second current sources 630, 635 provide temperature-dependent currents, e.g., when the first current source 630 is CTAT and the second current source 635 is PTAT, the resulting control voltage also is temperature-dependent. The resulting control voltage $V_{CTL}(T)$ is then substantially equal to the voltage of the inverting node of operational amplifier 645 (which is substantially equal to the voltage level of the non-inverting node of operational amplifier 645) plus or minus the voltage across resistors 658 ($R_X$) and 659 ($R_Y$).

Figure 20:
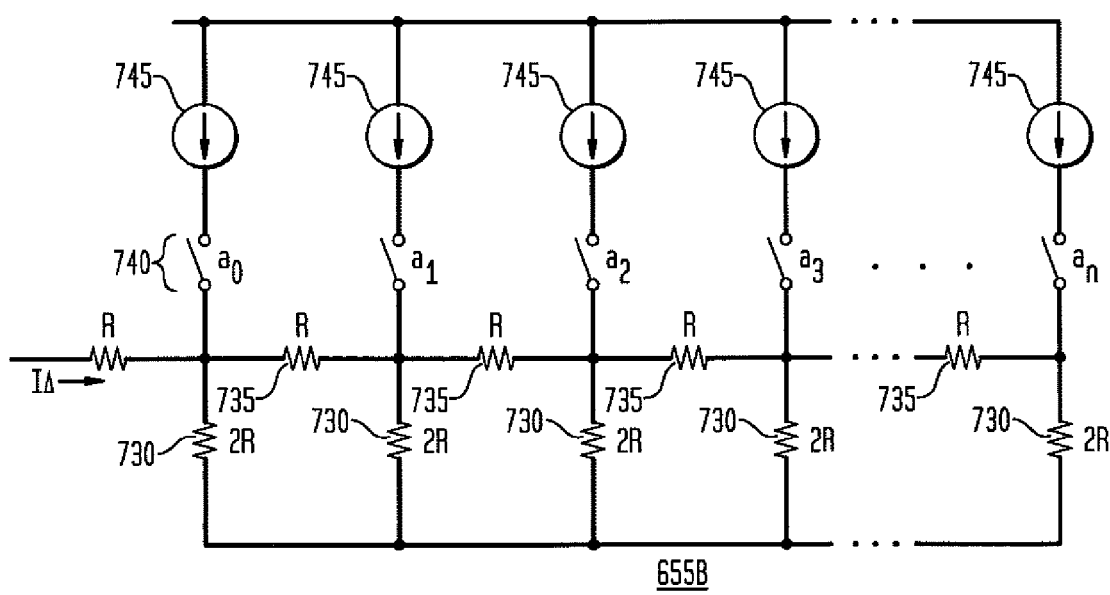
FIG. 20 is a circuit diagram illustrating an exemplary second variable resistor embodiment in accordance with the teachings of the present invention.

FIG. 20 is a circuit diagram illustrating an exemplary second variable resistor 655B embodiment in accordance with the teachings of the present invention. The second variable resistor 655B is implemented utilizing a "R-2R DAC" circuit configuration. Switches 740 are utilized to control the overall resistance value provided by second variable resistor 655B by switching in or out the various resistor modules under the control of control coefficients ($a_0$, $a_1$, through $a_n$), such as using a "temperature" coding of the control coefficients, providing corresponding unit increments of resistance. Resistors 730 generally have twice the resistance value (2R) of resistors 735 (R). In addition, in an exemplary embodiment, current sources 745 are provided by current mirrors, and provide a current of four-times the illustrated IΔ current. For example, the IΔ current is typically the difference between the currents provided by first and second current sources 630, 635, such as when the first current source 630 is CTAT and the second current source 635 is PTAT.

Figure 21:
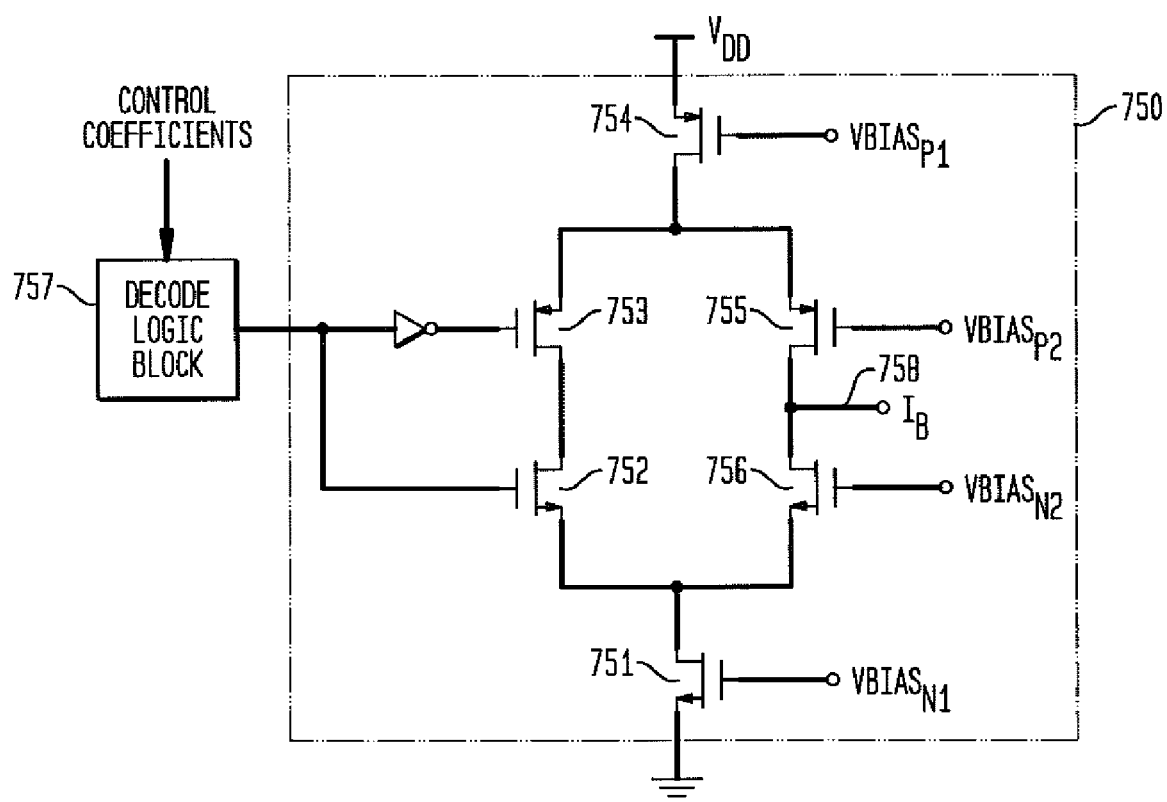
FIG. 21 is a circuit and block diagram illustrating an exemplary current source unit cell embodiment in accordance with the teachings of the present invention.

FIG. 21 is a circuit and block diagram illustrating an exemplary current source unit cell 750 embodiment in accordance with the teachings of the present invention. As mentioned above, an array (not separately illustrated) formed by coupling together the outputs 758 of a plurality of such current source unit cells 750 may be utilized to form a variable current source, with the number of such cells 750 selected using control coefficients (via decoding logic (block 747) and transistors 752, 753), and with transistors 752, 753 switched on or off to control whether current is being provided to the output 758. Each such current source unit cell 750 provides an incremental current of $I_B$, with the resulting overall current provided being a multiple, $nI_B$, where n is the number of such current source unit cell 750 which are selected by the control coefficients to be providing an output current. As illustrated, the current source unit cell 750 is comprised of a plurality of PMOS transistors 753, 754, 755 in a cascode configuration and a plurality of NMOS transistors 751, 752, 756. When transistors 752, 753 are on and conducting, current from the transistors 751, 754 is diverted away from the output 758, and when off and not conducting, current $I_B$ is provided at the output 758, as the difference between the current sourced by the PMOS transistors 754, 755 and the current sunk by the NMOS transistors 751, 756. In other embodiments, such current source unit cell 750 may be implemented to be comprised of just one type of PMOS or NMOS transistors, rather than both. In an exemplary embodiment, 9 control coefficients are utilized with 512 current source unit cells 750, providing 512 current increments for a variable current source, such as variable current sources 746 ($I_{BP}$) and 747 ($I_{BN}$) and the other variable current sources previously discussed.

Figure 26:
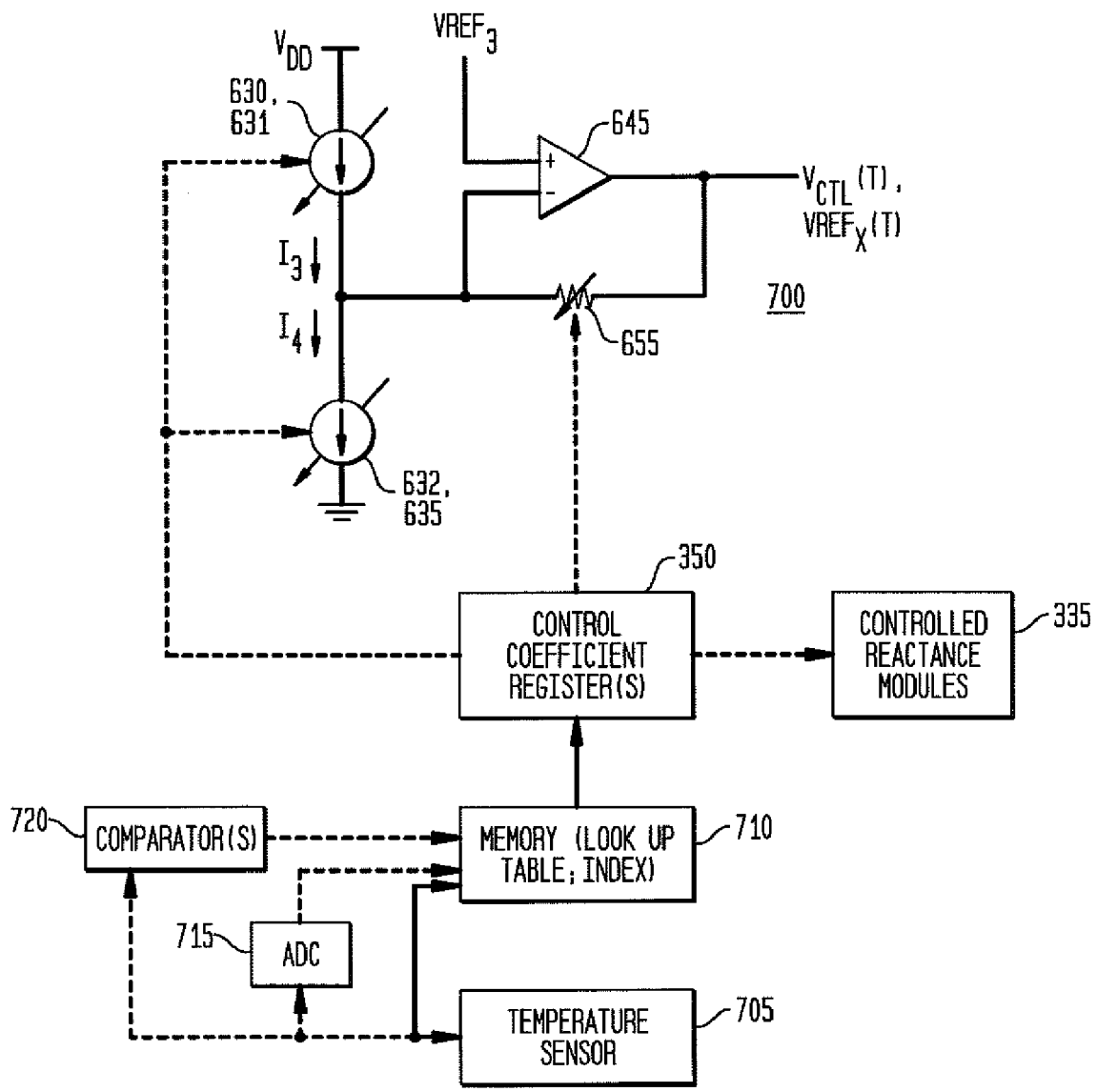
FIG. 26 is a circuit and block diagram illustrating an exemplary eighth control voltage generator embodiment in accordance with the teachings of the present invention.

FIG. 26 is a circuit and block diagram illustrating an exemplary eighth control voltage generator 700 embodiment in accordance with the teachings of the present invention. In this second embodiment, a temperature sensor 705 is utilized, and the first current source (630 or 631) and the second current source (635 or 632) may be either fixed or variable. In a first method of operating the eighth control voltage generator 700, temperature sensor 705 is utilized to determine the actual operating temperature of the reference signal generator 100, 200, 200A, 300, 300A, 400, 400A, 500, 500A, 600, 600A. Based on the sensed temperature, a memory 710 (as a look up table) is used to select corresponding control coefficients, which then select the amount of resistance of the variable resistance 655, as discussed above. In various embodiments, the sensed temperature may be used to access the memory 710 directly. In other embodiments, the sensed temperature may be converted from an analog to digital value (analog-to-digital converter 715), or may be compared to a plurality of reference levels (in comparator(s) 720), to then provide an output which may access the memory 710 to obtain the corresponding coefficients. The output control voltage is then the third reference voltage ($VREF_3$) level plus or minus the voltage across the variable resistance 655, depending upon the levels of the first and second currents. As the amount of resistance and voltage across the variable resistance 655 are now temperature-dependent, the control voltage is also temperature-dependent, $V_{CTL}(T)$. This method may also be utilized to provide additional reference voltages, or to adjust reference voltages with temperature ($VREF_x(T)$).

In a second method of operating the eighth control voltage generator 700, in which the first current source 631 and the second current source 632 are variable, the sensed temperature is also utilized to provide a plurality of control coefficients. In this case, the plurality of control coefficients are utilized to control and vary the first and second currents, to provide a corresponding voltage across the resistance 655 (which may be fixed or variable). The output control voltage is then the third reference voltage (VREF$_3$) level plus or minus the voltage across the resistance 655, depending upon the levels of the first and second currents. As the voltage across the resistance 655 is now temperature-dependent, the control voltage is also temperature-dependent, V$_{CTL}$(T). This second method may also be utilized to provide additional reference voltages, or to adjust reference voltages with temperature (VREF$_X$(T)).

While not a particular method of operating the eighth control voltage generator 700, the sensed temperature may also be utilized to provide a plurality of control coefficients for other purposes. In this case, the plurality of control coefficients are utilized to control and switch the plurality of controlled reactance modules 335, such as to switch fixed capacitances to or from the resonator 320. As a result, the reactance coupled to the LC-tank (320A, 320B, 320C) is varied directly, with resulting affect on the resonant frequency (f$_0$), and may be utilized to maintain the resonant frequency (f$_0$) substantially stable over such temperature variations.

One of the control voltage generators 340, 640, 641, 642, 643, 644, 646, 647, 700 is thereby used to provide open loop, calibrated control of the frequency response of the reference signal generator 100, 200, 200A, 300, 300A, 400, 400A, 500, 500A, 600, 600A with respect to a parameter such as temperature. In addition, this control methodology may also be expanded to provide such control with respect to other parameters, as may be necessary or desirable.

FIGS. 27-31 and 36 are circuit diagrams illustrating exemplary types of controlled reactance modules which may be utilized in accordance with the teachings of the present invention. Such controlled reactance modules are also described in detail in the related applications.

Figure 27:
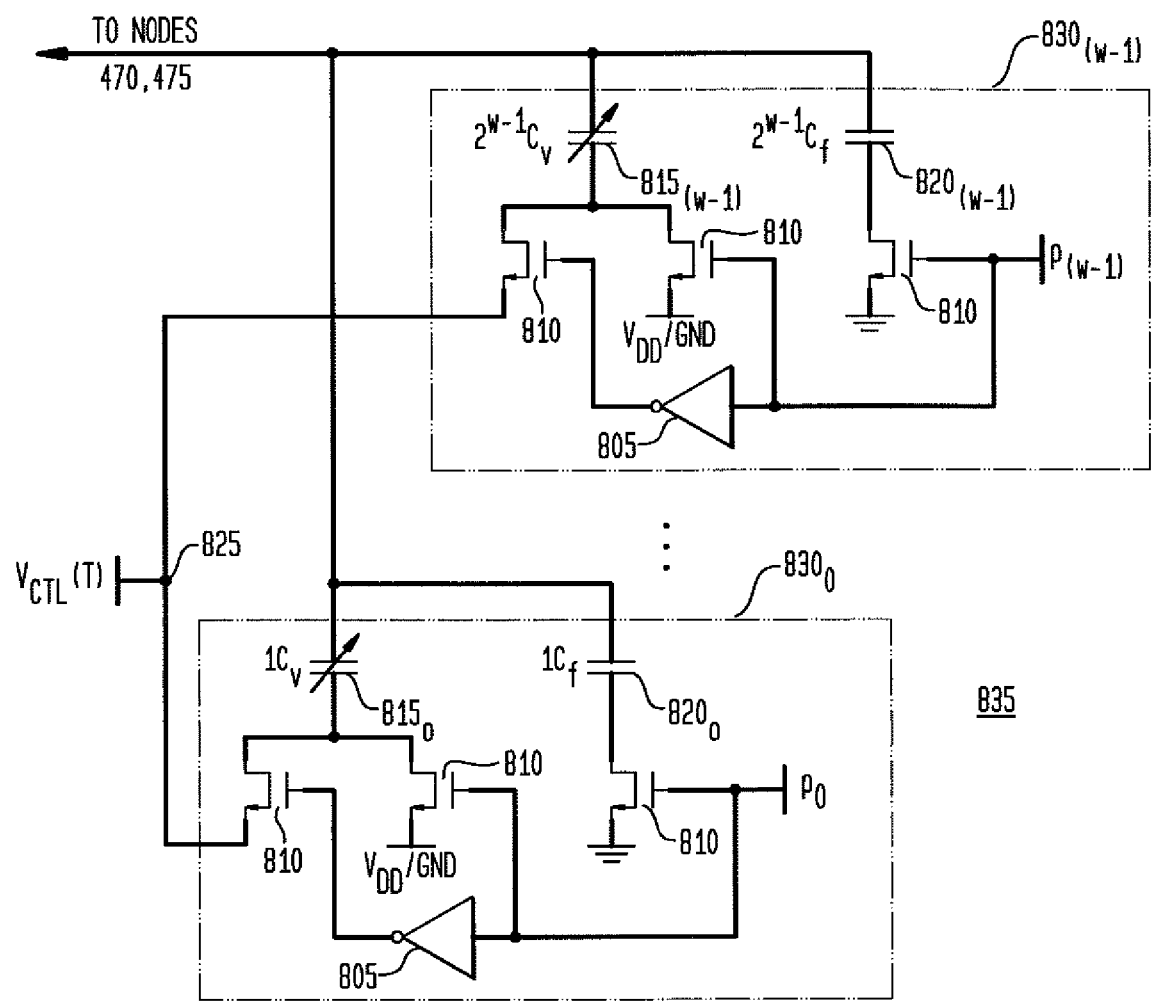
FIG. 27 is a circuit diagram illustrating an exemplary first controlled reactance module utilized in accordance with the teachings of the present invention.

FIG. 27 is a circuit diagram illustrating an exemplary first controlled reactance module 835 in accordance with the teachings of the present invention, with a separate first controlled reactance module 835 coupled to each side of the resonant LC tank 320 (e.g., nodes "A" and "B" or lines 470 and 475) for a balanced configuration. As illustrated, the first controlled reactance module 835 is comprised of a bank or array of a plurality (w) of switchable capacitive modules 830 of binary-weighted fixed capacitors (C$_f$) 820 and binary- or other differentially-weighted variable capacitors (varactors) (C$_v$) 815. Any type of fixed capacitors 820 and variable capacitors (varactors) 815 may be utilized; in selected embodiments, the varactors 815 are AMOS (accumulation-mode MOSFET), IMOS (inversion-mode MOSFET), and/or junction/diode varactors. The fixed capacitors (C$_f$) 820 also may be implemented as varactors coupled to a selected voltage. Each switchable capacitive module 830 has an identical circuit layout, and each differs by a binary weighted capacitance, with switchable capacitive module 830$_0$ having a capacitance of one unit, switchable capacitive module 830$_1$ having a capacitance of two units, and so on, with switchable capacitive module 830$_{(w-1)}$ having a capacitance of $2^{(w-1)}$ units, with each unit representing a particular capacitance magnitude or value (typically in femtofarads (fF) or picofarads (pF)). Binary weighting may be accomplished using capacitors 815, 820 having different capacitances or by having a plurality of unit weighted capacitors, 815, 820, as discussed below. Any differential weighting scheme may be utilized, including linear, binary, or unit cells (discussed below), and may also consist of providing such differential weighting by switching the reactance to a selected control voltage, thereby increasing or decreasing its effective reactance.

Within each switchable module 830, each fixed and variable capacitance is initially equal, with the variable capacitance allowed to vary in response to the control voltage provided at node 825. This control voltage, in turn, varies with temperature or another selected variable parameter, resulting in an overall or total capacitance provided by the controlled capacitance module 835 also varying as a function of temperature (or other parameter) and which, in turn, is utilized to vary the resonant frequency f$_0$. In other selected embodiments, any of a plurality of control voltages may be utilized, including static control voltages, to provide for other types of compensation. Also within each switchable capacitive module 830, either the fixed capacitance C$_f$ or the variable capacitance C$_v$ is switched into the circuit, not both, using switching coefficients p$_0$ though p$_{(w-1)}$. For example, in the selected embodiment, for a given or selected module 830, when its corresponding "p" coefficient is a logic high (or high voltage), the corresponding fixed capacitance C$_f$ is switched into the circuit and the corresponding variable capacitance C$_v$ is switched out of the circuit (and coupled to a power rail voltage V$_{DD}$ or ground (GND), depending whether the device is AMOS or IMOS, respectively, to avoid a floating node and to minimize the capacitance presented to the tank), and when its corresponding "p" coefficient is a logic low (or low voltage), the corresponding fixed capacitance C$_f$ is switched out of the circuit and the corresponding variable capacitance is switched into the circuit and coupled to the control voltage provided on node 825.

In an exemplary embodiment, a total of eight switchable capacitive modules 830 (and corresponding first plurality of eight switching coefficients p$_0$ though p$_7$ have been implemented to provide 256 combinations of fixed and variable capacitances. As a result, significant control over oscillation frequency as a function of temperature variations is provided.

It should be noted, in this exemplary embodiment, by switching in or out the fixed capacitance C$_f$ or the variable capacitance C$_v$, the overall amount of capacitance remains comparatively stable, while the ratio of fixed to variable changes and, correspondingly, the amount or degree of temperature-responsiveness of the controllable capacitance module 835. For example, with increasing amounts of variable capacitance C$_v$, the controllable capacitance module 835 provides greater variability of capacitance in response to temperature (or other parameter), thereby adjusting the frequency response of the tank or other oscillator.

Figure 28:
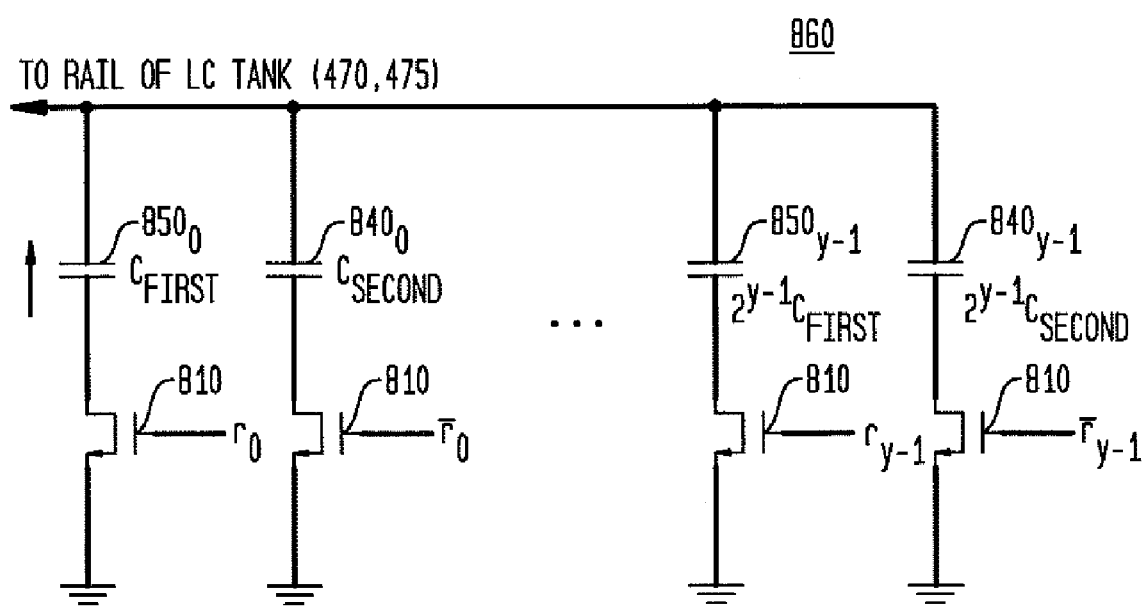
FIG. 28 is a circuit diagram illustrating an exemplary second controlled reactance module utilized in accordance with the teachings of the present invention.

FIG. 28 is a circuit diagram illustrating an exemplary second controlled reactance module 860 in accordance with the teachings of the present invention. The second controlled reactance module 860 may be utilized in resonant frequency (f$_0$) selection, for example, with each module attached to a rail or side of the resonant LC tank 320 (e.g., nodes "A" and "B" or lines 470 and 475) for a balanced configuration. In addition, each second controlled reactance module 860 is controlled by a corresponding plurality ("y") of switching coefficients r$_0$ though r$_{(y-1)}$, stored in coefficient register(s) 350. The second controlled reactance module 860 provides an array of switchable capacitive modules having differentially-weighted (e.g., binary-weighted, or a plurality of unit-weighted capacitors, etc.), first fixed capacitances 850, for adjustment and selection of the resonant frequency f$_0$, by switching in or out a plurality of fixed capacitances 850, through a corresponding plurality of switching transistors 810 (controlled by a corresponding "r" coefficient). Again, as each capacitance branch is switched in or out of the array or circuit 860, the corresponding first fixed capacitance is added or subtracted from the total capacitance available for oscillation in the resonant LC tank, thereby changing the effective reactance and modulating the resonant frequency. The plurality of switching coefficients $r_0$ though $r_{(y-1)}$ is also determined post-fabrication using test ICs, generally as an iterative process. The determined "r" coefficients are then stored in the corresponding coefficient register(s) 350 of the ICs of that production or process batch. Alternatively, each IC may be calibrated separately, for example. In addition to calibration techniques, other methods of determining the plurality of switching coefficients $r_0$ though $r_{(y-1)}$ are discussed in the related applications. Any differential weighting scheme may be utilized, including linear, binary, or unit cells (discussed below).

To avoid additional frequency distortions, several additional features may be implemented with this second controlled reactance module 860. First, to avoid additional frequency distortion, the on resistance of the MOS transistors 810 should be small, and therefore the transistors' width/length ratio is comparatively large. This amount of resistance of a transistor 810 when it is configured to have an effectively or generally minimal resistance (for the selected type, composition and fabrication method) when it is (fully) on and conducting is referred to herein as a "nominal" resistance, and may be contrasted with the on resistance of a transistor 809 (discussed below), which is configured to have an on resistance which is substantially or comparatively greater than such a nominal resistance. For example, such a transistor 809 may be designed to have a comparatively small width/length ratio, thereby providing a comparatively higher on resistance, and providing the equivalent functionality of both a separate resistor (e.g., 821, discussed below) in series with a transistor 810. Second, large capacitances may be split into two branches, with two corresponding transistors 810 controlled by the same "r" coefficient. Third, to provide for the resonant LC tank to have a similar load under all conditions, when a first fixed capacitance 850 is switched in or out of the circuit 860, a corresponding second fixed capacitance 840, as a "dummy" capacitor (having a significantly smaller capacitance or the smallest size allowed by the design rules for the fabrication process), is correspondingly switched out of or into the circuit, based on the inverse of the corresponding "r" coefficient. As a consequence, approximately or substantially the same on resistance of the transistors 810 is always present, with only the amount of capacitance varied. Other techniques are also disclosed in the related and additional applications. In addition, either or both a first fixed capacitance 850 and second fixed capacitance 840 ("dummy" capacitance) may be comprised of one or more unit (or unit cell) capacitances discussed below with reference to FIGS. 29 and 30. In an exemplary embodiment, the second fixed capacitance 840 has a unit cell capacitance, while the first fixed capacitance 850 has a larger capacitance. As the second fixed capacitance 840 is switched to the LC tank 320 circuit when the first fixed capacitance 850 is switched out or from the LC tank 320 circuit, and vice-versa, resulting in a difference of the two capacitance values being switched to or from the LC tank 320, this mode of operation may be referred to as a differential mode, with the capacitance modules referred also referred to as differential modules.

Figure 29:
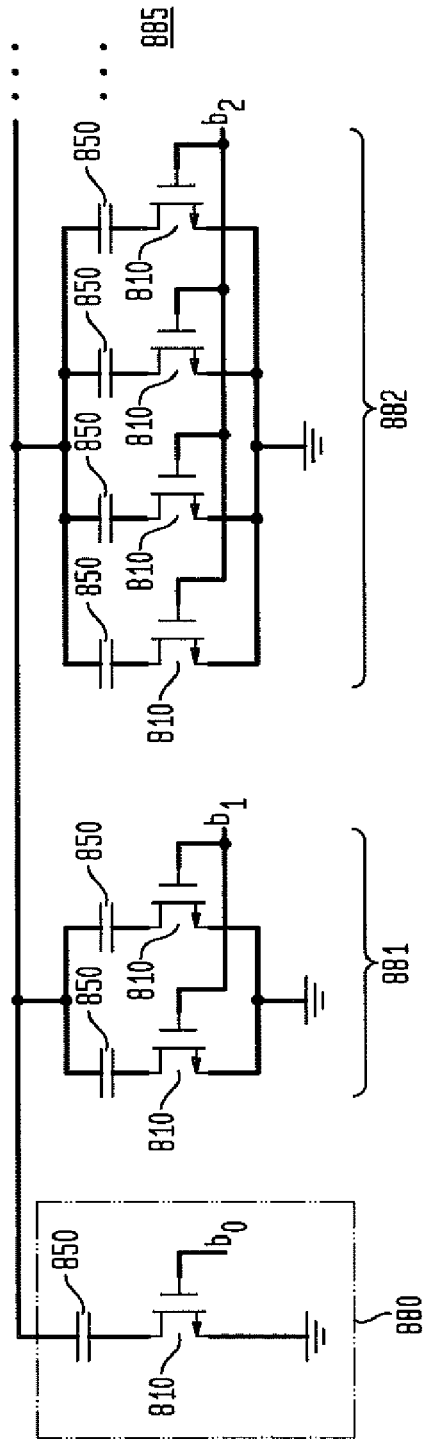
FIG. 29 is a circuit diagram illustrating an exemplary third controlled reactance module utilized in accordance with the teachings of the present invention.

FIG. 29 is a circuit diagram illustrating an exemplary third controlled reactance module 885 utilized in accordance with the teachings of the present invention. The third controlled reactance module 885 is comprised of a plurality of reactance unit cells 880, having a (fixed) capacitor 850 sized to have a single "unit" capacitance (e.g., 15 femto Farads, 1 pF, 32.3 fF) and a transistor 810, functioning to switch the capacitor 850 to or from the resonant LC tank, as previously discussed. The third controlled reactance module 885 may be utilized in resonant frequency ($f_0$) selection, for example, with each module attached to a rail or side of the resonant LC tank 320 (e.g., nodes "A" and "B" or lines 470 and 475) for a balanced configuration. In addition, each third controlled reactance module 885 is controlled by a corresponding plurality of control (switching) coefficients $b_0$, $b_1$, $b_2$, etc., stored in coefficient register(s) 350. Rather than providing binary weighting of the capacitance values of each capacitor 850, binary weighting is providing by switching in additional units of capacitance, under the control of control coefficients $b_0$, $b_1$, $b_2$, and so on, for adjustment and selection of the resonant frequency $f_0$, by switching in or out a plurality of fixed capacitances 850, through a corresponding plurality of switching transistors 810 (controlled by a corresponding "b" coefficient). More specifically, each module of controlled reactance modules 885 is comprised of one or more reactance unit cells 880, such that all reactance unit cells 880 of a given module are collectively switched, under the control of a control coefficient, to or from the LC tank 320. Differential weighting is provided by including additional reactance unit cells 880 within a given module. For example, to provide binary weighting, 1 unit cell (1 reactance unit cell 880 controlled by corresponding $b_0$ coefficient) may be switched to or from the LC tank 320, 2 unit cells (2 reactance unit cells 880 comprising module 881 and controlled by corresponding $b_1$ coefficient) may be switched to or from the LC tank 320, 4 unit cells (4 reactance unit cells 880 comprising module 882 and controlled by corresponding $b_2$ coefficient) may be switched to or from the LC tank 320, and so on, for 8, 16, 32, 64, etc. reactance unit cells 880 (not separately illustrated). Again, as each capacitance module or branch is switched in or out of the array or circuit of controlled reactance modules 885, the corresponding fixed capacitance is added or subtracted from the total capacitance available for oscillation in the resonant LC tank, thereby changing the effective reactance and modulating the resonant frequency. The plurality of switching coefficients $b_0$, $b_1$, $b_2$, etc. is also determined post-fabrication using test ICs, generally as an iterative process.

Using this unit cell concept, as the various reactance unit cells 880 are switched to or from the LC tank 320, adjacent states are quite similar, as the ratio of reactance (capacitance) to resistance stays substantially the same. The reactance unit cells 880 are utilized to control the Q factor for the reference signal generator 100, 200, 200A, 300, 300A, 400, 400A, 500, 500A, 600, 600A. As known in the field, a Q factor may be defined by the ratio of the energy stored at resonance to the energy dissipation per cycle (Q=ω·(energy stored/energy dissipated)) or, equivalently, the ratio of the resonant frequency $f_0$ to the 3 dB bandwidth ("BW") of the magnitude response (Q=($f_0$/BW)). Typically, it is desirable for the Q factor for a reference signal generator to be comparatively high. In accordance with the exemplary embodiments of the invention, it is also desirable for adjacent states (which may be defined by the amount of switched capacitance and/or corresponding frequency) to have substantially similar Q factors, such that incremental changes in reactance coupled to the LC tank 320 does not substantially affect the overall Q factor of the reference signal generator 100, 200, 200A, 300, 300A, 400, 400A, 500, 500A, 600, 600A.

The reactance unit cells 880 of the exemplary embodiments achieve this result, as each unit cell 880 has a given or otherwise specified unit of reactance (capacitance 850) for a given or otherwise specified resistance and capacitance of a switch (transistor) 810. For such a unit cell 880, the ratio of reactance to resistance for a series combination (capacitance 850 in series with a series combination of the resistance and capacitance of the switch 810), or the ratio of resistance to reactance for a parallel combination (capacitance 850 in series with a parallel combination of the resistance and capacitance of the switch 810), may be utilized to determine the Q factor. For example, the switch 810 may be modeled as a capacitance in series or in parallel with a resistance, for both the on and off states of the switch 810. As the amount of reactance is scaled by the addition of additional reactance unit cells 880 having substantially the same reactance and resistance parameters and substantially the same ratios of these parameters, the overall Q factor for the reference signal generator 100, 200, 200A, 300, 300A, 400, 400A, 500, 500A, 600, 600A is substantially monotonic and continuous as these reactance modules 885 are switched to or from the LC tank 320 over the frequency range of the reference signal generator 100, 200, 200A, 300, 300A, 400, 400A, 500, 500A, 600, 600A. In addition, there is a substantially constant step size for the frequency tuning or calibration of the reference signal generator 100, 200, 200A, 300, 300A, 400, 400A, 500, 500A, 600, 600A, and the Q factor for adjacent states (defined by frequency or capacitance, for example) are substantially similar.

For example, in switching from a state of 011 to an adjacent state of 100 for coefficients $b_2$, $b_1$, $b_0$ (which are adjacent capacitance/reactance states as selected by the coefficients, and are similarly adjacent states for frequency selection), thereby switching modules 880 and 881 from the LC tank 320 and switching module 882 to the tank, three reactance unit cells are switched from the LC tank 320, and four reactance unit cells are switched to the LC tank 320, with a resulting change of one reactance unit cell 880. The resulting changes in the Q factor, through selection or tuning of the resonant frequency, then becomes substantially monotonic and substantially continuous, as the ratio of reactance to resistance has been maintained substantially constant. It should be noted that the resulting frequency response is also monotonic and continuous, but is generally non-linear as a function of the square-root of the overall capacitance of the LC tank 320.

The selection of the amount of reactance (capacitance 850) and the reactance and resistance of a switch 810 may be determined by a wide variety of factors, such as process parameters for a given foundry. In an exemplary embodiment, for example, the amount of reactance (capacitance 850) was determined to be approximately ten times the capacitance of the switch 810 in an off state, resulting in a unit capacitance of approximately 32.3 fF, based on a switch capacitance of 3.23 fF (and off resistance of 9 M Ohms) for a switch having a selected size (a given length and width) for an assumed resonant frequency of 1 GHz and a selected foundry process, such as a 230 nm process of TSMC.

In addition to providing a substantially continuous and monotonic Q factor, another exemplary embodiment also provides for a substantially constant Q factor over the tunable frequency range of the reference signal generator 100, 200, 200A, 300, 300A, 400, 400A, 500, 500A, 600, 600A. While the reactance unit cells 880 provide for a monotonic and continuous variation in Q factor over this tunable frequency range, such a Q factor may vary depending upon the on or off state of the various modules 885 (and, generally, $Q_{ON} < Q_{OFF}$). In another exemplary embodiment, the overall Q factor is maintained substantially constant, regardless of the on or off state of the switches 810 and the amount of reactance coupled to the LC tank 320 (such that $Q_{ON} \approx Q_{OFF}$ for the tunable range of the reference signal generator 100, 200, 200A, 300, 300A, 400, 400A, 500, 500A, 600, 600A).

Figure 30:
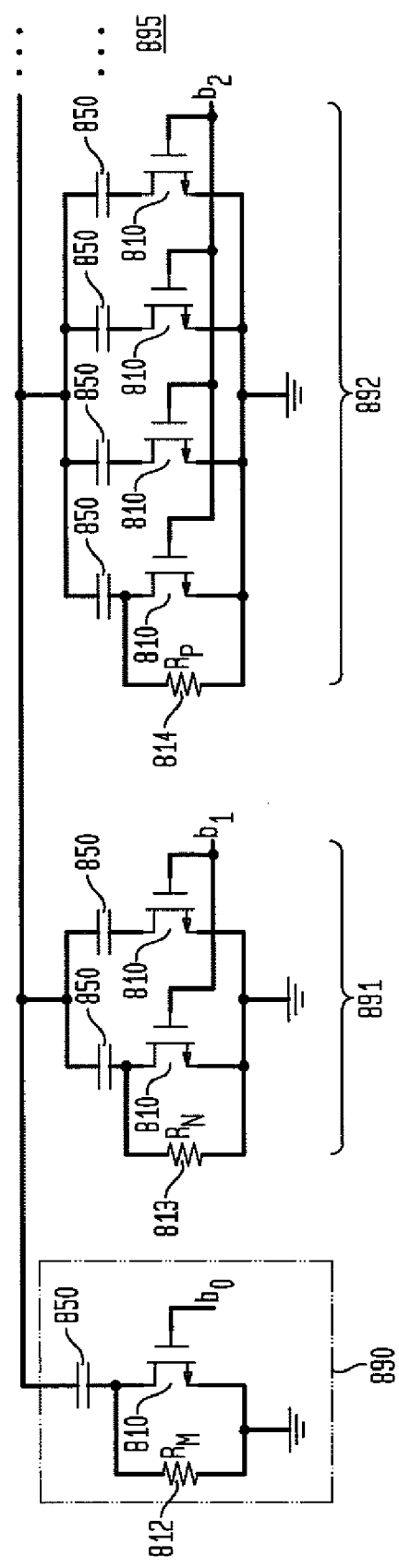
FIG. 30 is a circuit diagram illustrating an exemplary fourth controlled reactance module utilized in accordance with the teachings of the present invention.

This can be done by increasing $Q_{ON}$ or by decreasing $Q_{OFF}$; in an exemplary embodiment, the latter is implemented, as illustrated in FIG. 30. In other exemplary embodiments, as mentioned above and as discussed in greater detail below, the overall Q factor is reduced by intentionally adding resistance, to provide temperature compensation and a substantially constant resonant or center frequency over variations in temperature within a predetermined range.

FIG. 30 is a circuit diagram illustrating an exemplary fourth controlled reactance module 895 utilized in accordance with the teachings of the present invention. The fourth controlled reactance module 895 differs from the third controlled reactance module 885, insofar as the reactance unit cell 890 also includes a unit resistance provided by resistor 812 ($R_M$) in parallel with the transistor 810, in addition to a unit capacitance, and otherwise functions and is controlled as described above for third controlled reactance module 885. The addition of the resistance in each reactance unit cell 890 serves to decrease the Q factor for a corresponding off state of the switch 810, by decreasing the off resistance associated with the reactance unit cell 890. The fourth controlled reactance module 895 also functions substantially similarly to the third controlled reactance module 885, with differential weighting of modules 895 provided by including more reactance unit cells 890 in those modules 895, such as the illustrated binary weighting also provided by collectively switching in or out additional units of capacitance, under the control of control coefficients $b_0$, $b_1$, $b_2$, and so on, for adjustment and selection of the resonant frequency $f_0$, by switching in or out a plurality of fixed capacitances 850 and resistances (812), through a corresponding plurality of switching transistors 810 (controlled by a corresponding "b" coefficient), as discussed above. The controlled reactance modules 895 may be scaled as describe above, with each module having one, two, four etc. unit capacitances 850 and unit resistances 812 correspondingly in parallel with each switch 810, or, as illustrated, the scaled resistances may be combined as a single resistance for each module (such as for increased efficiency and IC area savings). More specifically, as illustrated in FIG. 30, to provide binary weighting, for example, 2 unit cells (891) are switched having a single binary weighted resistance 813 ($R_N$ having a resistance of $2R_M$) in parallel with the transistor 810, or 4 unit cells (892) are switched (also having a single binary weighted resistance 814 ($R_P$ having a resistance of $4R_M$) in parallel with the transistor 810), etc. The inclusion of such a parallel resistance (812, 813, 814, etc.), functioning to decrease the resistance of the switches 810 when in an off state, tends to equalize the Q factor associated with switching modules 895 to or from the LC tank 320 (corresponding to the on and off states of switches 810), and thereby maintains the Q factor substantially constant over the tunable or selectable frequency range of the reference signal generator 100, 200, 200A, 300, 300A, 400, 400A, 500, 500A, 600, 600A.

The third controlled reactance module 885 and fourth controlled reactance module 895 also may be utilized with or without the provision of "dummy" capacitances of the second controlled reactance module 860. In alternative embodiments not separately illustrated, the unit cells 880, 890 may also be utilized in conjunction with corresponding "dummy" capacitances within arrays 885, 895. For example, in an exemplary embodiment, the second fixed capacitance 840 is implemented as a single reactance unit cell 880, while the first fixed capacitance 850 is weighted (e.g., a larger, non-unit capacitance), creating modules 860 as differential modules, with at least a minimum capacitance of one unit cell always coupled to the LC tank 320. In exemplary embodiments of the third controlled reactance module 885 and fourth controlled reactance module 895, as mentioned above, the various transistors 810 and capacitors 850 may be sized to provide a continuous or monotonic Q factor of the resonant LC tank or a substantially constant Q factor of the resonant LC tank, regardless of the number of unit cells 880, 890 which are switched on or off, thereby switching capacitors 850 to or from the LC tank 320. In both the third controlled reactance module 885 and the fourth controlled reactance module 895, the use of unit cell increments in added or subtracted capacitance serves to help provide a substantially continuous and/or monotonically changing Q factor of the resonant LC tank 320, and can be utilized to provide a substantially constant Q factor. With regard to the fourth controlled reactance module 895, the use of the various unit-sized or weighted resistances 812, 813, 814, etc. serves to help equalize the Q factor of the LC tank 320, stabilizing the Q factor regardless of whether a transistors 810 are in an off state or an on state. In addition, in an exemplary embodiment, the switching transistors 810 are implemented as "donut" or "doughnut" transistors or switches, to decrease the capacitance when in an off state, for an equivalent resistance in an on state.

While not separately illustrated, the reactance unit cells 880 or reactance unit cells 890 may also be utilized to provide variable capacitances, and utilized in the other variable reactance modules 835, 875. In such variable embodiments, the reactance unit cells 880 and 890 may be coupled to a control voltage, as described above, such as for providing corresponding responses to temperature variation, while also providing the controlled Q factor benefits described above.

Figure 31:
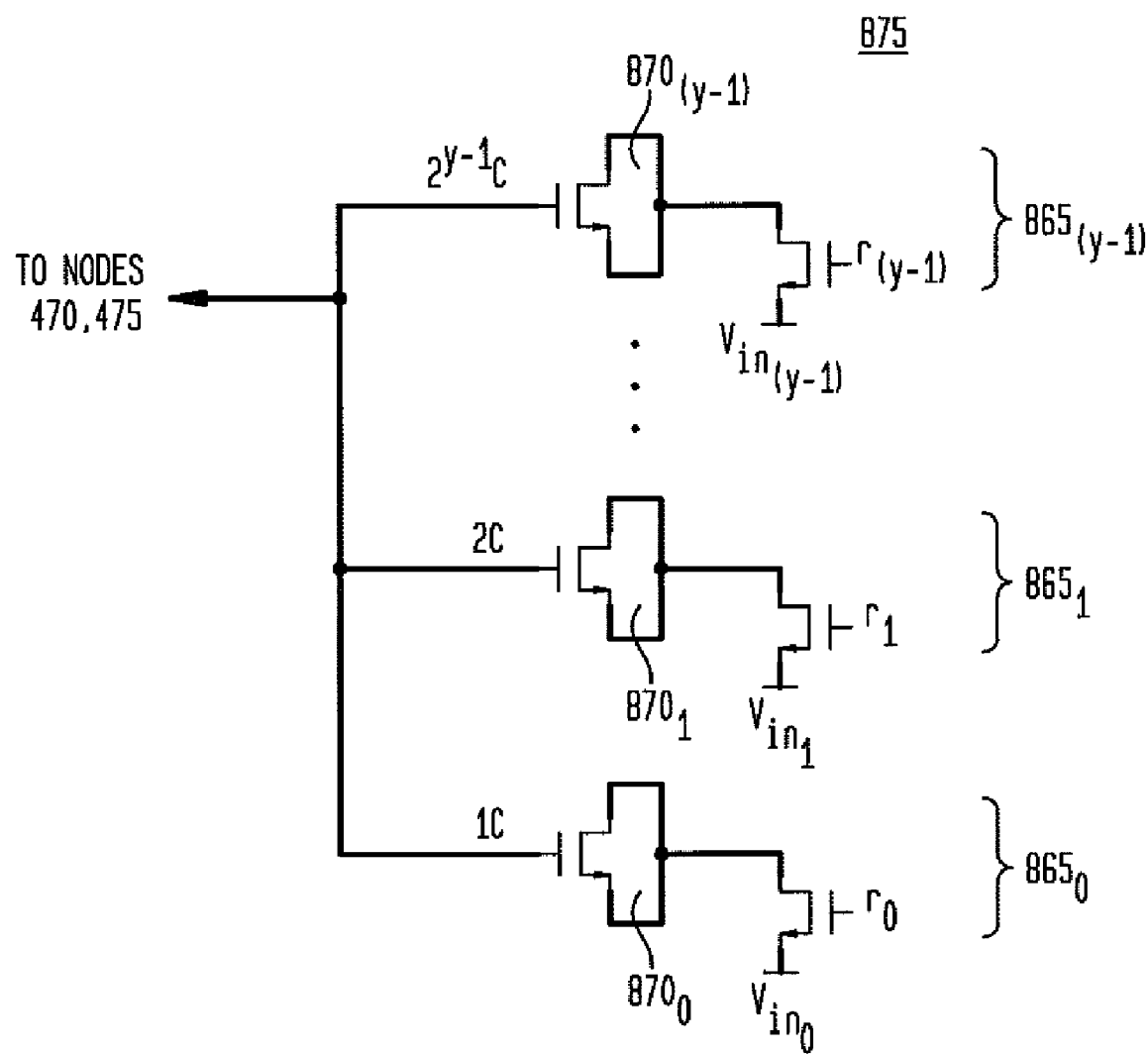
FIG. 31 is a circuit diagram illustrating an exemplary fifth controlled reactance module utilized in accordance with the teachings of the present invention.

FIG. 31 is a circuit diagram illustrating an exemplary fifth controlled reactance module 875 in accordance with the teachings of the present invention. The fifth controlled reactance module 875 may be utilized in resonant frequency ($f_0$) selection, for example, with each module attached to a rail or side of the resonant LC tank 320 (e.g., nodes "A" and "B" or lines 470 and 475) for a balanced configuration, instead of modules 860. In addition, each fifth controlled reactance module 875 would also be controlled by a plurality of switching coefficients $r_0$ though $r_{(y-1)}$, stored in coefficient register(s) 350. (Because of the different circuitry employed in each exemplary controlled reactance module, however, the corresponding pluralities of switching coefficients $r_0$ though $r_{(y-1)}$ generally would, of course, be different from each other.) In addition, such switching may be controlled through use of any control signals or control coefficients, discussed above. Depending on the voltage the varactors 870 may be coupled to via the illustrated switches (transistors), such as a variable control voltage or a fixed voltage (as Vin) the fifth controlled reactance module 875 may be utilized to provide either a variable or fixed capacitance.

The varactors 870 may be comprised of AMOS or IMOS transistors, or more generally MOS transistors, and configured by shorting the transistor's source and drain. In addition, the varactors 870 may also be binary-weighted with respect to each other, or may use another differential weighting scheme, including the unit scheme discussed above. The fifth controlled reactance module 875 provides an array or bank of a plurality of switchable variable capacitive modules 865, without MOS switches/transistors, and hence the losses or loading through the MOS transistors are eliminated. Instead, the load appears as a low loss capacitance; such low loss also implies that the oscillator start-up power is less. In the fifth controlled reactance module 875, a MOS varactor 870 is switched either to Vin, which may be any of the various pluralities of control voltages discussed above, to provide a corresponding capacitance level to the resonant LC tank 320, or may be switched to ground or the power rail (voltage $V_{DD}$), thereby providing either the minimum capacitance or the maximum capacitance to the resonant LC tank 320 based upon the varactor 870 geometry and type. For AMOS, switched to voltage $V_{DD}$ would provide minimum capacitance and switched to ground would provide maximum capacitance, while the opposite is the case for IMOS. Again, the fifth controlled reactance module 875 is comprised of an array of variable capacitances, as varactors 870, for adjustment and selection of the resonant frequency $f_0$, by coupling or switching a selected varactor 870 to any of a plurality of control voltages (Vin), or to ground or $V_{DD}$, such as switching between a first voltage and a second voltage, through a corresponding "r" coefficient or through application of a corresponding control signal. In another alternative, instead of a plurality or an array, one varactor 870 may be utilized, with its effective reactance provided to the tank controlled by a selected control voltage.

As each capacitance branch is switched to a corresponding control voltage, ground or $V_{DD}$, the corresponding variable capacitance is added to or not included in the total capacitance available for oscillation in the resonant LC tank 320, thereby changing its effective reactance and modulating the resonant frequency. More particularly, for an AMOS implementation, coupling to $V_{DD}$ (as $V_{in}$) provides lesser capacitance and coupling to ground ($V_{in}=0$) provides greater capacitance, with the opposite holding for an IMOS implementation, in which coupling to $V_{DD}$ (as $V_{in}$) provides greater capacitance and coupling to ground ($V_{in}=0$) provides lesser capacitance, where it is assumed that the voltage on the rails of the resonant LC tank 320 (nodes or lines 470 and 475 of FIG. 4) is between zero V and voltage $V_{DD}$, and significantly or substantially far from either voltage level. Coupling to voltages between $V_{DD}$ and ground, such as many of the various control voltages, as Vin, will provide a corresponding, intermediate level of capacitance to the resonant LC tank 320. The plurality of switching coefficients $r_0$ though $r_{(y-1)}$ may also be determined post-fabrication during a calibration process and stored in the corresponding coefficient register(s) 350. In addition, any selected number of modules 865 may be controlled dynamically, to provide continuous frequency control during oscillator operation.

As indicated above, depending upon the type (AMOS or IMOS) of varactor, switching any of the variable capacitive modules 865 to $V_{DD}$ or ground, as first and second voltage levels, results in the corresponding maximum capacitance or no (negligible) capacitance being included as effective capacitance for the resonator (LC tank). As mentioned above, however, other capacitance levels intermediate between such maxima and minima may also be generated, by switching the variable capacitive modules 865 to a corresponding control voltage. For example, using a control voltage having a magnitude which may change in response to temperature results in a corresponding capacitance of the variable capacitive modules 865 being added to (or subtracted from) the resonant LC tank 320, thus changing its effective reactance and modulating the resonant frequency.

Figure 36:
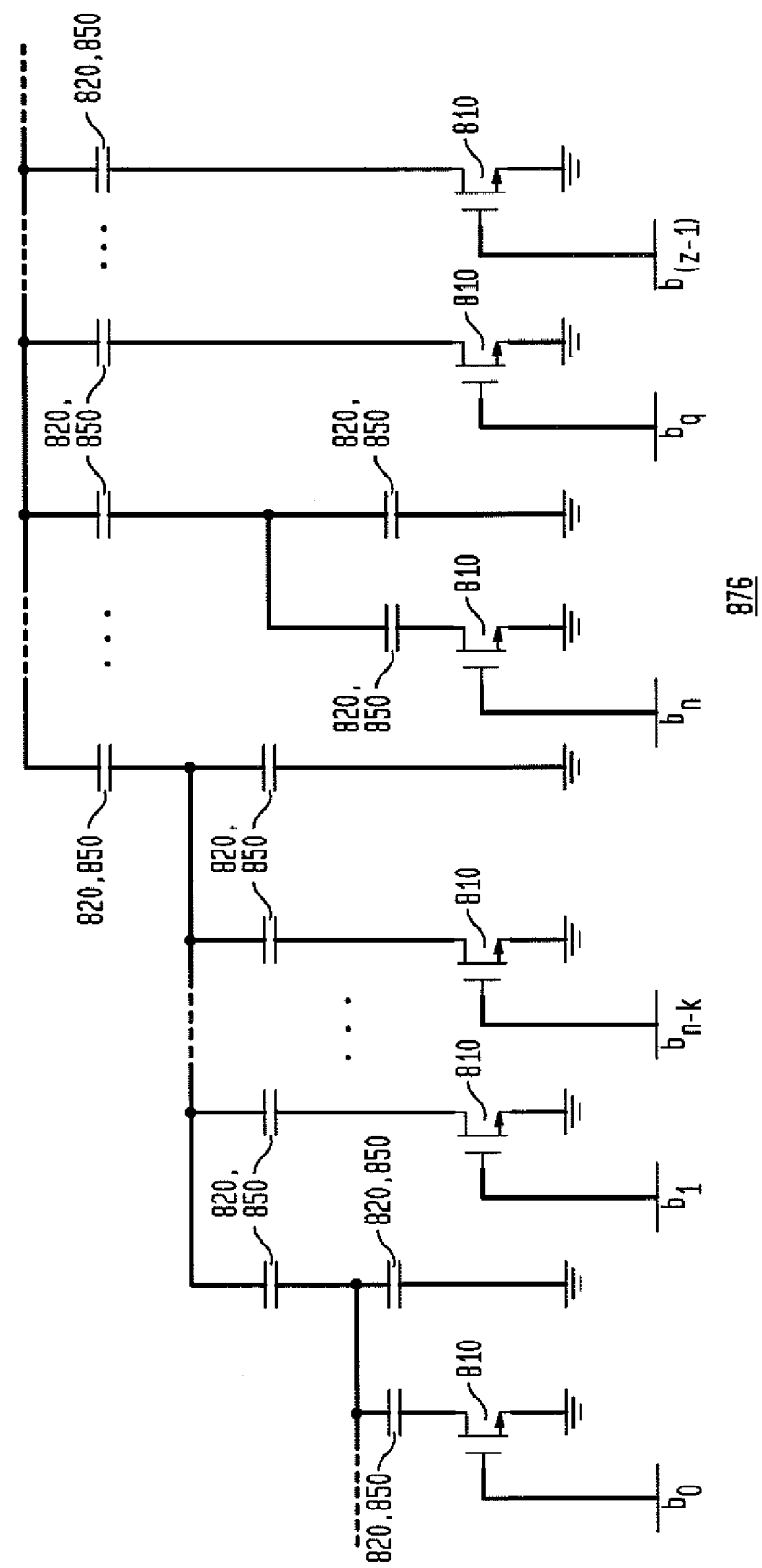
FIG. 36 is a circuit diagram illustrating an exemplary sixth controlled reactance module utilized in accordance with the teachings of the present invention.

FIG. 36 is a circuit diagram illustrating an exemplary sixth controlled reactance module 876 utilized in accordance with the teachings of the present invention. The sixth controlled reactance module 876 may be utilized in resonant frequency ($f_0$) selection, for example, with each module attached to a rail or side of the resonant LC tank 320 (e.g., nodes "A" and "B" or lines 470 and 475) for a balanced configuration. In addition, each sixth controlled reactance module 876 is controlled by a corresponding plurality ("z") of switching coefficients $b_0$ though $b_{(z-1)}$, also stored in coefficient register(s) 350. The sixth controlled reactance module 876 provides an array of switchable capacitive modules, which also may have differentially-weighted capacitances 820, 850 (e.g., binary-weighted, or a plurality of unit-weighted capacitors, etc.), for adjustment and selection of the resonant frequency $f_0$, by switching in or out a plurality of fixed capacitances 820, 850, through a corresponding plurality of switching transistors 810 (controlled by a corresponding "b" coefficient). Not separately illustrated, the capacitors may also be implemented as varactors 815, for example and as discussed above.

As illustrated, a sixth controlled reactance module 876 is configured as a capacitive "divider", such that a plurality of different series and parallel combinations of capacitances may be switched in or out of the array or circuit 876, under the control of switching coefficients $b_0$ though $b_{(z-1)}$, and is utilized to provide a comparatively more fine-grained resolution or control of the amount of the capacitance which is added to or subtracted from the total capacitance available for oscillation in the resonant LC tank, also thereby changing the effective reactance and modulating the resonant frequency. Such as divider configuration, for example, may be utilized to switch an amount of capacitance which is less than the smallest unit capacitance utilized, such as the unit cell capacitance discussed above. The plurality of switching coefficients $b_0$ though $b_{(z-1)}$, is also determined post-fabrication using test ICs, generally as an iterative process. The determined "b" coefficients are then stored in the corresponding coefficient register(s) 350 of the ICs of that production or process batch. Alternatively, each IC may be calibrated separately, for example. In addition to calibration techniques, other methods of determining the plurality of switching coefficients $b_0$ though $b_{(z-1)}$ are discussed in the related applications. Any differential weighting scheme may be utilized, including linear, binary, or unit cells (discussed below), and any type of capacitor may be utilized, in addition to the illustrated capacitors 820, 850, including varactors or unit capacitances previously discussed. Also, in addition to using the switch or transistor 810 as illustrated and which may be implemented to provide a comparatively low resistance, a switch or transistor 809 may be also be utilized, and as discussed in greater detail below with reference to FIGS. 37-46, such a switch or transistor 809 may be implemented to provide a comparatively higher resistance. It should also be noted that any of the various reactance modules utilized herein may be implemented to have such a divider configuration, including without limitation the reactance-resistance modules discussed below.

FIG. 32 is a block diagram illustrating an exemplary frequency (and mode) selector 205A embodiment and an exemplary second system 900 embodiment in accordance with the teachings of the present invention. As illustrated in a first reference signal having a first frequency ($f_0$) is provided either directly to on line 930 to additional second circuitry 925 (such as a processor, an input/output interface 120, switching or routing circuitry, or any other type of circuit) or to other second circuitry illustrated as inverter 905, square-wave generator 910, dividers 915, locking circuits 920 (e.g., PLLs, DLLs), and combinations or permutations of such dividers, locking circuits, etc. This additional second circuitry is to receive the first reference signal having a first frequency ($f_0$) and to provide one or more corresponding second reference signals at selected frequencies, illustrated as frequencies $f_1$, $f_2$, through $f_N$ and having any selected phase relationship (e.g., inverted, 90 degrees, quadrature, etc.). The system 900 may be combined with additional circuitry, e.g., as part of a larger IC, or may be provided as a single or discrete IC.

The exemplary frequency (and mode) selector 205A provides for generating a plurality of reference signals, whether sinusoidal or square-wave, such as for use as one or more clock signals or frequency references. The oscillator or reference generator (210, 310, 320, 300, 400, 500, 600) provides a first reference signal (having a first frequency $f_0$), and is coupled to one or more locking circuits 920 (such as phase-locked loops, delay-locked loops, injection locking circuits), to provide a corresponding plurality of output signals at selected frequencies, illustrated as frequencies $f_{K+1}$, $f_{K+2}$, through $f_N$. Each such locking circuit 920 of the plurality of locking circuits has a corresponding divide ratio of a plurality of different divide ratios. In operation, each locking circuit 920 is to phase, delay or otherwise lock to the first reference signal provided by the oscillator or reference generator (210, 310, 320, 300, 400, 500, 600), and to provide an output, second reference signal having an output frequency determined from the first frequency and the corresponding divide ratio. Each locking circuit 920, such as a PLL or DLL, may be implemented as known or becomes known in the electronic arts, as discussed in the related applications.

In an exemplary embodiment, the frequencies of the second reference signals may be fixed, such as fixed at fabrication through wired or configured dividers or divide ratios, or variable, such as selected or programmed post-fabrication through control circuitry (or logic) or stored coefficients (block 935, which may be a register storing coefficients or other circuitry providing control signals), such as to adjust the divide ratios of the locking circuits 920 for corresponding frequency selection, for example. Any stored coefficients (935) may also be part of the various frequency calibration and frequency control coefficients stored in coefficient register(s) 350, as discussed above. As an option, a user input, such as for frequency selection, also may be provided through a user interface (not separately illustrated).

Additional applications and embodiments are discussed in detail in the related applications. The reference signal generator 100, 200, 200A, 300, 300A, 400, 400A, 500, 500A, 600, 600A of the present invention may be utilized in any and all of those applications and embodiments of the related applications, including without limitation, discrete IC embodiments, integrated embodiments, embodiments utilizing different LC circuit configurations as mentioned above, and for generation of any type of reference signal, also as discussed above.

FIG. 33 is a circuit and block diagram illustrating a fifth exemplary apparatus 600 embodiment in accordance with the teachings of the present invention, and illustrates some additional features. The reference signal generator 600 includes a non-variable or fixed current source ($I_F$) 975, which is provided to the resonator 320D and sustaining amplifier 305D through a current mirror 970 having a cascode configuration (PMOS tail current source). The current of the fixed current source ($I_F$) 975 is also provided to the variable current source 355A (also a PMOS tail current source), providing a variable current under the control of the amplitude controller (comprising the current source 355A, operational amplifier 360, and amplitude detector 365). Reactance modules are also illustrated: modules 860 provide switchable fixed capacitances, and modules 835, 875 provide switchable variable capacitances, under the control of corresponding pluralities of control coefficients "h" and their inverted form, inverted control coefficients "h-bar". In FIG. 33, for ease of illustration, the illustrated modules 860 and 835, 875 should be understood to each represent an array (i.e., a plurality) of binary-weighted modules, as discussed above. Switches 810 are implemented as ring transistors; switches 811 are implemented as pass or transmission gates. The reference signal generator 600 is operable using a power supply rail at a voltage "$V_{OSC}$" (e.g., 2.5 V) which is lower than a typical power supply voltage VDD (e.g., 3.3 V). The illustrated modules 835, 875 providing switchable variable capacitances may be switched to a control voltage ($V_{CTL}$) to provide variable capacitance in response to temperature, or to the lower supply voltage $V_{OSC}$, to effectively minimize their capacitance and be voltage insensitive.

FIG. 34 a block diagram illustrating an exemplary third system 950 embodiment in accordance with the teachings of the present invention. In addition to the features previously discussed, FIG. 34 also illustrates the operating voltage generating circuit 960, which provides the reduced operating voltage, via band-gap voltage generator 575, operational amplifier 963, capacitor 964, and a programmable/configurable voltage divider 962. A control voltage generator 640A is also illustrated, with an additional capacitor 651, providing a temperature-dependent control voltage. A reference signal generator 100, 200, 200A, 300, 300A, 400, 400A, 500, 500A, 600, 600A (as a "CMOS harmonic oscillator" or "CHO") is also coupled to square wave generator and/or divider circuit 910, 915, which generate a single-ended reference signal from a differential signal (D2S block 911) and generate a second reference signal having a frequency which is a rational fraction of the (resonant) frequency of the first reference signal from the reference signal generator 100, 200, 200A, 300, 300A, 400, 400A, 500, 500A, 600, 600A. The single-ended, lower frequency reference signal is provided to a buffer/driver circuit 955, for output as a reference signal.

Integrated circuits embodying the reference signal generator 600 and system 950 have been empirically tested, with very impressive and favorable results, illustrated in Table I, operating at 24 MHz.

TABLE I

|  | Reference Signal Generator 600; System 950 | Crystal Oscillator (XO) | Crystal Oscillator coupled to 1x PLL |
|---|---|---|---|
| Phase Noise, 1 kHz to 1 MHz | −65 dB to −140 dB | −80 dB to −140 dB | −80 dB to −125 dB |
| Rise/Fall times | 1.49 ns | 3.03 ns | 1.36 ns |
| Normalized Frequency Inaccuracy over Temperature | Sufficient for error within 100 ppm | Sufficient for error within 100 ppm | Sufficient for error within 100 ppm |

The reference signal generator 600 and system 950 had phase noise which closely tracked the phase noise of the crystal oscillator and, at high frequencies, had the same phase noise as the crystal oscillator. The reference signal generator 600 and system 950 also provided significantly better performance than the Crystal Oscillator coupled to 1×PLL, which showed significant phase noise above 20-30 kHz. The reference signal generator 600 and system 950 also provided the best period jitter, measured as the standard deviation over 20,020 periods. In addition, over a significant temperature range, the reference signal generator 600 and system 950 provided a frequency accuracy sufficient for error within 100 ppm.

Figure 35:
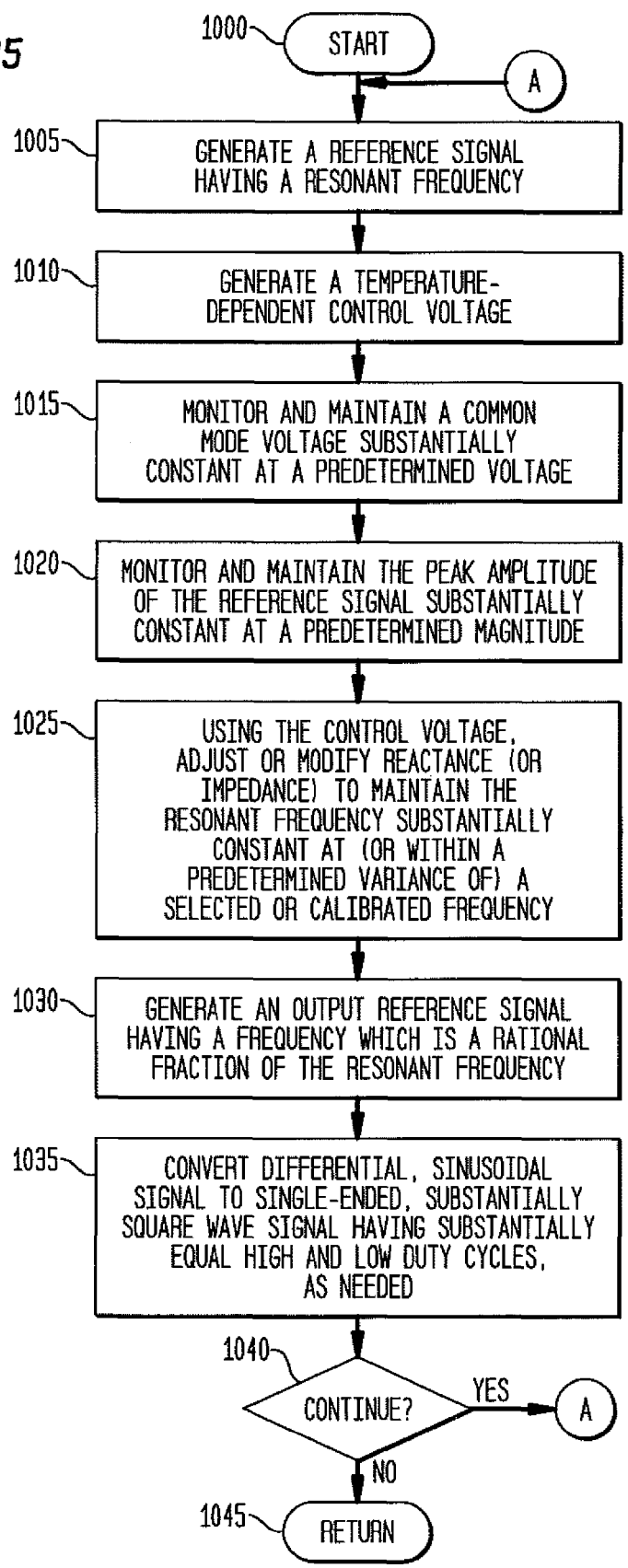
FIG. 35 is a flow diagram illustrating an exemplary method embodiment in accordance with the teachings of the present invention.

FIG. 35 is a flow diagram illustrating an exemplary method embodiment in accordance with the teachings of the present invention. While illustrated in FIG. 35 as successive steps, those of skill in the art will recognize that many of the steps may and most likely will occur concurrently, particularly at steady-state. The method begins, start step 1000, with generating a first reference signal having a resonant frequency, step 1005. A temperature-dependent control voltage is generated, step 1010. A common mode voltage is monitored and maintained substantially constant at (or within a first predetermined variance of) a predetermined voltage, step 1015. A peak amplitude of the first reference signal is monitored, and its magnitude is maintained substantially constant at (or within a second predetermined variance of) a predetermined magnitude, step 1020. Using the temperature-dependent control voltage, selected reactances (or impedances) are adjusted or modified to maintain the resonant frequency substantially constant at (or within a third predetermined variance of) a calibrated, selected, or otherwise predetermined frequency, step 1025. An output (or second) reference signal is generated, having a frequency which is a rational fraction of the resonant frequency, step 1030. As may be necessary or desirable, a differential, sinusoidal signal may be converted to a single-ended, substantially square wave signal having substantially equal high and low duty cycles, step 1035. When the method is to continue, step 1040, the method returns to step 1005, and otherwise the method may end, return step 1045.

Alternative embodiments may be implemented which provide other or additional methods of temperature compensation, to maintain a selected or resonant frequency within a predetermined variance over or during a variation in ambient or operating temperature (within a predetermined range), in addition to the use of a temperature-dependent control voltage discussed above. For example, a selected or resonant frequency (or center frequency for spread-spectrum applications) may be maintained substantially constant over such a temperature variation, using any of the various reactance-resistance modules 337 or resistance modules 338 illustrated and discussed below with reference to FIGS. 37-46, without any requirement for generating such a temperature-dependent control voltage, and may be utilized in lieu of or in addition to other types of controlled reactance modules, such as modules 830 or 870, for example and without limitation. In various embodiments, the reactance-resistance modules 337 are utilized instead of modules 485, 830, 835, 860, and 875, while in other embodiments, reactance-resistance modules 337 are utilized in addition to these other types of controlled reactance modules. In another alternative embodiment, resistance modules 338 may be utilized separately or in conjunction with any of these various controlled reactance modules, such as modules 830 or 870, or reactance-resistance modules 337.

Instead of attempting to reduce or minimize resistance to maintain a comparatively high Q, in accordance with the exemplary embodiments, any of a plurality of types of resistances are introduced (typically during a temperature calibration process) which exhibit a frequency response to temperature (also referred to as a frequency temperature dependence) that offsets the frequency response to temperature (frequency temperature dependence) of the various reactive components of the oscillator (210, 310) or resonator (320), such as any of the various capacitors or inductors. (As used herein, "resistance" should be understood to mean and include, more generally, the real or resistance component of any impedance of any kind.) While this may seem counter-intuitive because of the potential effect of reducing the overall Q of the oscillator (210, 310), it has a benefit of creating a substantially "flat" frequency response of the oscillator (210, 310) over variations of temperature within a predetermined range, such that the selected resonant or center frequency is substantially constant or otherwise stable over such temperature variations. Even with the potential reduction in Q by coupling a resistive component to the oscillator (210, 310), given that the oscillator (210, 310) generally still has a sufficiently high Q for many if not all applications, the substantially flat frequency response over temperature variation is highly beneficial and provides greater system resiliency, robustness, and overall greater performance, while simultaneously using lower power potentially compared to the power utilized to generate a temperature-dependent control voltage ($V_{CTL}(T)$), for example.

For these embodiments, the apparatuses and systems are calibrated over temperature variation, with different types and/or amounts of resistances (resistors or more generally, the real component of any impedance) selected during calibration to offset or cancel any potential frequency changes which would otherwise occur due to a temperature dependence of other components, resulting in a substantially stable resonant (or center) frequency $f_0$ over variations in operating temperature. Using either or both reactance-resistance modules 337 or controlled reactance modules 335, the amounts of reactance (such as fixed or variable capacitances) are selected during a frequency calibration process, to provide the selected or desired resonant frequency $f_0$ (or center frequency), respectively either with the various resistances or separately without the various resistances. In other exemplary embodiments, different types and/or amounts of resistances (without a reactance component, such as a capacitor), may be selected jointly (as part of reactance-resistance modules 337) or separately (via resistance modules 338) to provide temperature calibration, with exemplary resistance modules 338 illustrated in and discussed below with reference to FIG. 47. As previously mentioned as an example, an inductor (e.g., 435) typically exhibits a first, negative temperature dependence which, without temperature compensation, would result in a decrease in the resonant or center frequency with increasing temperature. Similarly, various types of capacitances and resistances may be selected which typically exhibit (jointly or severally) a second, positive temperature dependence which, without temperature compensation, would provide an increase in the resonant (or center) frequency with increasing temperature. Or more generally, a first resonator component typically exhibits a first, negative or positive temperature dependence which, without temperature compensation, would result in a decrease or increase in the resonant or center frequency with increasing temperature. Similarly, various types of other components, such as capacitances and resistances may be selected which typically exhibit (jointly or severally) a second, opposing (positive or negative) temperature dependence which, without temperature compensation, would provide an increase or decrease in the resonant (or center) frequency with increasing temperature. Accordingly, for a given resonant (or center) frequency $f_0$ and a selected or given inductance, resistances and/or both reactances and resistances are selected to provide an offsetting or cancelling temperature dependence, as a calibrated form of temperature compensation, such that the resulting resonant (or center) frequency $f_0$ is substantially stable over a predetermined range of temperature variation.

In this way, resistive and reactive components are selected during a temperature calibration process to provide offsetting or cancelling temperature dependencies throughout a predetermined range, resulting in an apparatus and/or system having a selected resonant (or center) frequency $f_0$ which is substantially constant or stable, within a predetermined variance or other error specification, over temperature variation within the predetermined range. Such a temperature calibration process may be performed jointly with or separately from a frequency calibration process utilized to select or determine the resonant (or center) frequency $f_0$. An exemplary temperature calibration process is discussed in greater detail below with reference to FIG. 48.

Figure 37:
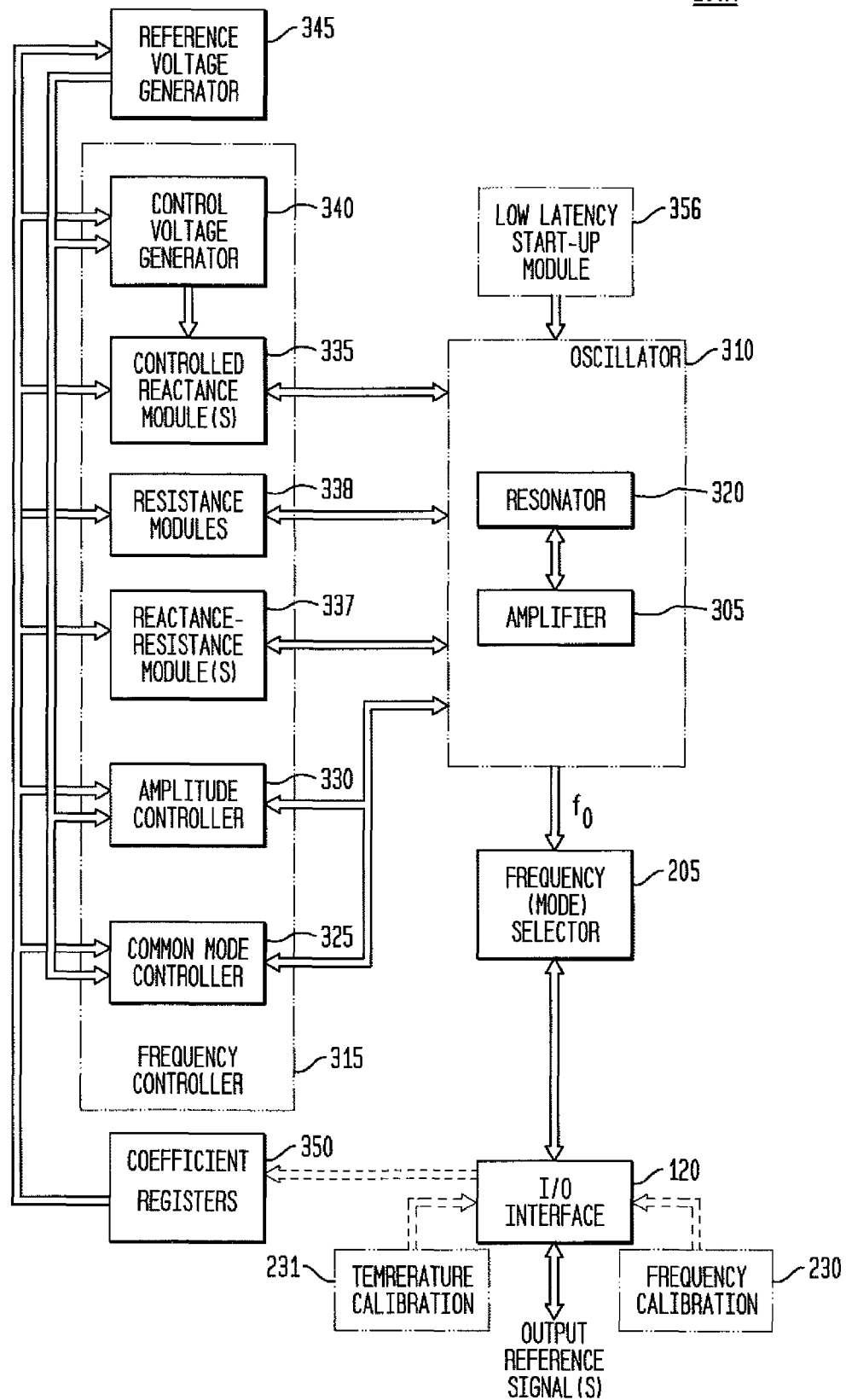
FIG. 37 a block diagram illustrating in greater detail an exemplary sixth apparatus embodiment in accordance with the teachings of the present invention.

FIG. 37 a block diagram illustrating in greater detail an exemplary sixth apparatus 200A embodiment in accordance with the teachings of the present invention. As mentioned above, the exemplary sixth apparatus 200A is similar to apparatus 200, but includes reactance-resistance modules 337 (illustrated as "$C_R(T)$") and/or resistance modules 338 (illustrated as "R(T)") to provide temperature compensation, in addition to or in lieu of the provision of a temperature-dependent control voltage by control voltage generator 340. In addition, temperature calibration module or block 231 may be provided within or separately from the apparatus 200A (i.e., on or off the IC having the apparatus 200A) which, as mentioned above, is utilized to select the types and/or amounts of resistance which is attached to the resonator 320 (or more generally, the oscillator 310) to provide the substantially flat frequency response over temperature variation within a predetermined range.

Figure 38:
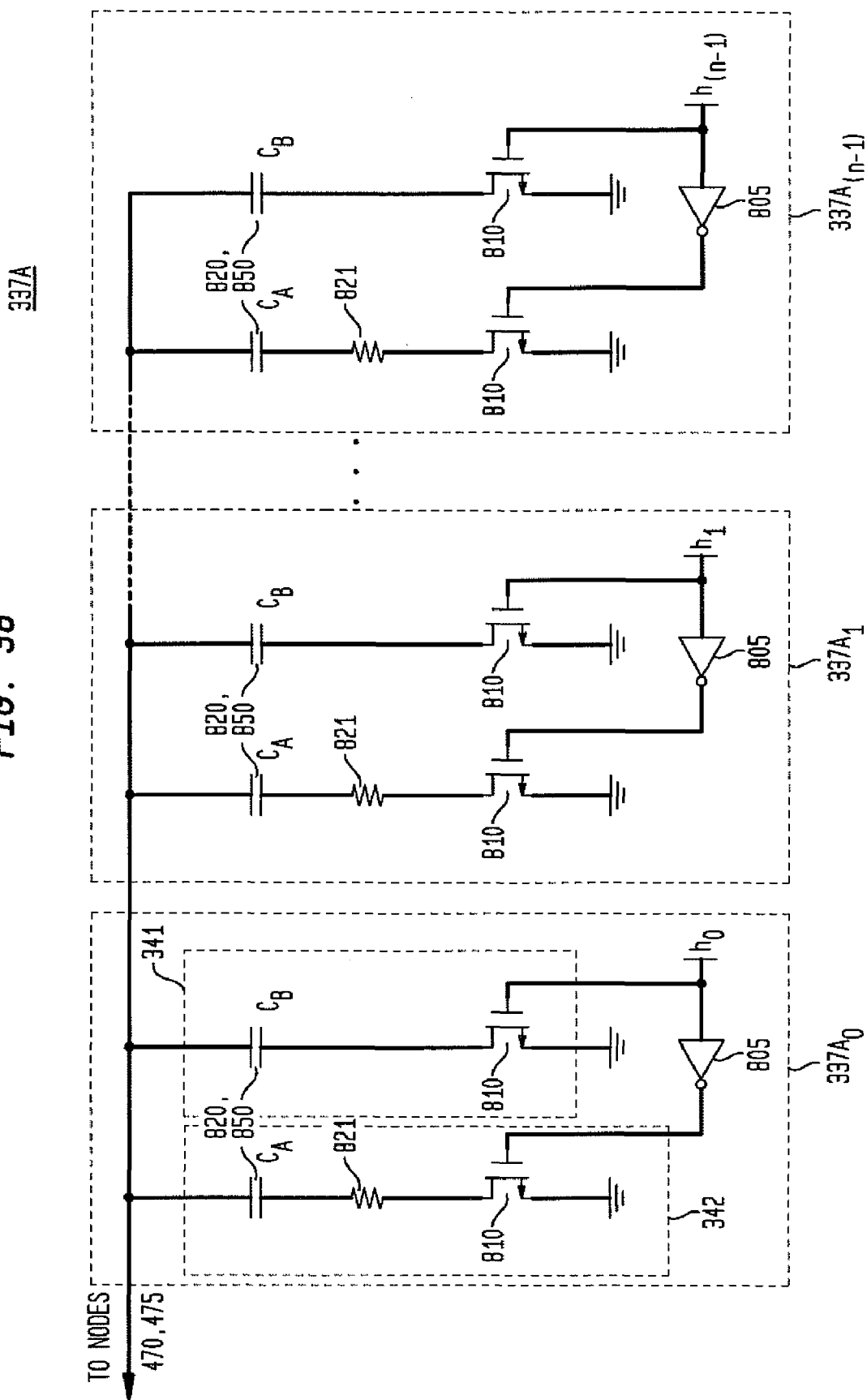
FIG. 38 is a circuit diagram illustrating exemplary first reactance-resistance modules utilized in accordance with the teachings of the present invention.
Figure 39:
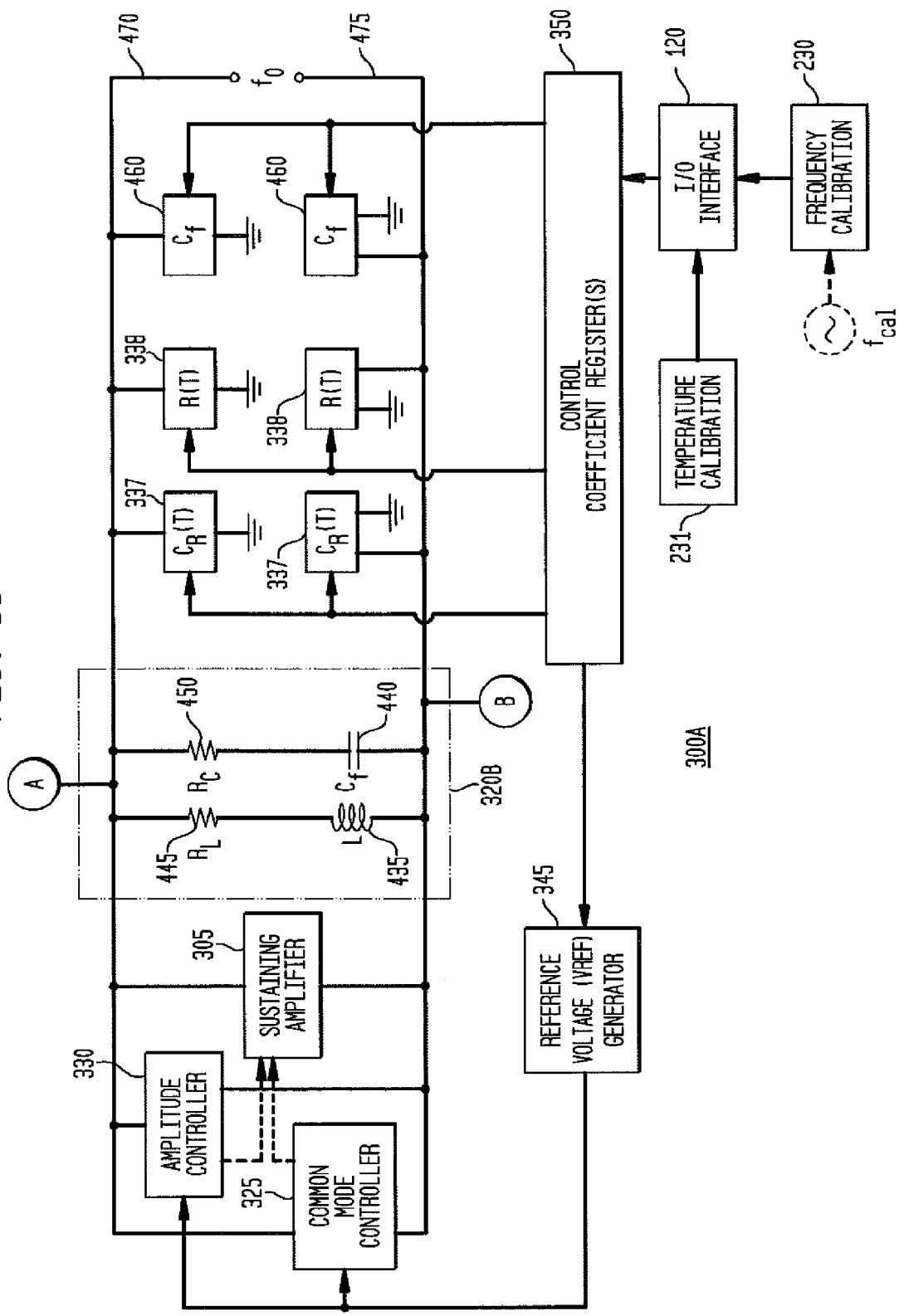
FIG. 39 is a high-level circuit and block diagram illustrating in greater detail an exemplary seventh apparatus embodiment and additional exemplary embodiments of a resonator, controlled reactance modules, reactance-resistance modules, resistance modules, a temperature calibration module, and a frequency calibration module in accordance with the teachings of the present invention.
Figure 40:
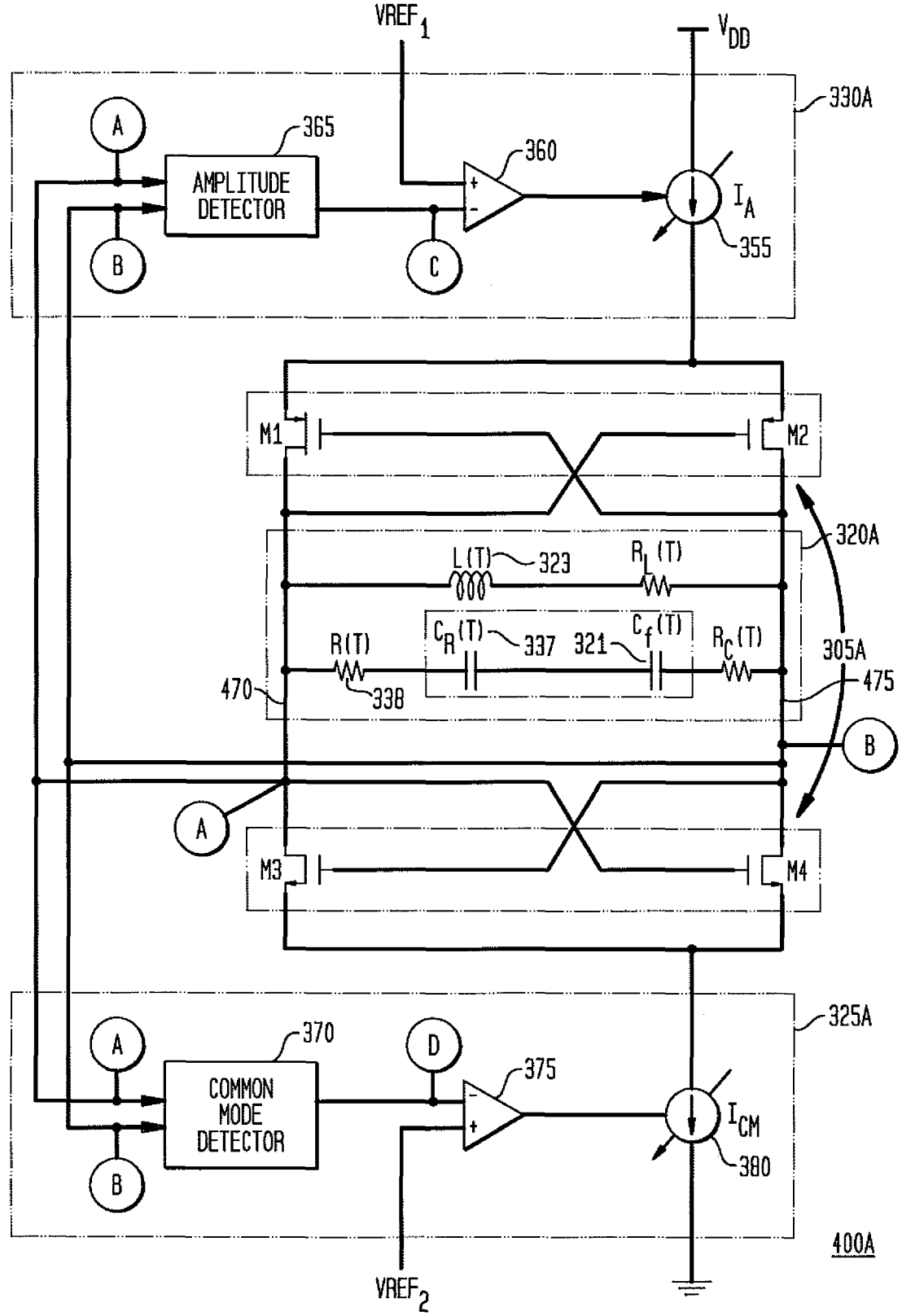
FIG. 40 is a circuit and block diagram illustrating an exemplary eighth apparatus embodiment in accordance with the teachings of the present invention.
Figure 41:
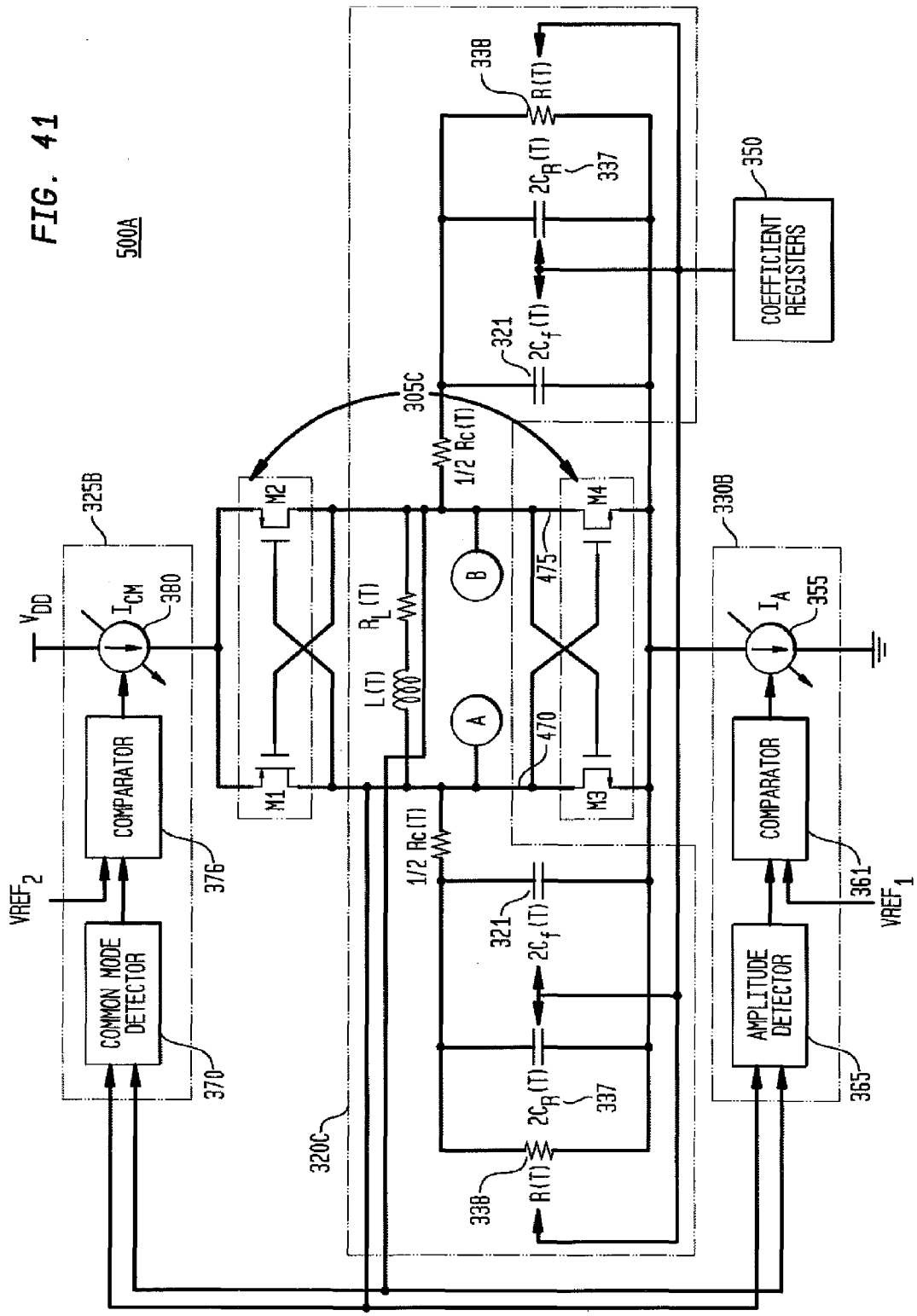
FIG. 41 is a circuit and block diagram illustrating an exemplary ninth apparatus embodiment in accordance with the teachings of the present invention.
Figure 42:
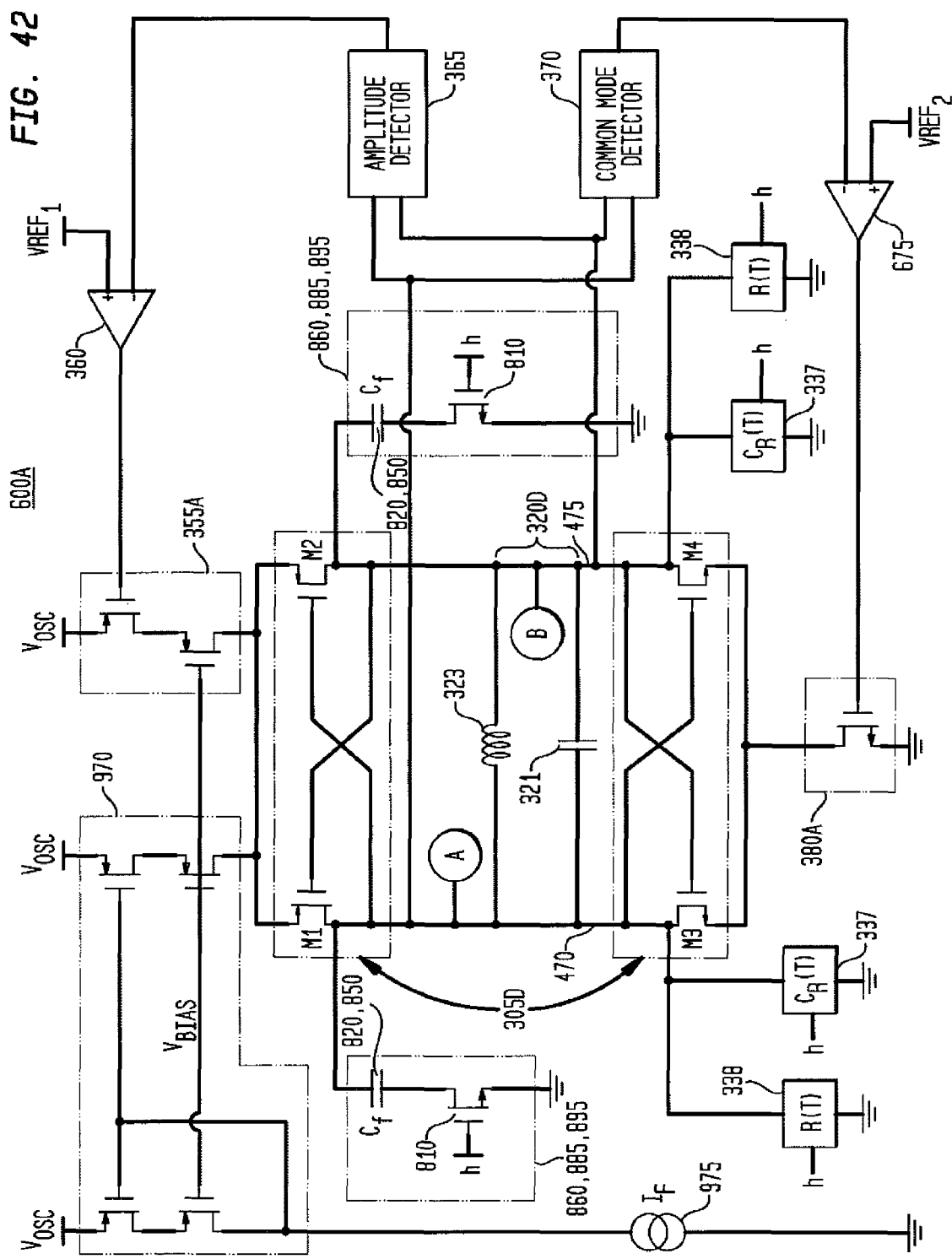
FIG. 42 is a circuit and block diagram illustrating an exemplary tenth apparatus embodiment in accordance with the teachings of the present invention.

FIG. 38 is a circuit diagram illustrating exemplary first reactance-resistance modules 337A utilized in accordance with the teachings of the present invention, with a separate first reactance-resistance module 337A coupled to each side of the resonant LC tank 320 (e.g., nodes "A" and "B" or lines 470 and 475) for a balanced configuration. As illustrated, the reactance-resistance modules 337A are comprised of a bank or array of a plurality (n) of switchable reactances and resistances (reactance-resistance modules $337A_0$ through $337A_{(n-1)}$), having differently-weighted fixed capacitors ($C_f$) 820, 850, which may have any type of weighting (e.g., binary, unit-cell, etc.), and having resistors 821, which may be any type of resistances, may be differentially-weighted (having different amounts of resistance), and may be selected based on its temperature response. Any type of fixed capacitors 820, 850 may be utilized; and the fixed capacitors ($C_f$) 820 also may be implemented as varactors coupled to a selected voltage. Each reactance-resistance module 337A has an identical circuit layout, and each differs by a weighting of the capacitance (as discussed above for other exemplary embodiments) and/or the weighting and temperature response of the resistance. The resistors 821 may be implemented to have different frequency temperature responses, based upon the composite material, doping, and size, for example and without limitation, and may be implemented to have different amounts of resistance, using any of the weighting schemes (as discussed above for capacitances).

Within each reactance-resistance module 337A, each of the fixed capacitances $C_A$ and $C_B$ (820, 850) are equal, with one or the other (but not both) coupled to the resonator 320, such that the resonant or center frequency $f_0$ is not changed substantially by switching (via transistor 810) one or the other into the circuit, using switching coefficients $h_0$ though $h_{(n-1)}$. In series with the capacitance $C_A$ (as a module or branch 342 of a reactance-resistance modules 337A), however, is a resistance (illustrated as resistor 821), such that either both the capacitor $C_A$ (820, 850) and resistor 821 are switched (and thereby coupled) to the resonator 320, or just the capacitor $C_B$ (820, 850) is switched (and thereby coupled) to the resonator 320. For example, in the selected embodiment, for a given or selected module 337A, when its corresponding "h" coefficient is a logic high (or high voltage), the corresponding fixed capacitance $C_B$ is switched into the circuit and the corresponding capacitance $C_A$ and series resistance (821) is switched out of the circuit, and when its corresponding "h" coefficient is a logic low (or low voltage), the corresponding fixed capacitance $C_B$ is switched out of the circuit and the corresponding capacitance $C_A$ and series resistance (821) is switched into the circuit and coupled to the resonator 320.

It should be noted, in this exemplary embodiment, by switching in or out the fixed capacitance $C_A$ or $C_B$, the overall amount of capacitance remains comparatively stable, while the amount of resistance coupled to the resonator 320 changes and, correspondingly, the amount or degree of temperature-dependence of the reactance-resistance module 337A which, in turn, affects the amount or degree of temperature-dependence of the frequency of the resonator 320. For example, with increasing amounts of resistance (821) having a second, positive temperature dependence, the reactance-resistance module 337A provides a greater cancellation or offsetting of a first, negative temperature dependence of other components coupled to or comprising the resonator 320, such as a negative temperature dependence of an inductor (435), thereby adjusting the frequency response of the tank or other oscillator in response to temperature variation. Accordingly, for a given resonant (or center) frequency $f_0$ and a selected or given inductance, resistances and/or both reactances and resistances are selected (through calibration of the "h" coefficients) to provide an offsetting or cancelling temperature dependence, as a calibrated form of temperature compensation, such that the resulting resonant (or center) frequency $f_0$ is substantially stable over a predetermined range of temperature variation.

Figure 46:
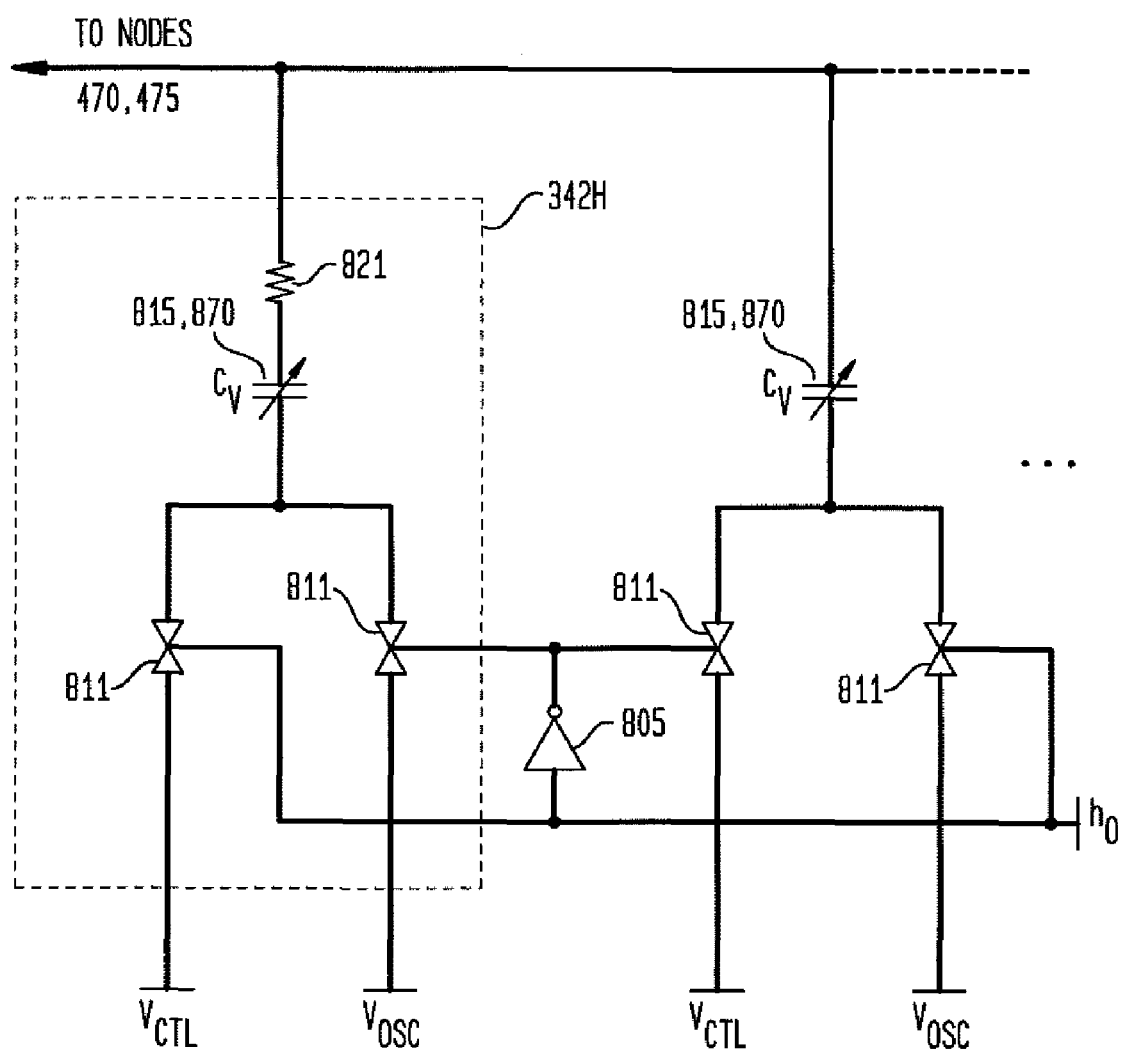
FIG. 46 is a circuit diagram illustrating exemplary third reactance-resistance modules utilized in accordance with the teachings of the present invention.

In exemplary embodiments, any of various different types of capacitors (820, 850) may be utilized, such as metal insulator metal (MiM), metal oxide metal (MoM), poly insulator poly (PiP), MOS and/or AMOS capacitors, varactors (e.g., as illustrated in FIG. 46), reverse-bias diode varactors, etc., for example and without limitation. Similarly, any conducting layer in silicon (or other type of wafer) can function as a resistance such as resistor 821, including a diffusion layer (n+ or p+ doped or undoped, silicided or unsilicided), silicide, well resistors (n or p), a polysilicon (poly) layer (doped or undoped, silicided or unsilicided), a high resistance polysilicon, an intermetal and/or top metal layer (forming metallic resistors), local interconnect, etc., also for example and without limitation. Typically, for a given process technology, the frequency temperature response of a resistor (821) may be well-characterized, well behaved, and tunable, to have either a first, negative temperature dependence or a second, positive temperature dependence, and further to select the amount (or slope) of resulting change in frequency (or resistance) with temperature. For example, using any of the various materials and dopants discussed above, a wide range of temperature compensation (or temperature coefficients) for a resistance may be implemented and/or selected, including forming compound resistances comprised of a plurality of types of resistances and/or forming compound capacitances comprised of a plurality of types of capacitances, and combinations of both capacitances and resistances, to thereby adjust the overall frequency (or resistance) response over temperature variation to any desired or selected level (presumably within manufacturing tolerances and variability).

FIGS. 39-42 are diagrams illustrating additional apparatus embodiments which comprise reactance-resistance modules 337 and/or resistance modules 338, in addition to the other components previously discussed. These various embodiments function as previously discussed with reference to FIGS. 4-6 and 33, except insofar as temperature compensation is provided using reactance-resistance modules 337 and/or resistance modules 338 as discussed above and as further discussed below, instead of temperature compensation using a temperature-dependent control voltage.

Figure 43:
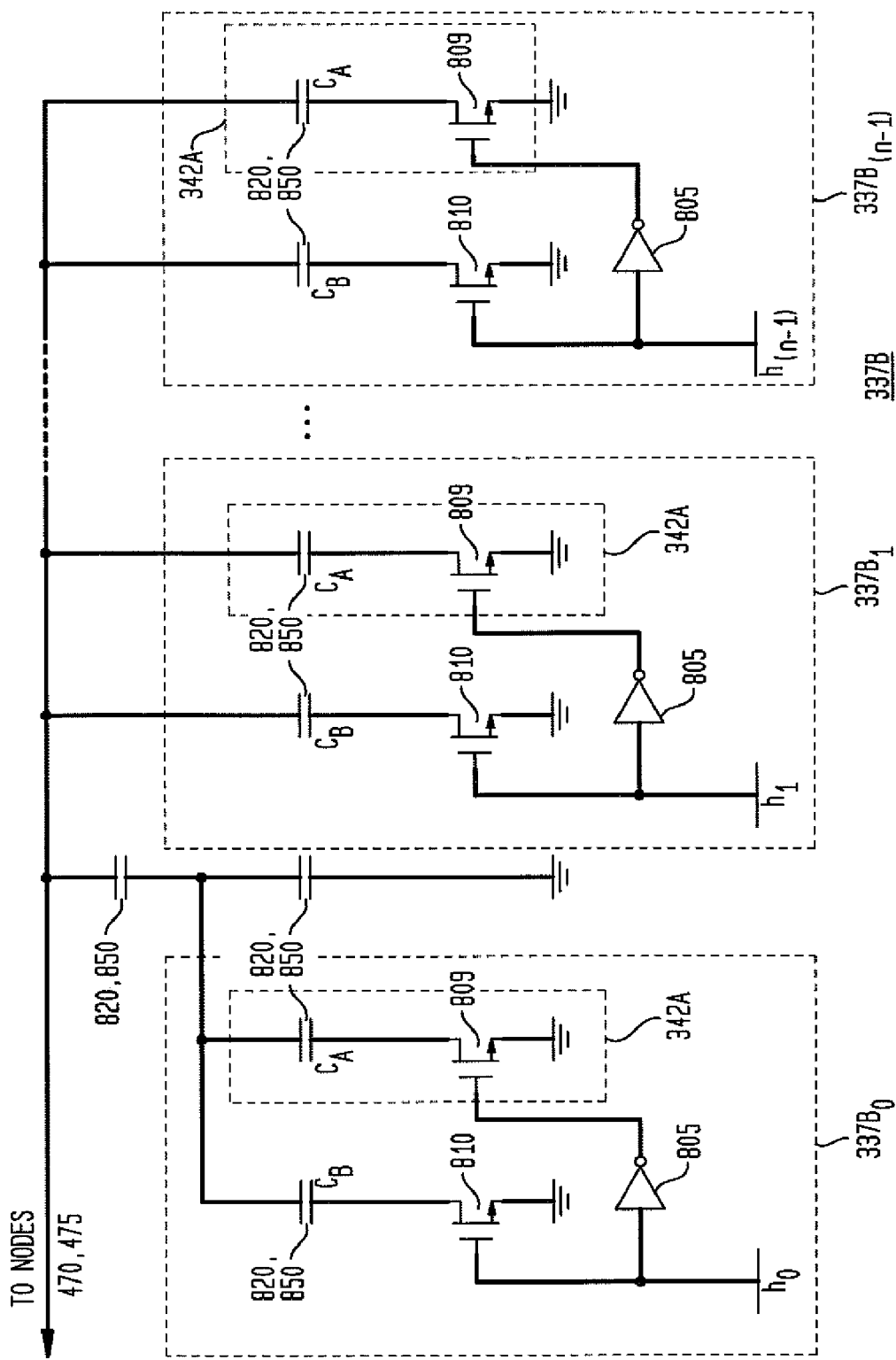
FIG. 43 is a circuit diagram illustrating exemplary second reactance-resistance modules utilized in accordance with the teachings of the present invention.

FIG. 43 is a circuit diagram illustrating exemplary second reactance-resistance modules 337B utilized in accordance with the teachings of the present invention. As mentioned above, typically a transistor 810 is configured to have an effectively or generally minimal resistance (for the selected type, composition and fabrication method) when it is (fully) on and conducting is referred to herein as a "nominal" resistance, such that when on and conducting, it adds a nominal or minimal resistance to the resonator 320. In contrast, a transistor 809 is configured to have an on resistance which is substantially or comparatively greater than such a nominal resistance, providing the equivalent functionality of both a separate resistor (e.g., 821) in series with a transistor 810. For example and without limitation, such a transistor 809 may be designed to have a comparatively small width/length ratio, or other parameters may be adjusted (such as the various materials, doping, and other compositions discussed above for resistances generally), thereby providing a comparatively higher on resistance.

It also should be noted, in this exemplary embodiment, by switching in or out the fixed capacitance $C_A$ or $C_B$, the overall amount of capacitance remains comparatively stable, while the amount of resistance coupled to the resonator 320 changes (via resistor 809 or 810, but not both, being on and conducting) and, correspondingly, the amount or degree of temperature-dependence of the reactance-resistance module 337B which, in turn, affects the amount or degree of temperature-dependence of the frequency of the resonator 320. For example, with increasing amounts of resistance (due to transistors 809 being on and conducting) having a second, positive temperature dependence, the reactance-resistance module 337B provides a greater cancellation or offsetting of a first, negative temperature dependence of other components coupled to or comprising the resonator 320, such as a negative temperature dependence of an inductor (435), thereby also adjusting the frequency response of the tank or other oscillator in response to temperature variation.

Figure 44:
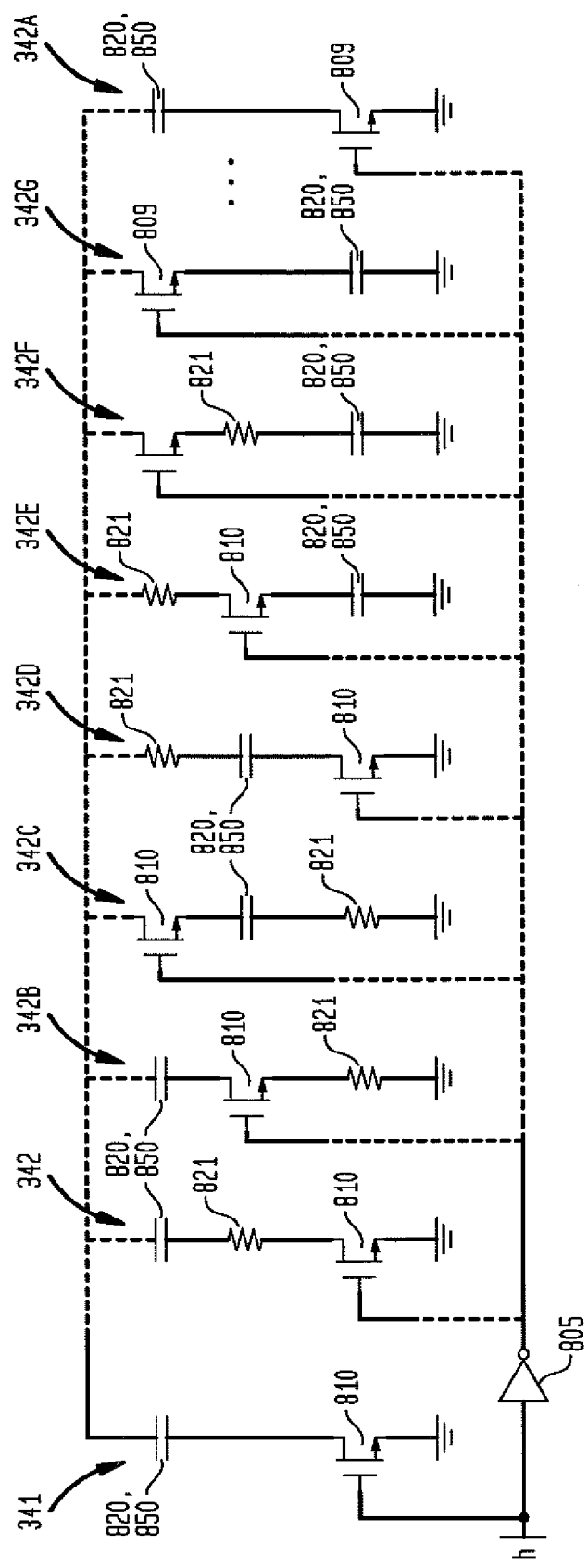
FIG. 44 is a circuit diagram illustrating a plurality of circuit variations for reactance-resistance modules utilized in accordance with the teachings of the present invention.
Figure 45:
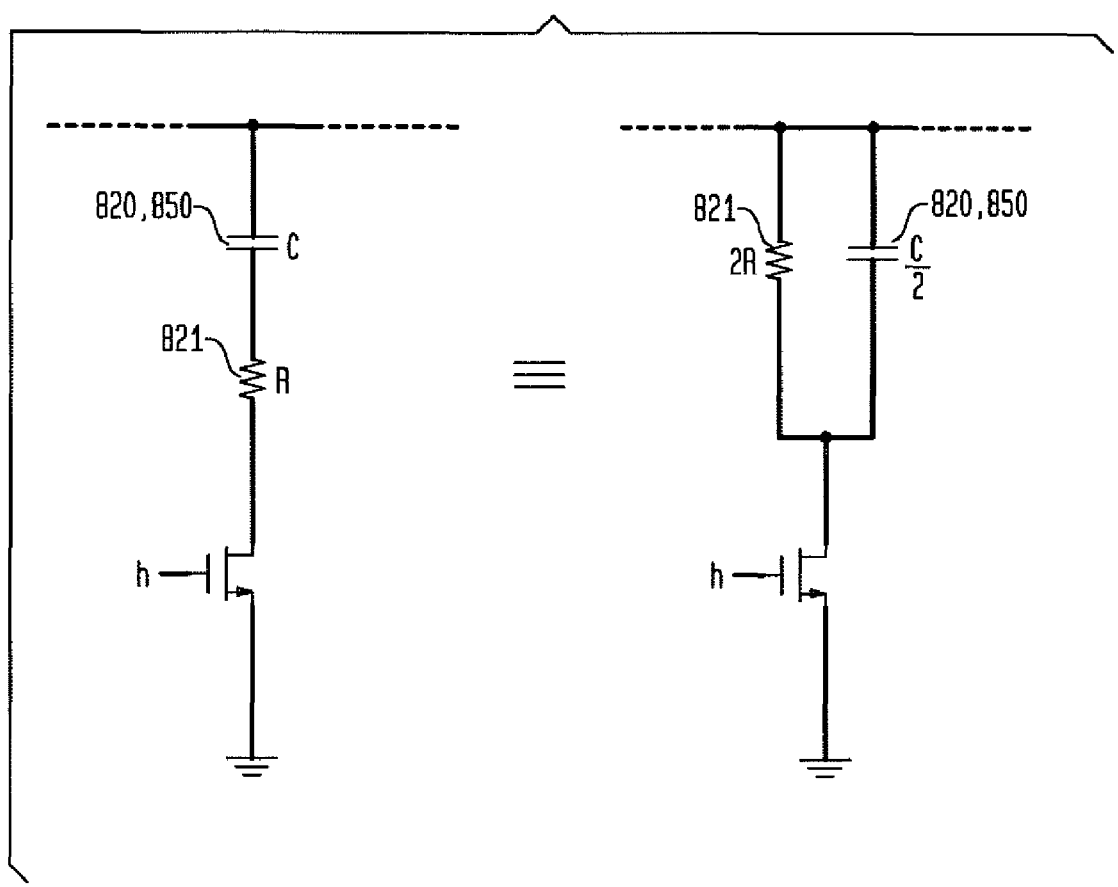
FIG. 45 is a circuit diagram illustrating an equivalent parallel circuit variation for reactance-resistance modules utilized in accordance with the teachings of the present invention.

FIG. 44 is a circuit diagram illustrating a plurality of circuit variations for the reactive-resistance portion (as a module or branch 342) of a reactance-resistance module 337 utilized in accordance with the teachings of the present invention. As illustrated in modules or branches 342 and variations 342A-342G, the various series-coupled capacitance (820, 850), transistor 810 and resistance 821 or transistor 809, may have any configuration, in any combination and in any order. In addition, for each such series circuit configuration, there is an equivalent parallel circuit configuration, as illustrated in FIG. 45 for the module or branch 342.

In addition, using such an equivalent parallel circuit, it can be shown that the temperature compensation (or temperature coefficient) of a capacitor ("TC(C)") opposes the temperature compensation (or temperature coefficient) or a resistance ("TC(R)") for a given frequency "ω", such that (Equation 1):

$$TC(C) = \frac{-2(RC\omega)^2}{1+(RC\omega)^2} TC(R).$$

Accordingly, for capacitance C which is utilized to provide a selected or given frequency ω, a resistance R may be selected such that (Equation 2):

$$R \cong \frac{1}{C\omega}.$$

It should also be noted that, in addition to controlled capacitance modules, any of the various reactance-resistance modules 337 and resistance modules 338 may also be implemented or configured to have a divider structure, such as that illustrated in FIG. 36, to also provide a comparatively more fine-grained tuning of the resonator 320.

FIG. 46 is a circuit diagram illustrating an exemplary third reactance-resistance module 337C utilized in accordance with the teachings of the present invention. In this embodiment, a variable capacitance (illustrated as varactor $C_v$ 815, 870) may be utilized, rather than a fixed capacitance. Instead of switches or transistors 810, switches 811 are implemented as pass or transmission gates, and serves to illustrate that any type of switching mechanism may be utilized equivalently within the scope of the present invention. The illustrated module 337C providing a switchable variable capacitances may be switched to a control voltage ($V_{CTL}$) or to another predetermined voltage level to provide a selectable, variable capacitance, or to the lower supply voltage $V_{OSC}$, to effectively minimize their capacitances and be voltage insensitive. As previously discussed, a resistance 821 may be coupled to the resonator 320 and, correspondingly, thereby changes the amount or degree of temperature-dependence of the reactance-resistance module 337C which, in turn, affects the amount or degree of temperature-dependence of the frequency of the resonator 320. Not separately illustrated, a plurality of reactance-resistance module 337C may be utilized, and may be differentially weighted, etc., as discussed above for the other various embodiments.

Figure 47:
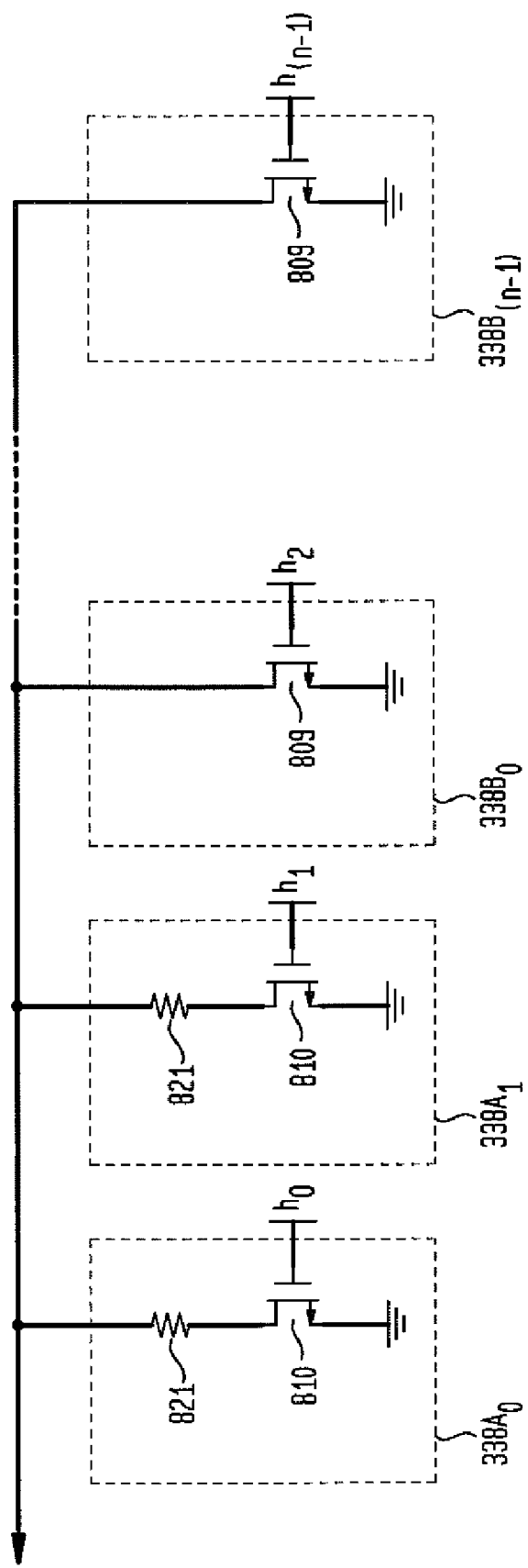
FIG. 47 is a circuit diagram illustrating exemplary resistance modules utilized in accordance with the teachings of the present invention.

FIG. 47 is a circuit diagram illustrating exemplary resistance modules 338A and 338B which may be utilized in accordance with the teachings of the present invention. As discussed above, such resistance modules 338 may be utilized to selectively switch any of various types and/or amounts of resistances (821 or as included in transistor 809) to the resonator 320, and may be utilized instead of or in addition to reactance-resistance modules 337. For example, resistance modules 338 may be utilized in exemplary embodiments in conjunction with other capacitance modules, such as controlled reactance modules 335, without utilization of reactance-resistance modules 337. Correspondingly and as discussed above, switching additional resistance to the resonator 320 changes the amount or degree of temperature-dependence of the frequency of the resonator 320. For example, with increasing amounts of resistance (due to transistors 809 or 810 being on and conducting) having a second, positive temperature dependence, the resistance module 338 provides a greater cancellation or offsetting of a first, negative temperature dependence of other components coupled to or comprising the resonator 320, such as a negative temperature dependence of an inductor (435), thereby also adjusting the frequency response of the resonator 320 or other oscillator in response to temperature variation.

Figure 48:
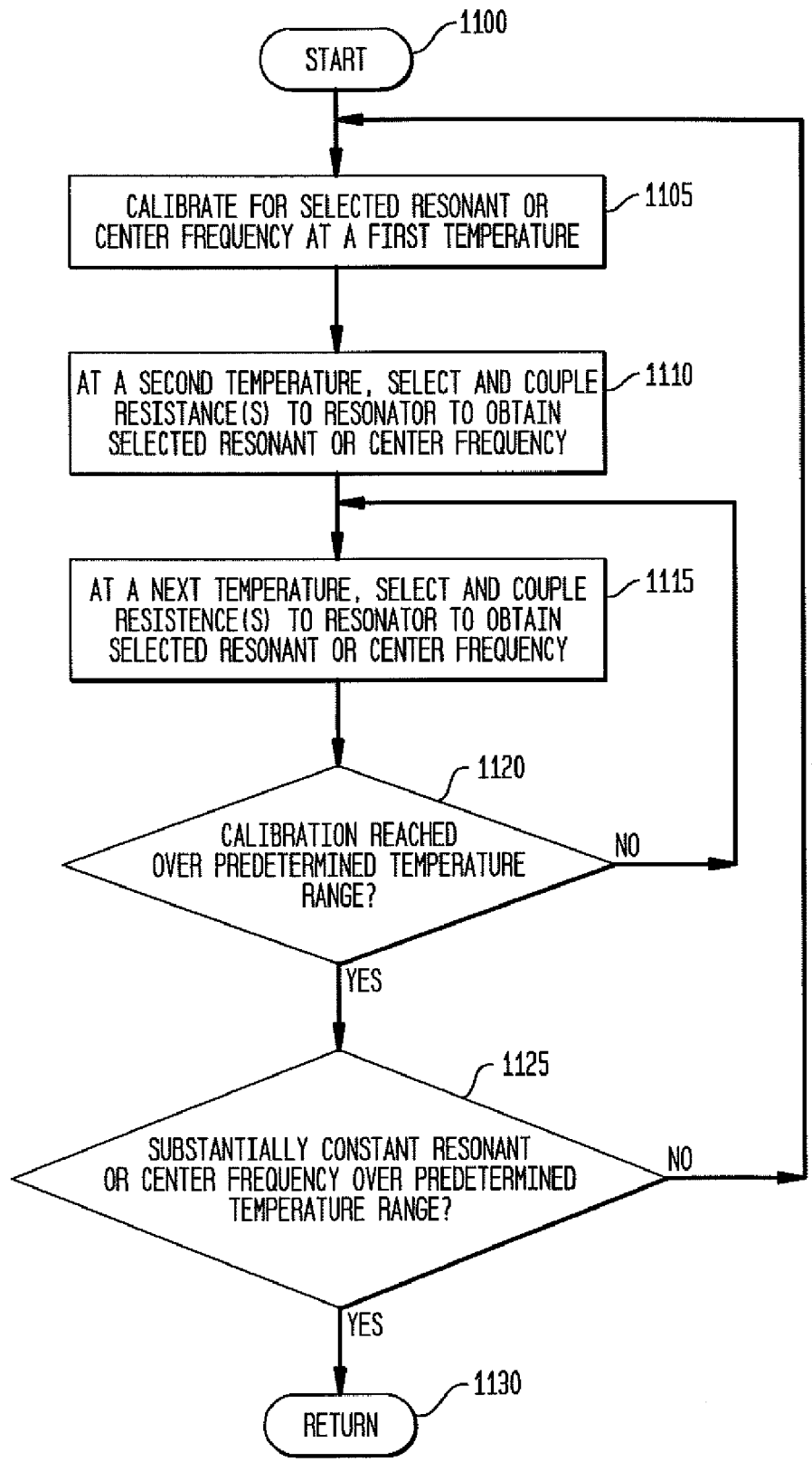
FIG. 48 is a flow chart illustrating an exemplary temperature calibration method utilized in accordance with the teachings of the present invention.

FIG. 48 is a flow chart illustrating an exemplary temperature calibration method utilized in accordance with the teachings of the present invention. Beginning with start step 1100, the method calibrates a resonator (320) (of a reference signal generator (100, 200, 200A, 300, 300A, 400, 400A, 500, 500A, 600, 600A)) for a selected resonant or center frequency $f_0$ at a first temperature, step 1105. At a second temperature, the method selects and couples one or more resistances to the resonator to obtain or maintain the selected resonant or center frequency $f_0$, step 1110. At a next temperature, the method selects and couples (or decouples) one or more resistances to the resonator to obtain or maintain the selected resonant or center frequency $f_0$, step 1115. The method determines whether the calibration has occurred over a predetermined temperature range, step 1120. When the calibration has not yet occurred over the predetermined temperature range in step 1120, the method returns to step 1115, and at a next temperature, the method selects and couples (or decouples) one or more resistances to the resonator to obtain or maintain the selected resonant or center frequency $f_0$. When the calibration has occurred over the predetermined temperature range in step 1120, the method determines whether the selected resonant or center frequency $f_0$ is maintained substantially constant over the predetermined temperature range, step 1125, and if so, the method may end, return step 1130. Optionally, when the selected resonant or center frequency $f_0$ has not been maintained substantially constant over the predetermined temperature range in step 1125, the method returns to step 1105 and iterates, as may be necessary or desirable for a selected accuracy or tolerance level.

Various inductances (e.g., inductor 435, 323) and other components of a reference signal generator (100, 200, 200A, 300, 300A, 400, 400A, 500, 500A, 600, 600A) are typically implemented as a coiled structure which has electrical and magnetic fields which, if perturbed, may change the nature of the inductance and thereby affect and potentially change the resonant or center frequency $f_0$. For example and without limitation, the electromagnetic field from an inductor (435, 323) may induce eddy currents in other nearby components. In addition, also for example and without limitation, there may be other associated parasitics from components within the reference signal generator (100, 200, 200A, 300, 300A, 400, 400A, 500, 500A, 600, 600A), including parasitic capacitances, which also may change the nature of the overall capacitance and thereby also affect and potentially change the resonant or center frequency $f_0$.

In accordance with various exemplary embodiments, various features are implemented in the IC fanning the reference signal generator (100, 200, 200A, 300, 300A, 400, 400A, 500, 500A, 600, 600A) to address these frequency issues. In a first exemplary embodiment, a coating is applied to the top surface of the IC which may serve to change the relative permittivity ($\in_R$) and the corresponding inductances and capacitances, and which further may have a temperature dependence. Accordingly, a material may be selected for application to the top surface of the IC forming the reference signal generator (100, 200, 200A, 300, 300A, 400, 400A, 500, 500A, 600, 600A) having a selected temperature dependence and dielectric constant, which then modifies the parasitic capacitances that would otherwise occur, and thereby serves to diminish to some degree potential frequency changes which would otherwise occur due to a temperature dependence of these components, also serving to provide a substantially stable resonant (or center) frequency $f_0$ over variations in operating temperature. In accordance with various exemplary embodiments, the relative permittivity of the device and/or its components may be modulated to influence the frequency response of and tune the reference signal generator (100, 200, 200A, 300, 300A, 400, 400A, 500, 500A, 600, 600A).

Such modulation may be done statically, such as during or after fabrication, such as through application of a coating, or may be done dynamically, during operation of the reference signal generator (100, 200, 200A, 300, 300A, 400, 400A, 500, 500A, 600, 600A). Dynamic modulation, for example and without limitation, may be performed electrically, as these various materials may have variable properties under different electrical fields, for example.

It should also be noted that corresponding magnetic properties may be similarly controlled statically or dynamically. In accordance with additional exemplary embodiments, the relative permeability of the device and/or its components also may be modulated to influence the frequency response of and tune the reference signal generator (100, 200, 200A, 300, 300A, 400, 400A, 500, 500A, 600, 600A).

In various exemplary embodiments, a coating is applied to the top surface of the IC. Prior to such coating, an etching process also may be performed as an option, to potentially increase the ability of the coating to surround and penetrate between the various metal coils comprising an inductor (435, 323).

Exemplary coatings which may be utilized include, for example and without limitation: silicone; benzocyclobutane (BCB); polybenzoxazole (PBO); cyclotenes; polyimides; polyamides; Teflon; spin-on glass ($SiO_2$ in its various forms and compositions, which also may be fluorinated); glass frit; sol gels and sol gel precursors. Such a coating may be applied at the wafer level, for example, or during IC packaging, also for example and without limitation.

It should also be noted that this effect also allows the use of the reference signal generator (100, 200, 200A, 300, 300A, 400, 400A, 500, 500A, 600, 600A) as a sensor. For example, application of a coating which may change its relative permittivity or permeability in response to the presence of a another agency, such as an external substance (e.g. an organic chemical, bacteria, viruses), field, or radiation, will in turn affect the resonant or center frequency $f_0$ provided by the reference signal generator (100, 200, 200A, 300, 300A, 400, 400A, 500, 500A, 600, 600A). The corresponding change in frequency then indicates the presence of this external agency, and the apparatus 100, 200, 200A, 300, 300A, 400, 400A, 500, 500A, 600, 600A performs a sensing function.

In addition to the use of a coating over the top surface if an IC comprising the reference signal generator (100, 200, 200A, 300, 300A, 400, 400A, 500, 500A, 600, 600A), in various exemplary embodiments, a metallization layer is provided on the bottom or underside surface of the IC or die, which tends to provide a degree of isolation for the IC. As an inductor (435, 323) is typically implemented in a top layer of metallization, a metal layer provided on the underside of the IC is sufficiently far enough away from the inductor (435, 323) to avoid interfering with its electronic functions in the reference signal generator (100, 200, 200A, 300, 300A, 400, 400A, 500, 500A, 600, 600A). As another alternative option, such a metal layer may be included within the IC package, rather than applied to the IC die itself.

With the application of such a coating and/or metal layer, any changes in the relative permittivity, permeability, or other properties which could affect the resonant or center frequency $f_0$ are thereby included and accounted for during and as part of the calibration process discussed above. As an additional benefit, such coatings and shielding also serve to prevent, to some degree, packaging-related shifts in selected resonant or center frequency $f_0$ (which might otherwise occur in the packaging process or due to the packaging of the IC itself).

Numerous advantages of the exemplary embodiments of the invention are readily apparent. The exemplary embodiments include a reference signal generator, system and method which provide a superior reference signal. The exemplary apparatus and system are capable of being fully integrated with other electronics. The exemplary reference signal generator and system provides a very accurate reference and/or clock signal, with very low error, very low phase noise and period jitter, and with extremely fast rise and fall times, rendering the exemplary embodiments suitable for highly exacting applications. The exemplary embodiments also provide for accurate frequency control over variable parameters such as temperature, fabrication process variation, and IC aging. The exemplary embodiments also provide for such frequency control over variations in parameters such as temperature through a temperature calibration process and without additional power requirements.

Although the invention has been described with respect to specific embodiments thereof, these embodiments are merely illustrative and not restrictive of the invention. In the description herein, numerous specific details are provided, such as examples of electronic components, electronic and structural connections, materials, and structural variations, to provide a thorough understanding of embodiments of the present invention. One skilled in the relevant art will recognize, however, that an embodiment of the invention can be practiced without one or more of the specific details, or with other apparatus, systems, assemblies, components, materials, parts, etc. In other instances, well-known structures, materials, or operations are not specifically shown or described in detail to avoid obscuring aspects of embodiments of the present invention. In addition, the various Figures are not drawn to scale and should not be regarded as limiting.

Second circuitry 180, 925 may be any type of electronic or microelectromechanical device or circuit, and may include use of a single integrated circuit ("IC"), or may include use of a plurality of integrated circuits or other components connected, arranged or grouped together, such as controllers, microprocessors, digital signal processors ("DSPs"), parallel processors, multiple core processors, custom ICs, application specific integrated circuits ("ASICs"), field programmable gate arrays ("FPGAs"), adaptive computing ICs, associated memory (such as RAM, DRAM and ROM), other ICs and components, with associated memory, such as microprocessor memory or additional RAM, DRAM, SDRAM, SRAM, MRAM, ROM, FLASH, EPROM or $E^2PROM$.

The coefficient register(s) 350, 935 and memory 710 may be embodied in any number of forms, including within any computer or other machine-readable data storage medium, memory device or other storage or communication device for storage or communication of information, currently known or which becomes available in the future, including, but not limited to, a memory integrated circuit ("IC"), or memory portion of an integrated circuit (such as the resident memory within a controller or processor IC), whether volatile or non-volatile, whether removable or non-removable, including without limitation RAM, FLASH, DRAM, SDRAM, SRAM, MRAM, FeRAM, ROM, EPROM or $E^2PROM$, or any other form of memory device, such as a magnetic hard drive, an optical drive, a magnetic disk or tape drive, a hard disk drive, other machine-readable storage or memory media such as a floppy disk, a CDROM, a CD-RW, digital versatile disk (DVD) or other optical memory, or any other type of memory, storage medium, or data storage apparatus or circuit, which is known or which becomes known, depending upon the selected embodiment. In addition, such computer readable media includes any form of communication media which embodies computer readable instructions, data structures, program modules or other data in a data signal or modulated signal, such as an electromagnetic or optical carrier wave or other transport mechanism, including any information delivery media, which may encode data or other information in a signal, wired or wirelessly, including electromagnetic, optical, acoustic, RF or infrared signals, and so on. The coefficient register(s) 350, 935 and memory 710 may be adapted to store various look up tables, parameters, coefficients, other information and data, programs or instructions, and other types of tables such as database tables.

Reference throughout this specification to "one embodiment", "an embodiment", or a specific "embodiment" means that a particular feature, structure, or characteristic described in connection with the embodiment is included in at least one embodiment of the present invention and not necessarily in all embodiments, and further, are not necessarily referring to the same embodiment. Furthermore, the particular features, structures, or characteristics of any specific embodiment of the present invention may be combined in any suitable manner and in any suitable combination with one or more other embodiments, including the use of selected features without corresponding use of other features. In addition, many modifications may be made to adapt a particular application, situation or material to the essential scope and spirit of the present invention. It is to be understood that other variations and modifications of the embodiments of the present invention described and illustrated herein are possible in light of the teachings herein and are to be considered part of the spirit and scope of the present invention.

It will also be appreciated that one or more of the elements depicted in the Figures can also be implemented in a more separate or integrated manner, or even removed or rendered inoperable in certain cases, as may be useful in accordance with a particular application. Integrally formed combinations of components are also within the scope of the invention, particularly for embodiments in which a separation or combination of discrete components is unclear or indiscernible. In addition, use of the term "coupled" herein, including in its various forms such as "coupling" or "couplable", means and includes any direct or indirect electrical, structural or magnetic coupling, connection or attachment, or adaptation or capability for such a direct or indirect electrical, structural or magnetic coupling, connection or attachment, including integrally formed components and components which are coupled via or through another component.

Furthermore, any signal arrows in the drawings/Figures should be considered only exemplary, and not limiting, unless otherwise specifically noted. Combinations of components of steps will also be considered within the scope of the present invention, particularly where the ability to separate or combine is unclear or foreseeable. The disjunctive term "or", as used herein and throughout the claims that follow, is generally intended to mean "and/or", having both conjunctive and disjunctive meanings (and is not confined to an "exclusive or" meaning), unless otherwise indicated. As used in the description herein and throughout the claims that follow, "a", "an", and "the" include plural references unless the context clearly dictates otherwise. Also as used in the description herein and throughout the claims that follow, the meaning of "in" includes "in" and "on" unless the context clearly dictates otherwise.

The foregoing description of illustrated embodiments of the present invention, including what is described in the summary or in the abstract, is not intended to be exhaustive or to limit the invention to the precise forms disclosed herein. From the foregoing, it will be observed that numerous variations, modifications and substitutions are intended and may be effected without departing from the spirit and scope of the novel concept of the invention. It is to be understood that no limitation with respect to the specific methods and apparatus illustrated herein is intended or should be inferred. It is, of course, intended to cover by the appended claims all such modifications as fall within the scope of the claims.

What is claimed is:

1. An apparatus to generate a harmonic reference signal, the apparatus comprising:
   a reference resonator configured to generate a first reference signal having a resonant frequency, the reference resonator comprising a first component having a first temperature dependence; and
   a plurality of switchable circuits couplable to the reference resonator, at least one switchable circuit of the plurality of switchable circuits having a second temperature dependence opposing the first temperature dependence to maintain the resonant frequency within a predetermined variance over a temperature variation;
   wherein each switchable circuit of the plurality of switchable circuits comprises:
   a first reactance coupled in series with a first switch;
   a resistor;
   a second reactance coupled to the resistor; and
   a second switch coupled in series to the second reactance or to the resistor;
   wherein the first switch is responsive to a control signal of a plurality of control signals to electronically couple or decouple the first reactance to or from a voltage, a ground potential, or the reference resonator; and
   wherein the second switch is responsive to an inverted control signal of a plurality of control signals to electronically couple or decouple the second reactance or the resistor to or from a voltage, a ground potential, or the reference resonator.

2. The apparatus of claim 1, wherein the plurality of control signals are determined during a temperature calibration process over a predetermined range of temperature variation to determine selected impedances of the plurality of switchable circuits to be coupled to the reference resonator to provide the second temperature dependence to maintain the resonant frequency within the predetermined variance.

3. The apparatus of claim 1, wherein the second reactance coupled to the resistor has the second temperature dependence opposing the first temperature dependence.

4. The apparatus of claim 1, further comprising:
   a frequency controller coupled to the reference resonator, the frequency controller to maintain substantially constant a peak amplitude of the first reference signal and a common mode voltage level of the reference resonator.

5. The apparatus of claim 4, further comprising:
   a first variable current source to provide a current to the reference resonator; and
   wherein the frequency controller is further to generate a first control signal to the first variable current source to modify the current to the reference resonator to maintain the peak amplitude of the first reference signal substantially constant at a predetermined magnitude.

6. The apparatus of claim 5, wherein the frequency controller further comprises:
   an amplitude detector to detect a magnitude of the peak amplitude of the first reference signal; and
   an operational amplifier coupled to the amplitude detector and the first current source, the operational amplifier to generate the first control signal to the first variable current source to modify the current level when the detected magnitude is not substantially equal to the predetermined magnitude.

7. The apparatus of claim 5, wherein the frequency controller further comprises:
   an amplitude detector to detect a magnitude of the peak amplitude of the first reference signal; and
   a comparator coupled to the amplitude detector and the first variable current source, the comparator to generate the first control signal to the first variable current source to modify the current level when the detected magnitude is not substantially equal to the predetermined magnitude.

8. The apparatus of claim 4, further comprising:
   a second variable current source to provide the current to the reference resonator; and
   wherein the frequency controller is further to generate a second control signal to the second variable current source to modify the current to the reference resonator to maintain the common mode voltage level of the reference resonator substantially constant at a predetermined voltage level.

9. The apparatus of claim 8, wherein the frequency controller further comprises:
a voltage detector to detect the common mode voltage level of the reference resonator; and
an operational amplifier coupled to the voltage detector and the second variable current source, the operational amplifier to generate the second control signal to the second variable current source to modify the current level when the detected common mode voltage level is not substantially equal to the predetermined common mode voltage level.

10. The apparatus of claim 8, wherein the frequency controller further comprises:
a voltage detector to detect the common mode voltage level of the reference resonator; and
a comparator coupled to the voltage detector and the second variable current source, the comparator to generate the second control signal to the second variable current source to modify the current level when the detected common mode voltage level is not substantially equal to the predetermined common mode voltage level.

11. The apparatus of claim 1, further comprising at least one feedback circuit coupled to the reference resonator, the at least one feedback circuit configured to maintain substantially constant a peak amplitude of the first reference signal or a common mode voltage level of the reference resonator.

12. An apparatus to generate a harmonic reference signal, the apparatus comprising:
a reference resonator configured to generate a first reference signal having a resonant frequency, the reference resonator comprising a first component having a first temperature dependence;
a plurality of switchable circuits couplable to the reference resonator, at least one switchable circuit of the plurality of switchable circuits having a second temperature dependence opposing the first temperature dependence to maintain the resonant frequency within a predetermined variance over a temperature variation; and
a coefficient register to store a plurality of control coefficients;
wherein each switchable circuit of the plurality of switchable circuits comprises:
a first reactance coupled in series with a first switch;
a resistor;
a second reactance coupled to the resistor; and
a second switch coupled in series to the second reactance or to the resistor; and
wherein the first switch is responsive to a control coefficient of the plurality of control coefficients to electronically couple or decouple the first reactance to or from a voltage, a ground potential, or the reference resonator, and
wherein the second switch is responsive to an inverted control coefficient of the plurality of control coefficients to electronically couple or decouple the second reactance or the resistor to or from a voltage, a ground potential, or the reference resonator.

13. The apparatus of claim 12, wherein the plurality of control coefficients are determined during a temperature calibration process over a predetermined range of temperature variation to determine selected impedances of the plurality of switchable circuits to be coupled to the reference resonator to provide the second temperature dependence to maintain the resonant frequency within the predetermined variance.

14. The apparatus of claim 12, further comprising at least one feedback circuit coupled to the reference resonator, the at least one feedback circuit configured to maintain substantially constant a peak amplitude of the first reference signal or a common mode voltage level of the reference resonator.

15. An apparatus to generate a periodic signal, comprising:
an resonant LC tank circuit configured to generate a periodic reference signal at a first frequency at a differential output thereof; and
a switchable capacitive module electrically coupled to a first node of the differential output of said resonant LC tank circuit, said module comprising a plurality of switchable circuits electrically coupled in parallel to the first node;
wherein each switchable circuit of the plurality of switchable circuits comprises:
a first capacitor electrically coupled in series with a first switch;
a second capacitor electrically coupled in series with a resistor; and
a second switch electrically coupled to the second capacitor and/or the resistor;
wherein the first switch is responsive to a corresponding first control signal that operates to modify an amount of impedance applied to the first node by selectively coupling or decoupling the first capacitor to or from the first node; and
wherein the second switch is responsive to a corresponding second control signal that operates to modify an amount of impedance applied to the first node by selectively coupling or decoupling a series combination of the second capacitor and resistor to or from the first node.

16. The apparatus of claim 15, wherein the second control signal is an inverted version of the first control signal.

* * * * *